(12) United States Patent
Yocum et al.

(10) Patent No.: US 9,269,847 B2
(45) Date of Patent: Feb. 23, 2016

(54) SMALL ANODE GERMANIUM (SAGE) WELL RADIATION DETECTOR SYSTEM AND METHOD

(71) Applicant: Canberra Industries, Inc., Meriden, CT (US)

(72) Inventors: Kenneth Michael Yocum, Rocky Hill, CT (US); James F. Colaresi, Portland, CT (US); Orren K. Tench, Palm City, FL (US)

(73) Assignee: CANBERRA INDUSTRIES, INC., Meriden, CT (US)

(*) Notice: Subject to any disclaimer, the term of this patent is extended or adjusted under 35 U.S.C. 154(b) by 391 days.

(21) Appl. No.: 13/832,906

(22) Filed: Mar. 15, 2013

(65) Prior Publication Data

US 2014/0264049 A1    Sep. 18, 2014

(51) Int. Cl.
| | |
|---|---|
| *H01L 31/117* | (2006.01) |
| *G01T 1/167* | (2006.01) |
| *H01L 31/08* | (2006.01) |
| *G01T 1/29* | (2006.01) |
| *H01L 31/075* | (2012.01) |

(52) U.S. Cl.
CPC .............. *H01L 31/117* (2013.01); *G01T 1/167* (2013.01); *G01T 1/2928* (2013.01); *H01L 31/075* (2013.01); *H01L 31/085* (2013.01)

(58) Field of Classification Search
CPC ...... H01L 31/117; G01T 1/2928; G01T 1/167
USPC .................................................. 250/370.14
See application file for complete search history.

(56) References Cited

U.S. PATENT DOCUMENTS

| | | | |
|---|---|---|---|
| 3,225,198 | A | 12/1965 | Mayer |
| 3,546,459 | A | 12/1970 | Higatsberger et al. |
| 4,056,726 | A | 11/1977 | Harchol |
| 4,237,470 | A | 12/1980 | Raudorf |
| 5,373,163 | A * | 12/1994 | Sigg .................. 250/370.01 |

(Continued)

OTHER PUBLICATIONS

Gehman; "PPC Germanium Detectors": LA-UR 10-06294; Los Alamos National Laboratory; Advances in Neutrino Technology 2010, Santa Fe, NM: Sep. 16, 2010; 73 pgs.

(Continued)

*Primary Examiner* — David Porta
*Assistant Examiner* — Jeremy S Valentiner
(74) *Attorney, Agent, or Firm* — David W. Carstens; Kevin M. Klughart; Carstens & Cahoon, LLP

(57) ABSTRACT

A small anode germanium well (SAGe well) radiation detector system/method providing for low capacitance, short signal leads, small area bottom-oriented signal contacts, enhanced performance independent of well diameter, and ability to determine radiation directionality is disclosed. The system incorporates a P-type bulk germanium volume (PGEV) having an internal well cavity void (IWCV). The external PGEV and IWCV surfaces incorporate an N+ electrode except for the PGEV external base region (EBR) in which a P+ contact electrode is fabricated within an isolation region. The PGEV structure is further encapsulated to permit operation at cryogenic temperatures. Electrical connection to the SAGe well is accomplished by bonding or mechanical contacting to the P+ contact electrode and the N+ electrode. The EBR of the PGEV may incorporate an integrated preamplifier inside the vacuum housing to minimize the noise and gain change due to ambient temperature variation.

10 Claims, 48 Drawing Sheets

(56) References Cited

U.S. PATENT DOCUMENTS

| | | | |
|---|---|---|---|
| 5,780,922 A | 7/1998 | Mishra et al. | |
| 2001/0034025 A1* | 10/2001 | Modlin et al. | 435/6 |
| 2002/0036269 A1* | 3/2002 | Shahar et al. | 250/370.1 |
| 2005/0098730 A1* | 5/2005 | Yokoi et al. | 250/370.01 |
| 2010/0258721 A1* | 10/2010 | Kooijman et al. | 250/307 |
| 2011/0095194 A1 | 4/2011 | Orava et al. | |
| 2011/0169121 A1 | 7/2011 | Bui et al. | |
| 2012/0252158 A1 | 10/2012 | Carothers et al. | |

OTHER PUBLICATIONS

Radford; "Novel HPGe Detector Design for Gamma-ray Tracking and Imaging;" Oak Ridge National Laboratory, Physics Division: Aug. 16, 2012; 29 pgs.

Barton; "Low Noise Treshold in Ge PPC Detectors"; Sandia National Laboratories; CNNS Workshop, Livermore, CA; Dec. 6-7, 2012; 22 pgs.

"P-Type Point Contact Detector Development"; Majorana Group, LBNL; Sep. 22, 2009; 5 pp.

Luke, et al.; "Low Capacitance Large Volume Shaped-Filed Germanium Detector"; IEEE Transactions on Nuclear Science; vol. 36, No. 1; Feb. 1989; pp. 926-930.

"Germanium Detectors"; www.canberra.com; Canberra Industries, Inc., Meriden, CT, USA; Nov. 2008; 3 pp.

"Germanium Well Detector (WELL)"; www.canberra.com; Canberra Industries, Inc., Meriden, CT, USA; Oct. 2012; http://www.canberra.com/products/detectors/germanium-detectors.asp; 2 pp.

Guiseppe; "Neutrinoless Double-Beta Decay and the Majorana Experiment"; Los Alamos National Laboratory; 2009; 47 pp.

"High-purity Germanium (HPGe) Detectors"; Canberra Industries, Inc., Meriden, CT, USA: 2012; http://www.canberra.com/products/detectors/germanium-detectors.asp; 2 pp.

"Standard Electrode Coaxial Ge Detectors SEGe)"; www.canberra.com; Canberra Industries, Inc., Meriden, CT, USA; Jan. 2013; 2 pp.

Luke; "Low Noise Germanium Radial Drift Detector"; Nuclear Instruments and Methods in Physics Research A271; Mar. 7, 1988; pp. 567-570.

Finnerty; "Preliminary Oral Exam: Astroparticle Physics With Prototype Broad Energy Germanium Detectors"; University of North Carolina; Chapel Hill, NC, USA; Apr. 15, 2010; 93 pp.

Cooper, et al.; "A Novel HPGe Detector for Gamma-ray Tracking and Imaging"; Nuclear Instruments and Methods in Physics Research; A-665; Oct. 2011; pp. 25-32.

* cited by examiner

*Prior Art*

*Prior Art*

FIG. 6
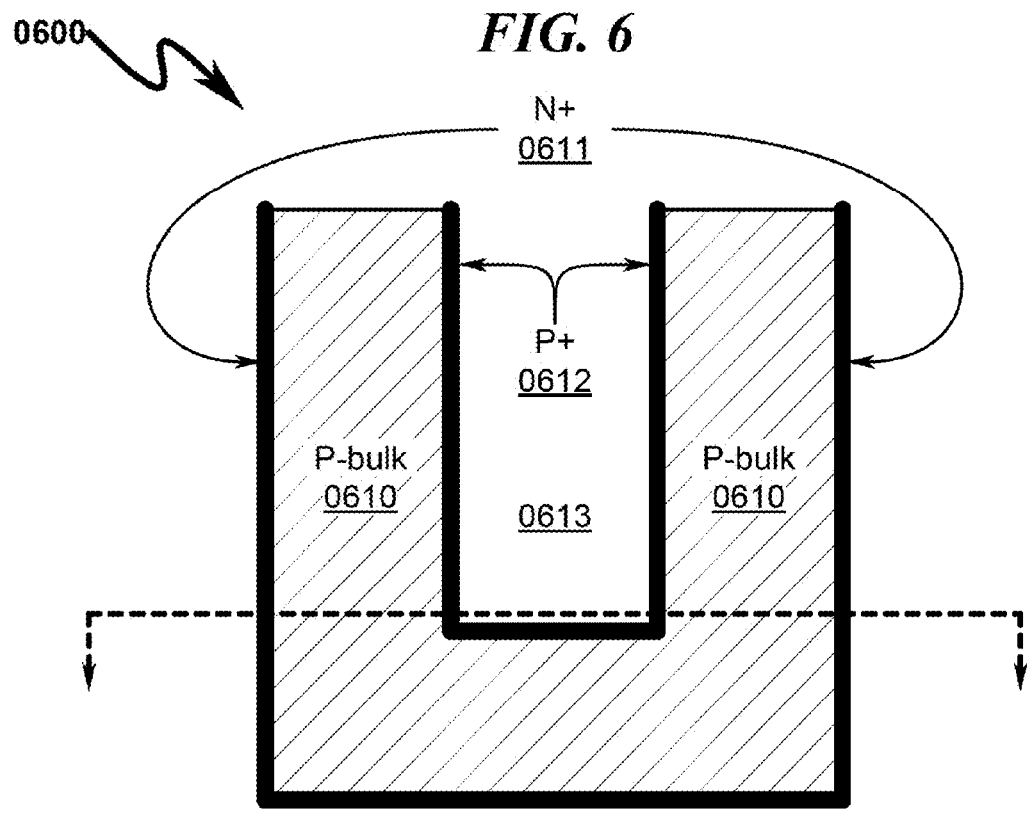
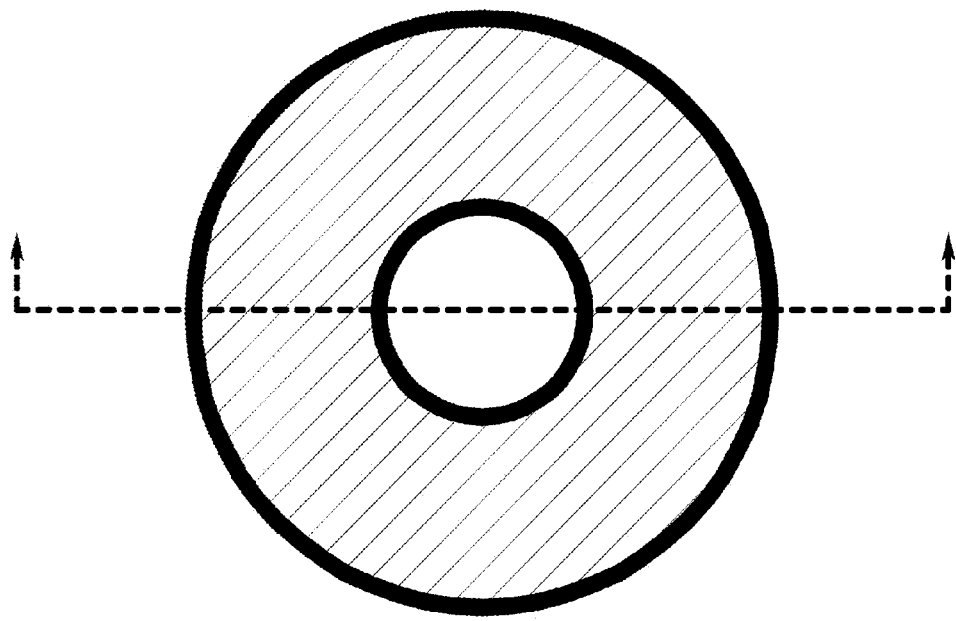
*Prior Art*

*Prior Art*

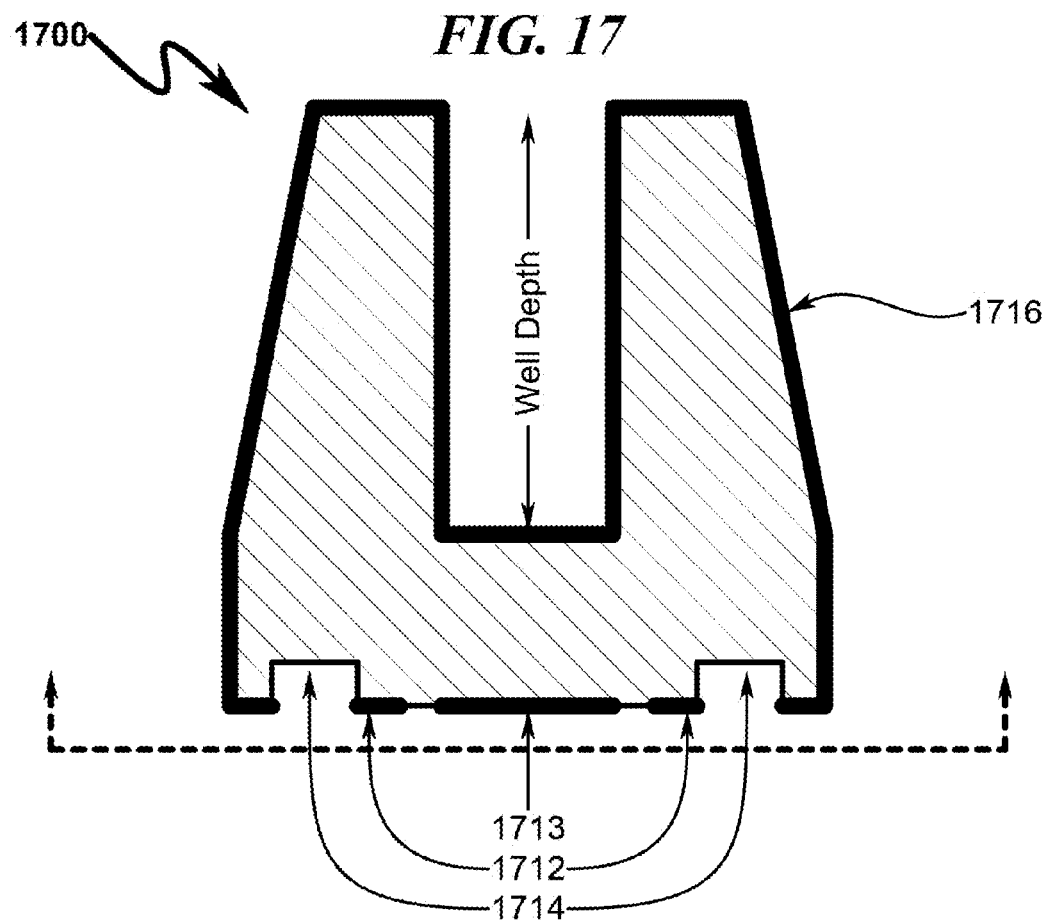
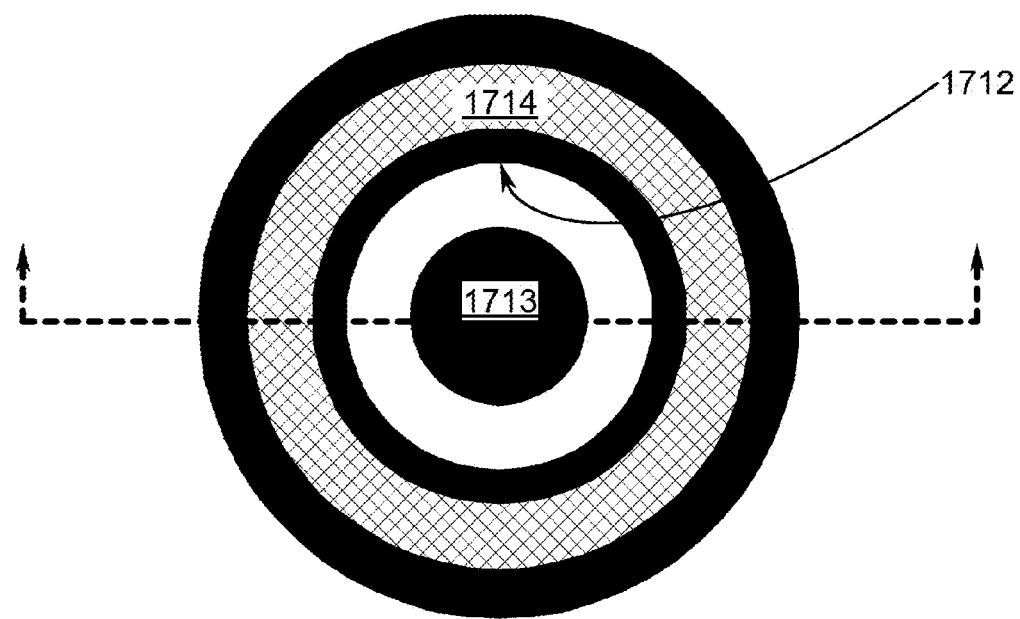
FIG. 17

FIG. 18
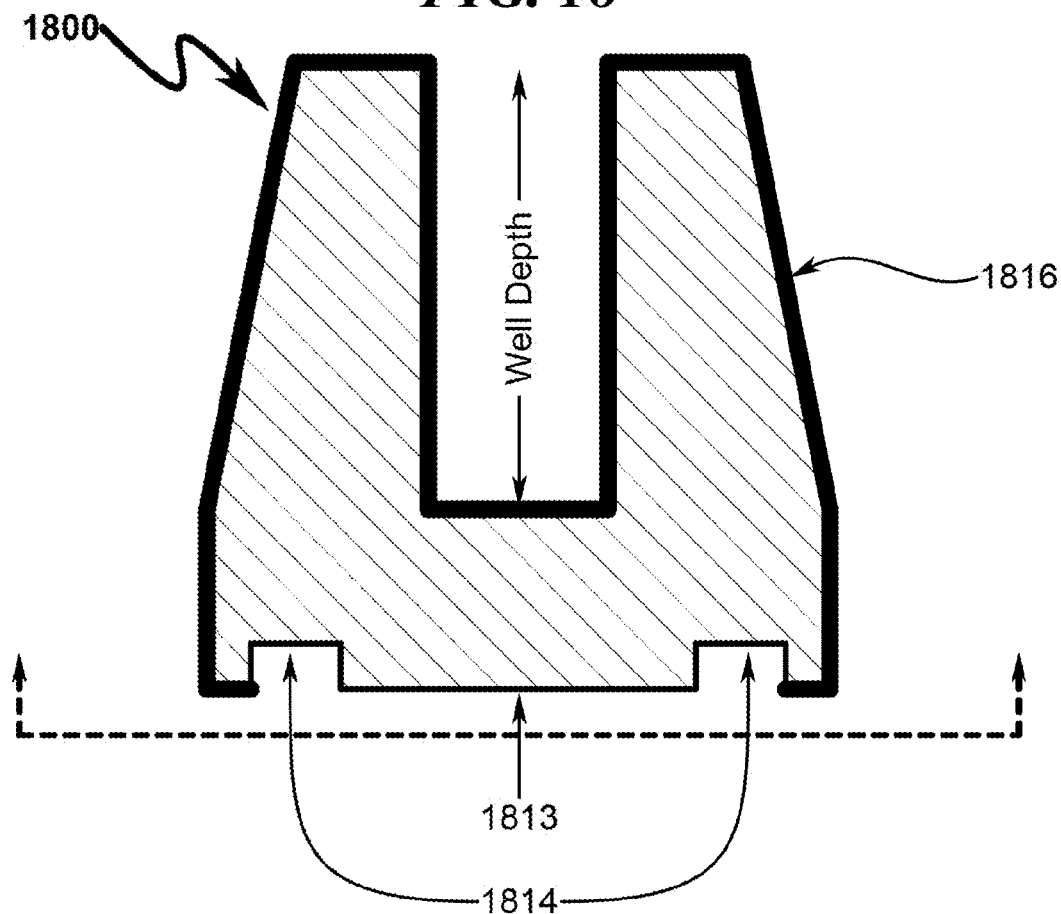
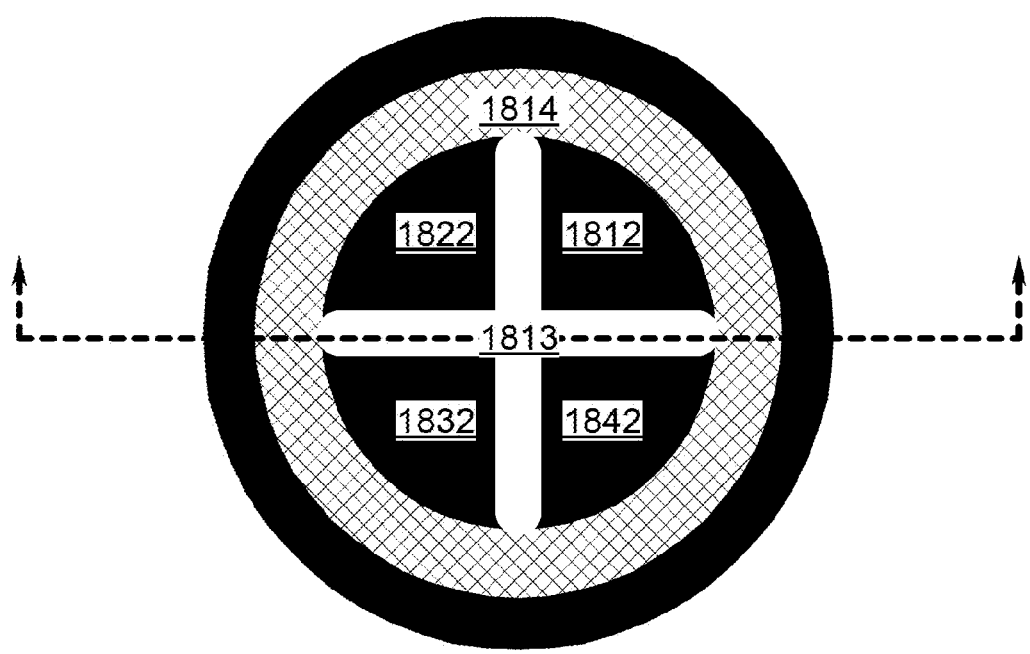

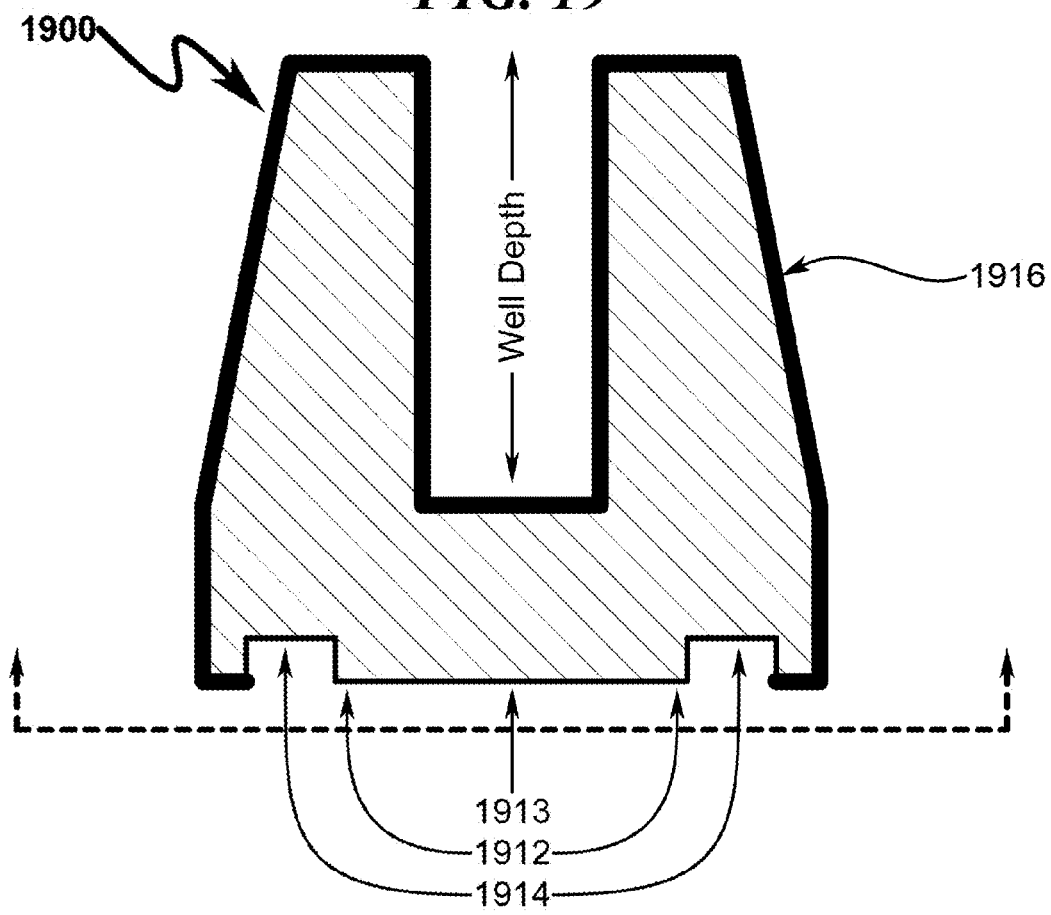
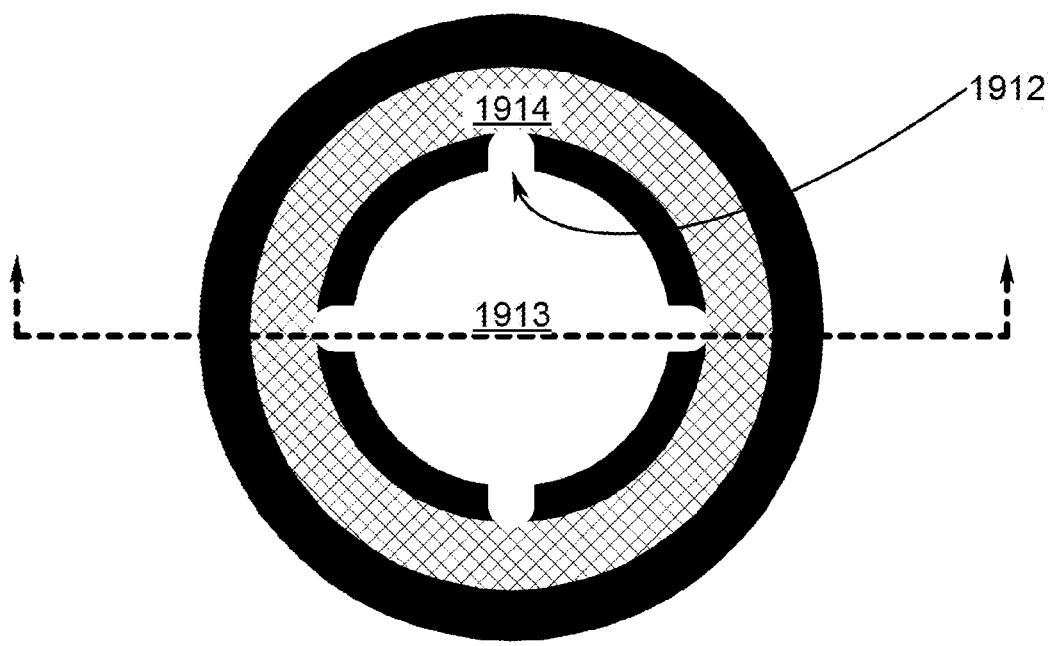
FIG. 19

FIG. 20
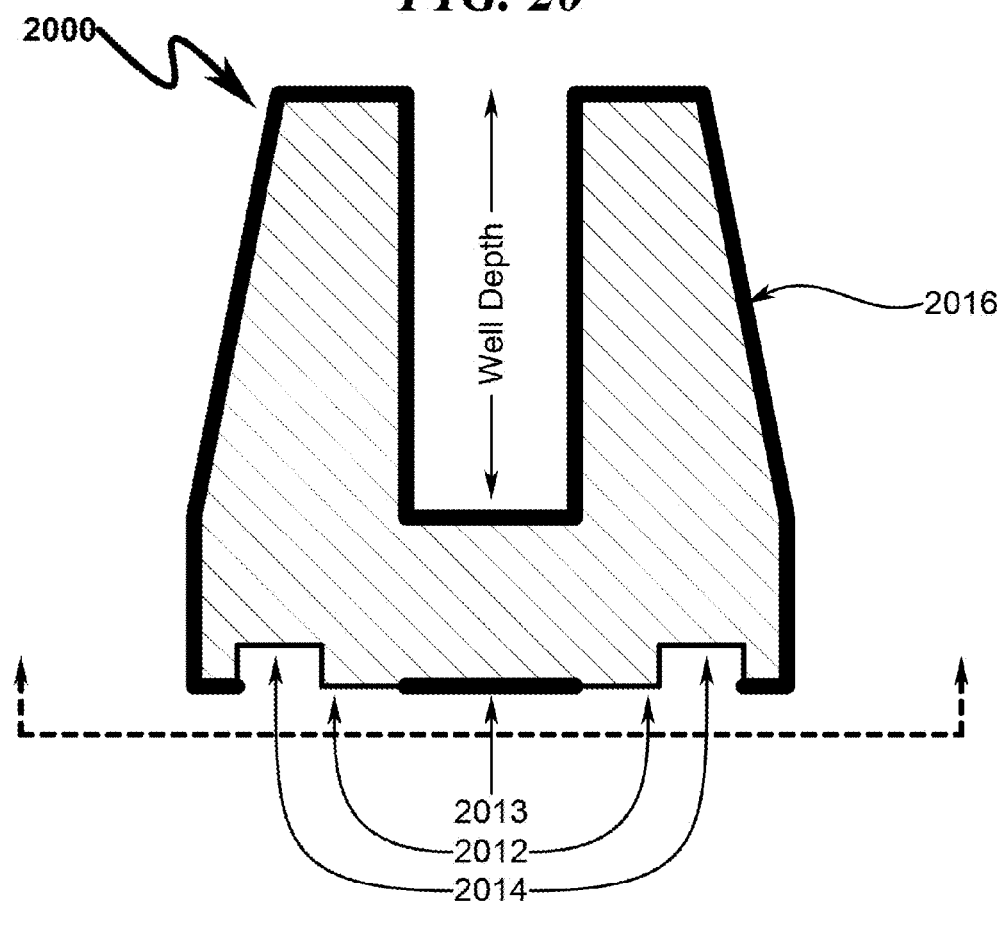
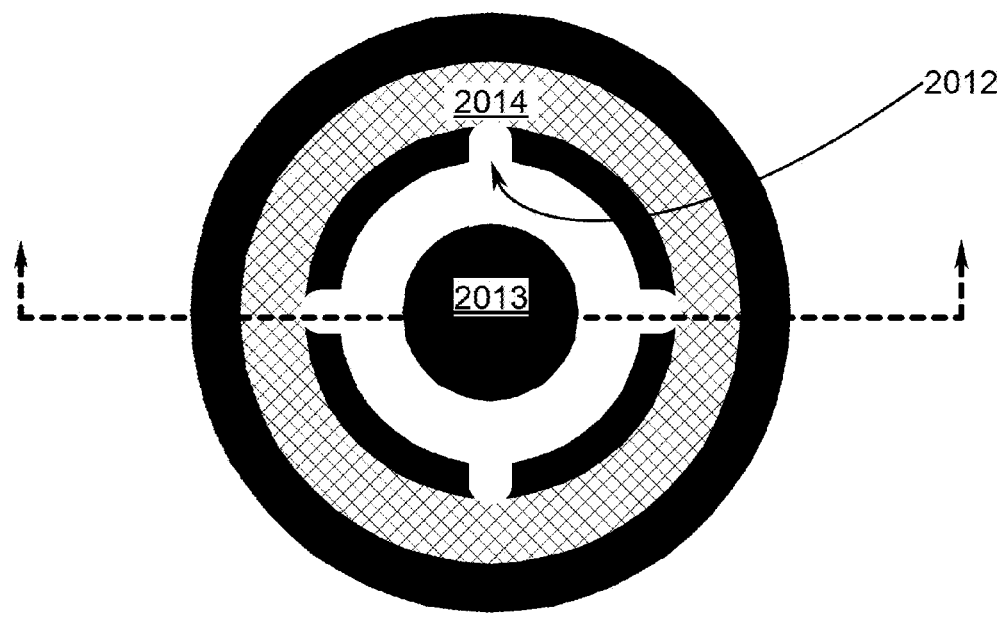

FIG. 31
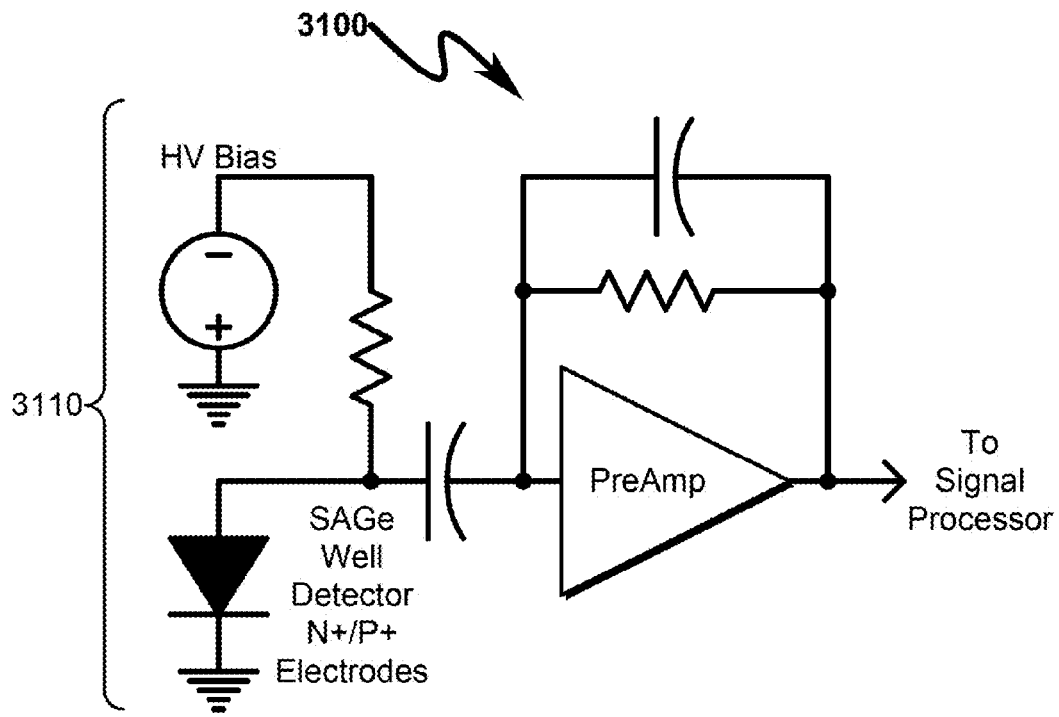
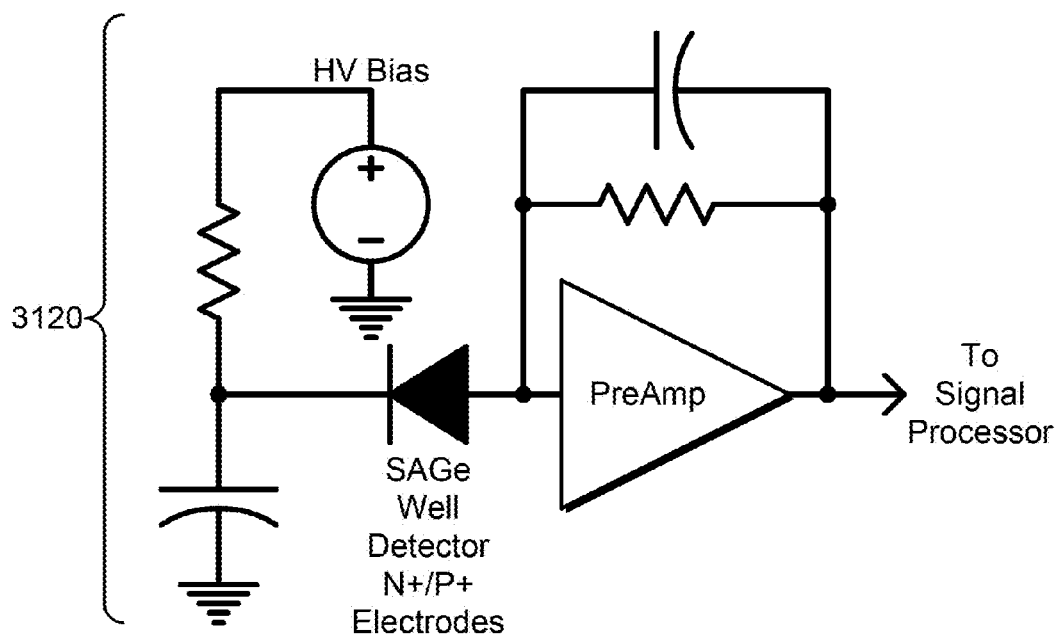

SMALL ANODE GERMANIUM (SAGE) WELL RADIATION DETECTOR SYSTEM AND METHOD

CROSS REFERENCE TO RELATED APPLICATIONS

Not Applicable

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention generally relates to systems and methods for the detection of radiation, more particularly, but not by way of limitation to the use of germanium well detectors in this application. While not limitive of the invention teachings, the present invention may in some circumstances be advantageously applied to categories including U.S. Patent Classifications 257/430; 250/370.01; and 257/E31.087.

The present invention relates generally to ionizing radiation detection, particularly gamma rays and X-rays (photons). Many radioactive materials emit gamma rays and x rays with known energies and intensities. By measuring these emissions from such materials one can determine the radioactive species (radioisotope) and the concentration of same. To achieve high sensitivity for small samples in this measurement, it is very advantageous to use detectors which resolve different energies to a high degree of precision and which surround the sample. Such detectors are known as "well detectors" because they have a well (cavity) into which the sample can be inserted and its radiation subsequently detected.

Ge well detectors need not be used with samples inserted in the well. They can be used with large external samples as well in the same manner as conventional Ge detectors are used. This includes their use as tools to detect and locate radioactive materials from a distance, a common practice in radiation safety and security applications.

Germanium Radiation Detector Overview

Germanium (Ge) radiation detectors ("Ge detectors") (also termed High-Purity Germanium (HPGe) detectors) are semiconductor diodes having a P-I-N structure in which the intrinsic (I) region is sensitive to ionizing radiation, particularly X-rays and gamma rays. Under reverse bias, an electric field extends across the intrinsic or depleted region. When photons interact with the material within the depleted volume of a detector, charge carriers (holes and electrons) are produced and are swept by the electric field to the P and N electrodes. This charge, which is in proportion to the energy deposited in the detector by the incoming photon, is converted into a voltage pulse by an integral charge sensitive preamplifier.

Because germanium has relatively low band gap, these detectors must be cooled in order to reduce the thermal generation of charge carriers (thus reverse leakage current) to an acceptable level. Otherwise, leakage current induced noise destroys the energy resolution of the germanium detector. Typically the detectors are operated at temperatures between 77° K and 120° K. Liquid nitrogen, electromechanical coolers, and other cooling media or devices, which can attain temperatures of less than 120K, are common cooling sources for Ge detectors.

The germanium detector is mounted in a vacuum chamber which is attached to or inserted into a cooling source. The sensitive detector surfaces are thus protected from moisture and condensable contaminants.

Historical HPGe Detector Construction (0100)-(0500)

General Detector Classes

As generally depicted in FIG. 1 (0100), historically HPGe detectors have been classified into one of the following designs:

- Planar designs (0110) comprising a N-bulk or P-bulk (0111) material with planar P+ or N+, respectively, electrodes (0112) and planar N+ or P+, respectively, electrodes (0112).
- Coaxial designs (0120) comprising a N-bulk or P-bulk (0121) material with surrounding P+ or N+, respectively, electrodes (0122) and inner well (cavity) N+ or P+, respectively, electrodes (0123). Typical configurations for this design are generally illustrated in FIG. 3 (0300), FIG. 4 (0400), and FIG. 5 (0500).
- Point-contact like designs as generally depicted in FIG. 2 (0200) comprising a N-bulk or P-bulk (0210) material with surrounding large area P+ or N+, respectively, electrodes (0211) and small area N+ or P+, respectively, electrodes (0212);
- Specialty designs comprising complex bulk geometries, segmented contacts, strip contacts, and combinations thereof.

Point Contact Detector Overview

Point contact (PC) detectors as generally depicted in FIG. 2 (0200) incorporate a P or N bulk material (0210) (typically cylindrical in structure) having an N+ or P+, respectively, contact (0211) on the outer and top surfaces and a much smaller area P+ or N+, respectively, contact (0212) on the bottom cylinder edge. These detectors with N-type bulk material were developed and have been manufactured by CANBERRA as the LEGe detector since 1983. Later they were disclosed by P. Luke, et al. (IEEE Trans. Nucl. Sci. 36, 926 (1989) (see Paul Luke Radial Drift Detector 1988 NINA271_567_LowNoiseGe and/or Paul Luke PPC 1989 Germanium Low Capacitance Large Volume Germanium Detector wimps luke 000)). These detectors feature the following characteristics:

- No deep hole; small point-like central contact.
- Excellent pulse shape analysis (PSA) sensitivity for discrimination between single-site and multi-site events.

Low capacitance (~1 pF) gives superb resolution at low energies.

Length is limited (shorter than standard coaxial detector).

P-type germanium material is preferred for large volume PC devices because bulk charge trapping is less than for N-type material and thus, the electrons and holes can be collected across greater distances, in relatively low electric fields, with minimal chance of being lost to trapping or recombination. Although the volume of the detector may be large, the overall measurement efficiency is limited by the solid angle subtended by the detector surface (0210) facing the radiation source.

Coaxial Detector Overview

The coaxial design (0120, 0300, 0400, 0500) has been the design of choice in situations where high detector efficiency at high energies is required because it allows good charge collection across the large volumes of germanium required to stop high energy gamma photons.

Well Detector Overview

In order to increase the efficiency of a coaxial detector for very weak or low activity samples the vacuum enclosure can be extended down inside the hole in the center of the coaxial detector. Samples can then be placed inside the end cap "well" so they are nearly completely surrounded by the detector volume thus allowing a greater percentage of the emitted radiation to be captured by the P-bulk material (0121). This typically requires that the central hole (0613, 0713) in the coaxial detector be enlarged as generally depicted in FIG. 6 (0600)-FIG. 8 (0800) to provide a suitable working volume. Such detectors are called well detectors and generally described below.

Well Detector Overview (0600)-(0800)

Coaxial germanium detectors are often used for radiation detection and analysis because they exhibit high resolving power (the ability to distinguish between photons of different energies). Most coaxial germanium detectors are not configured to accommodate samples in a well but rather they detect radiation from external sources as generally depicted in the configuration of FIG. 3 (0300)-FIG. 5 (0500). However, all coaxial germanium detectors have a hole (be it a closed hole (well) or a through hole) the surface of which defines one of the electrodes of the detector. This hole is normally small diameter (<10 mm). By enlarging the hole and turning the detector so that the hole faces outward, this coaxial detector can accommodate small samples within the well provided that the surrounding hardware is fabricated in a way that provides for sample entry.

To accommodate any but the most miniscule of samples, the hole in the detector must be enlarged significantly. For a 16 mm useful diameter end cap well, for example, the physical hole (cavity) diameter in the detector itself must be approximately 20 mm. The reason for this restriction is that in use a germanium detector must be cooled to cryogenic temperatures and space is required to provide an insulating vacuum enclosure for the detector. If the well is enlarged there is an attendant increase in the capacitance and this leads directly to increased electronic noise and a loss of resolving power (energy resolution). This fundamental behavior of the conventional germanium well detector has long limited its usefulness, in part because the increase in noise is most damaging at low energies where the well detector is most advantageous.

Germanium (Ge) radiation detectors may be configured in a "well" configuration ("well detector") as depicted in FIG. 6 (0600)-FIG. 8 (0800). High-Purity Germanium (HPGe) Well Detectors provide maximum efficiency for small samples because the sample is virtually surrounded by active detector material. The diameter of the central hole in the well detector is typically enlarged to provide a suitable working volume for the samples. This increase in diameter of the P+ electrode lining the hole results in an increase in device capacitance and hence an increase in noise. For maximum efficiency a typical well detector is fabricated with a blind hole rather than a through hole, leaving at least 15 mm of active detector thickness at the bottom of the well. The counting geometry therefore approaches 4π.

The well insert in the end cap is typically constructed of aluminum with a side-wall thickness of 0.5 mm and a 1 mm thick bottom. The P+ ion implanted contact, or surface barrier contact, on the detector element is negligibly thin compared to 0.5 mm of aluminum so these detectors have intrinsically good low energy response, allowing spectroscopy down to 20 keV.

As can be seen from the sectional views of FIG. 7 (0700)-FIG. 8 (0800) depicting a CANBERRA® well detector, the P-bulk material (0710) is contained within a packaging structure (0730) that is responsible for providing electrical connection to the N+ and P+ electrodes. Due to the front-end placement of the P+ electrode, the signal wire is lengthy and connection to the P+ electrode is complicated. This wiring restriction is associated with all prior art well detectors using this general configuration as described below.

Electrical Connections (0900)

As generally illustrated in FIG. 9 (0900), the prior art well detectors require that the P+ electrode contact wiring extend from the front of the detector and exit the rear of the detector for connection to the detector electronics (0930). This increases the required separation distance between the vacuum enclosure (0920) and the P-bulk material (0910) and may in some circumstances increase microphonic noise induced by the extended wire length.

Prior Art Capacitance Calculation (1000)

The total capacitance of the conventional well detector described by FIG. 6 (0600)-FIG. 8 (0800), as schematically illustrated in FIG. 10 (1000) can be approximated by calculating and summing three constituent capacitance values:

[C1]—the parallel plate capacitance between the bottom of the core hole and the outer rear face of the detector;

[C2]—the cylindrical capacitance between the core electrode and the outer electrode; and

[C3]—the cylindrical capacitance between the core electrode and the surface of the cylinder forming the vacuum enclosure.

[C4]—the parallel plate capacitance between the end cap well bottom and the detector element well bottom (this capacitance is nearly negligible and typically on the order of 0.5 pF).

As depicted in FIG. 10 (1000), the dimensions of a typical well detector are as follow:

Outer Diameter—60 mm;

Outer Length—60 mm;

Well Diameter—20 mm;

Well Depth—40 mm; and

Diameter of Vacuum Enclosure—16 mm (this is the useful sampling well diameter).

C1 constitutes the planar detector capacitance between the bottom of the N+ well hole electrode and the P+ electrode. For a standard parallel plate capacitor [C1] in which the dielectric is germanium with a relative permittivity of approximately 16, the capacitance for a given area A is given by:

$$C_1 = \frac{\varepsilon A}{d} = \frac{k\varepsilon_0 A}{d} \quad (1)$$

where $C \equiv$ capacitance(F)

$A \equiv$ plate area(m²)

$d \equiv$ distance between plates(m)

$\varepsilon_0 \equiv$ permittivity of free space($8.854 \times 10^{-12}$F/m)

$k \equiv$ relative permittivity of the dielectric material between the plates($k = 1$ for free space;

$k > 1$ for all media; $k \approx 16$ for germanium)

Substituting for the geometry parameters above, [C1] is calculated as follows:

$$C_1 = \frac{(1)(8.854 \times 10^{-12})\left(\frac{0.02^2 \times \pi}{4}\right)}{0.02} \quad (2)$$

$$= 2.2 \text{ pF}$$

[C2] constitutes the cylindrical capacitance between the electrodes of the detector element in which the dielectric is germanium with a relative permittivity of approximately 16. For a cylindrical geometry like a coaxial cable, the capacitance is usually stated as a capacitance per unit length. The charge resides on the outer surface of the inner conductor and the inner wall of the outer conductor. The capacitance expression is given by the equation:

$$\frac{C_2}{L} = \frac{2\pi k \varepsilon_0}{\ln\left(\frac{b}{a}\right)} \quad (3)$$

where $a \equiv$ inner diameter(m)

$b \equiv$ outer diameter(m)

$L \equiv$ coaxial length(m)

Substituting for the geometry parameters gives the following result for [C2]:

$$\frac{C_2}{L} = \frac{2\pi(16)(8.854 \times 10^{-12})}{\ln\left(\frac{0.03}{0.01}\right)} \quad (4)$$

$$= 810 \text{ pF/m}$$

$$= 32.4 \text{ pF for } L = 0.04 \text{ m}$$

For the [C3] capacitance between the core contact and the vacuum enclosure the following analysis applies:

$$\frac{C_3}{L} = \frac{2\pi(1)(8.854 \times 10^{-12})}{\ln\left(\frac{0.010}{0.0085}\right)} \quad (5)$$

$$= 342.3 \text{ pF/m}$$

$$\approx 13.7 \text{ pF for } L = 0.04 \text{ m}$$

The total capacitance of this example of the standard well detector is thus:

$$C_{TOTAL} = C_1 + C_2 + C_3 \quad (6)$$

$$= 2.2 \text{ pF} + 32.4 \text{ pF} + 13.7 \text{ pF}$$

$$\approx 48.3 \text{ pF}$$

As can be seen from these calculations, the detector capacitance with conventional well detectors increases with increasing sample well diameter and sample well depth. This characteristic creates a significant negative impact on radiation measurements using this type of radiation detector.

Performance of Well Detectors (1100)-(1300)

The advantages of well type detectors are based on the near $4\pi$ counting geometry for a source placed inside the well. This geometry assures a high counting efficiency as the full energy peak efficiency may be written as:

$$\varepsilon = \eta \times \varepsilon_i \quad (7)$$

where $\eta \equiv$ geometrical efficiency given by $\eta = \frac{\theta}{4\pi}$ $\theta \equiv$ solid angle under which diameter "sees" the source $\varepsilon_i \equiv$ intrinsic efficiency For a well type detector, $\eta \approx 1$ as $\theta$ approaches $4\pi$. The absolute efficiency is thus mainly governed by the intrinsic efficiency. FIG. 11 (1100) depicts a comparison of conventional well detector useful energy measurement as compared to other types of radiation detectors, FIG. 12 (1200) depicts a comparison of conventional well detector energy resolution as compared to other types of radiation detectors, and FIG. 13 (1300) compares the absolute efficiency for a multi-gamma point source (once measured in the well of a well detector and once measured at 1 cm distance from the window of a standard p-type coaxial detector). As can be seen from this experimental data, the performance of traditional well detectors suffers in comparison to other types of radiation detectors in part because large well diameters translate to increased detector capacitance and noise which reduce the effective detector resolution.

However, for applications where small, low-activity samples must be measured, this high counting efficiency of well detectors results in lower detection limits or shorter counting times to achieve a given detection limit. Additionally, well detectors have the advantage that sample positioning is easy and not very critical. Sample vials can easily be placed inside the well. The effect on the absolute efficiency of moving the sample inside the well is about an order of magnitude less than positioning a source inaccurately above a coaxial detector.

The useful energy range of the coaxial Ge well detectors is typically less than 40 keV to more than 10 MeV as illustrated in FIG. 12 (1200) and FIG. 13 (1300). The resolution and peak shapes are generally excellent and are available over a wide range of efficiencies.

In making the choice to use a conventional well type detector for a certain application, the above advantages have to be weighed against some potential disadvantages:

The well geometry only accommodates a small sample volume. If more sample material is available another measurement geometry using a coaxial or planar detector may yield a lower MDA per gram of sample.

Due to the higher capacitance of the detector and the consequently higher electronic noise, the resolution performance of well type detectors is worse than coaxial detectors, particularly at low energies.

Because the sample is very close to the detector and completely surrounded by it, a well detector is more prone to summing effects, especially when isotopes with many coincident gammas are measured.

Measured noise increases as the well diameter is increased.

Existing prior art well detectors also have other deficiencies that intrinsically decrease their performance in a variety of applications, as detailed below.

Segmented Inverted Coaxial Detectors

David Radford has described a segmented inverted coaxial detector with an electrode structure permitting the position of photon interactions within the detector to be determined by pulse shape analysis. Radford segmented the outer electrode into a multiplicity of electrodes (each with its own data acquisition channel) to determine the interaction locations very accurately. This facility makes his device a "tracking detector" which has application in nuclear physics research but it is not relevant to the application addressed by the SAGe well radiation detector as taught by the present invention.

Deficiencies in the Prior Art

While the prior art as detailed above is currently used to form Ge well detectors, this prior art suffers from the following deficiencies:
Prior art well detectors have high capacitance due to their large P+ contact areas. See Cooper, Radford, et. al. NIM A665(2011) 25-32.
Prior art well detectors have a capacitance that increases with the diameter of the well.
Prior art well detectors have their signal contact on top, making for longer signal leads.
Prior art well detectors have performance characteristics that decrease with increasing well diameter.
To date the prior art has not fully addressed these deficiencies.

OBJECTIVES OF THE INVENTION

Accordingly, the objectives of the present invention are (among others) to circumvent the deficiencies in the prior art and affect the following objectives:
(1) Provide for a SAGe well radiation detector system and method that decreases the detector capacitance.
(2) Provide for a SAGe well radiation detector system and method that decreases electronic noise by placing the signal contact on the bottom of the detector.
(3) Provide for a SAGe well radiation detector system and method that permits for shorter electrical connection lead lengths.
(4) Provide for a SAGe well radiation detector system and method that permits performance characteristics and noise that are independent of well diameter.
(5) Provide for a SAGe well radiation detector system and method that permits determination of radiation source directionality.

While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

System Overview

The present invention in various embodiments addresses one or more of the above objectives in the following manner by describing a small anode germanium (SAGe) well detector with the following characteristics:
The conventional Ge well structure is modified by eliminating the P+ contact within the inner portion of the well and replacing this with a P+ contact on the base of the P-type bulk substrate, OUTSIDE of the well structure.
Electrical connection to the Ge well structure is accomplished OUTSIDE of the well at the base of the P-type bulk substrate.

This present invention provides for an electrode structure in which the capacitance is very small in comparison to the capacitance of conventional Ge well detectors regardless of the size of the well. With conventional Ge well detectors, since the P+ electrode comprises the inner well cylinder surface, as the diameter of the well cylinder increases the capacitance also increases. In contrast, because of the placement of the P+ electrode on the OUTSIDE of the well structure, it is possible to make well detectors having much larger wells accommodating large samples while retaining an energy resolution that is better than the energy resolution of conventional well detectors, and even better than that of conventional (non-well) coaxial detectors.

Method Overview

The present invention system may be utilized in the context of an overall SAGe well radiation detector method wherein the SAGe well radiation detector system described previously is fabricated from a single piece of germanium P-type bulk material that is processed to incorporate the well detection structure described above. Additionally, present invention teaches various methods of integrating the SAGe detector with data acquisition electronics and computing devices to form radiation measurement and data collection systems.

BRIEF DESCRIPTION OF THE DRAWINGS

For a fuller understanding of the advantages provided by the invention, reference should be made to the following detailed description together with the accompanying drawings wherein:

FIG. 6 illustrates side and top sectional views of a prior art coaxial well radiation detector assembly;

FIG. 17 illustrates an exemplary annular anode embodiment variation with N+ EBR center contact useful in many preferred invention embodiments;

FIG. 18 illustrates an exemplary segmented anode embodiment variation useful in many preferred invention embodiments;

FIG. 19 illustrates an exemplary segmented annular anode embodiment variation useful in many preferred invention embodiments;

FIG. 20 illustrates an exemplary annular anode embodiment variation useful in many preferred invention embodiments;

FIG. 31 illustrates exemplary schematics of detector circuits useful in implementing a number of preferred invention embodiments;

DESCRIPTION OF THE PRESENTLY PREFERRED EXEMPLARY EMBODIMENTS

Figure 1:
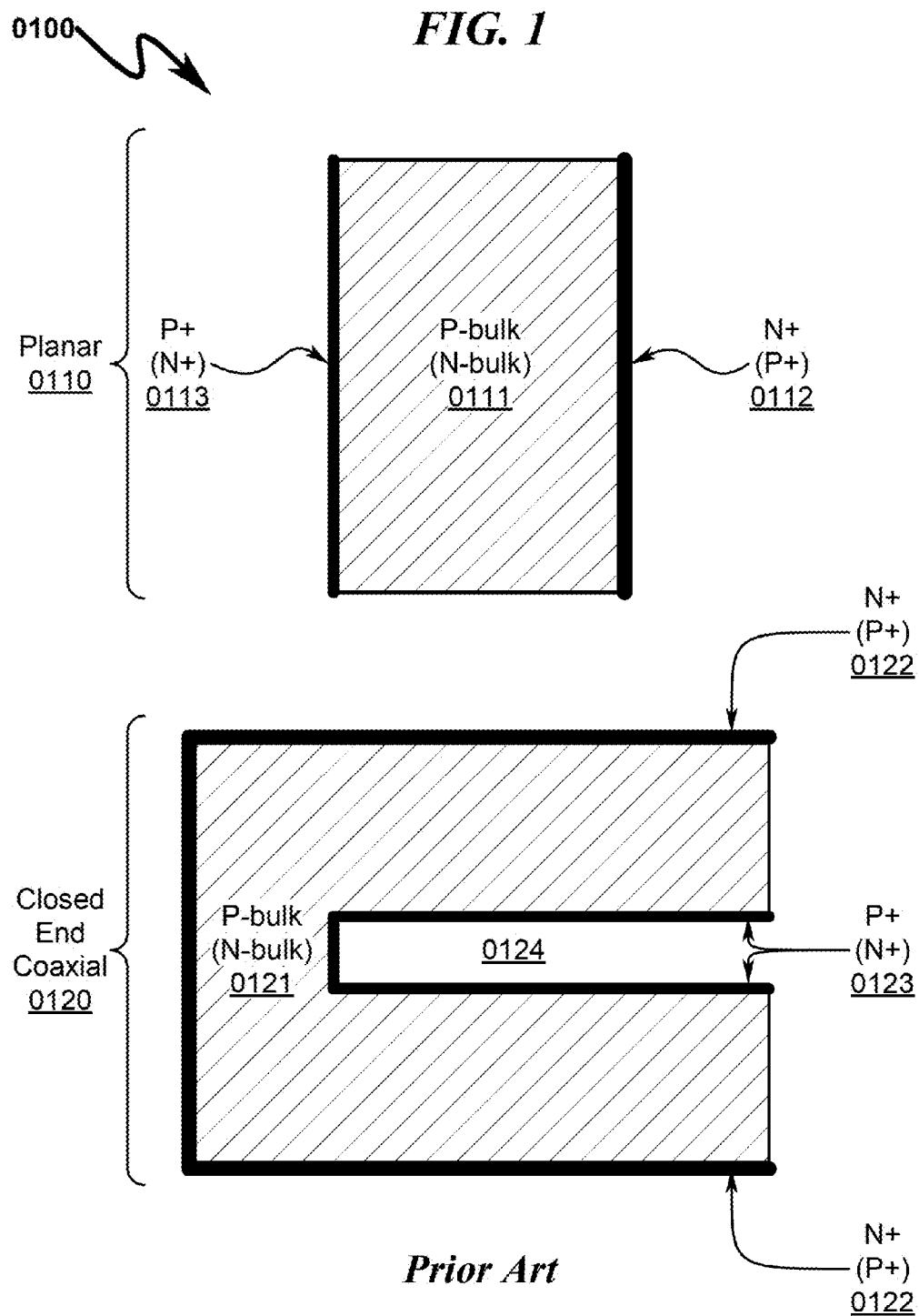
FIG. 1 illustrates side sectional views of a prior art planar and coaxial radiation detector.
Figure 2:
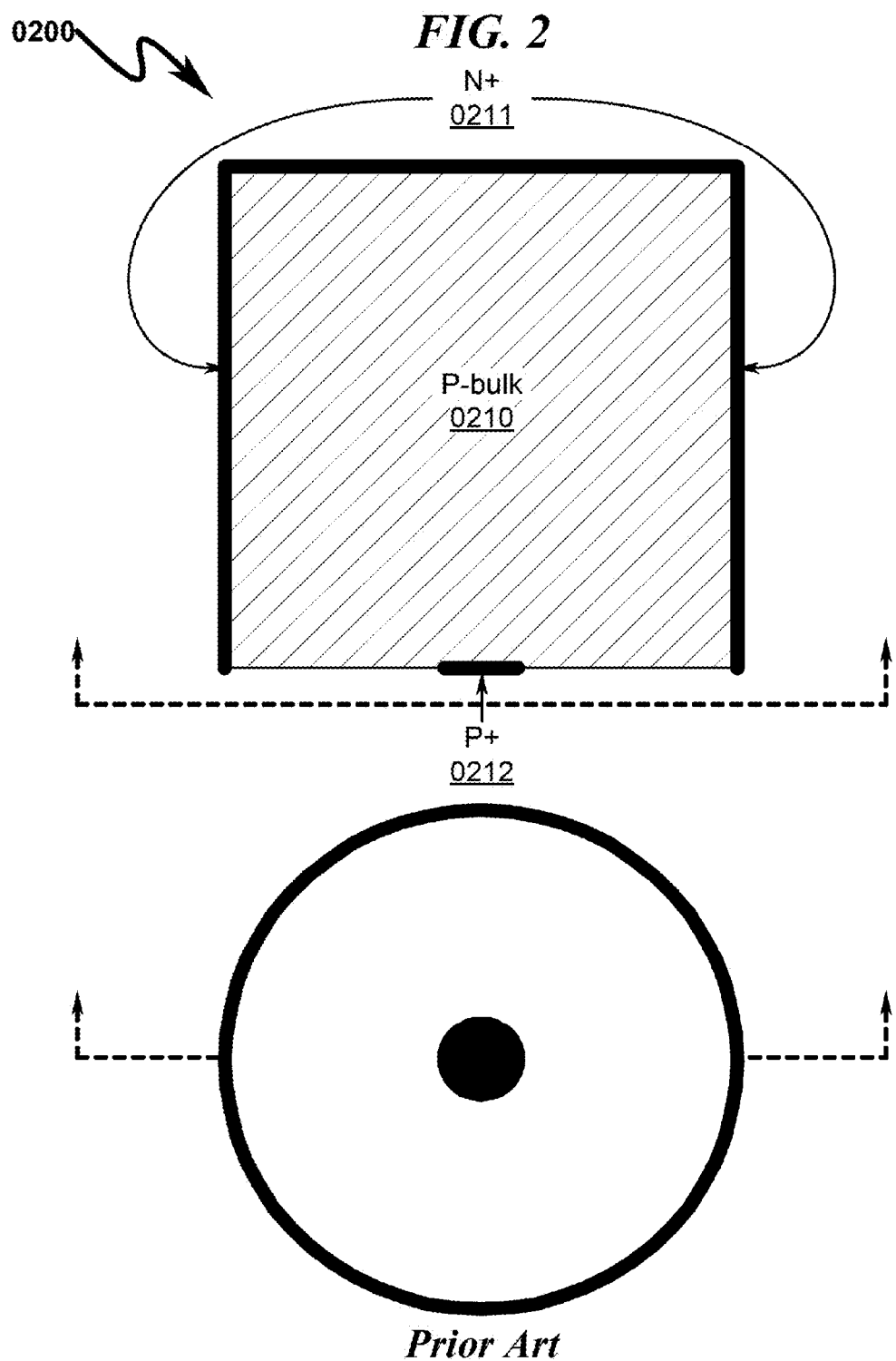
FIG. 2 illustrates side and top sectional views of a prior art P-type point contact radiation detector.
Figure 3:
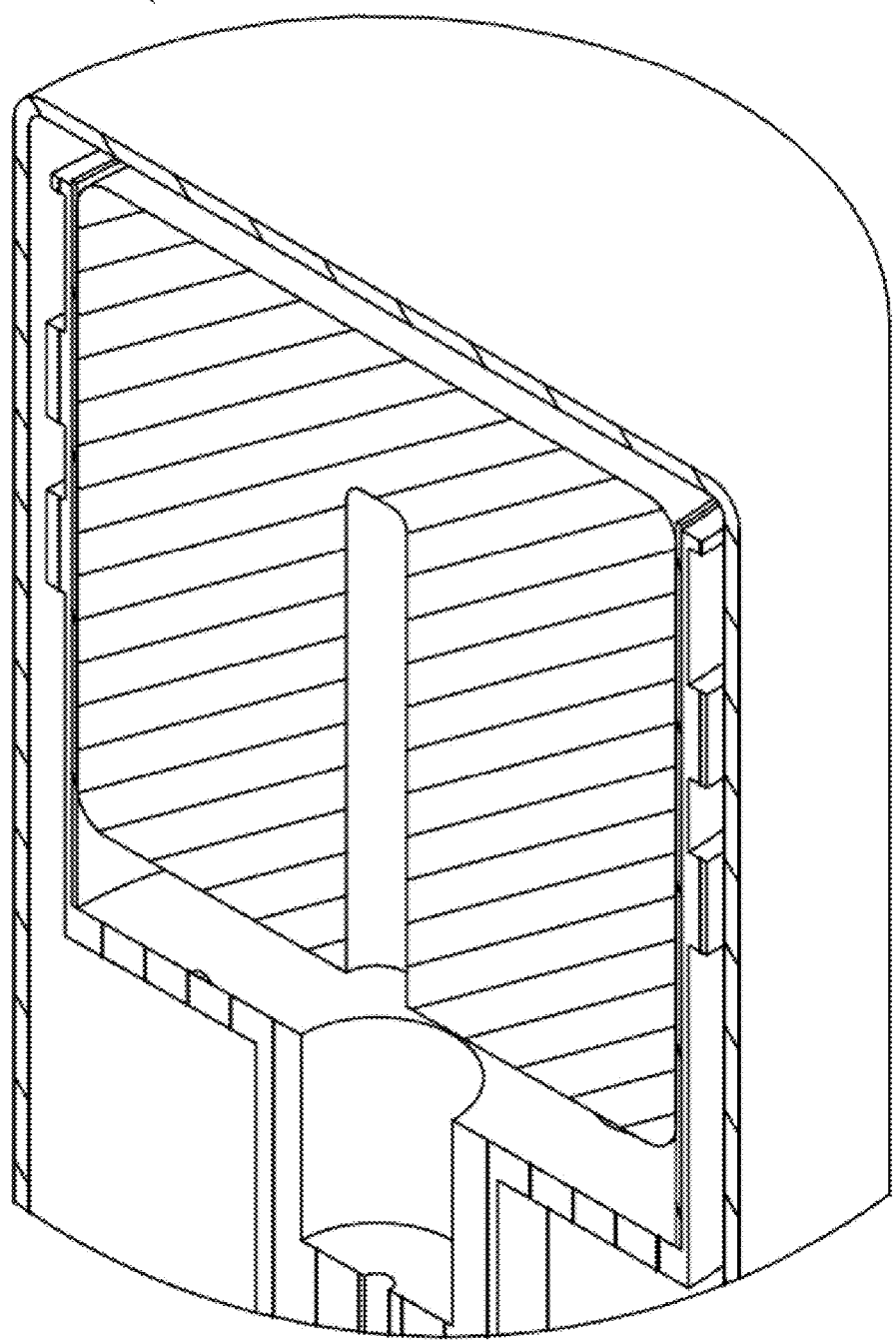
FIG. 3 illustrates a perspective view of a prior art coaxial radiation detector.
Figure 4:
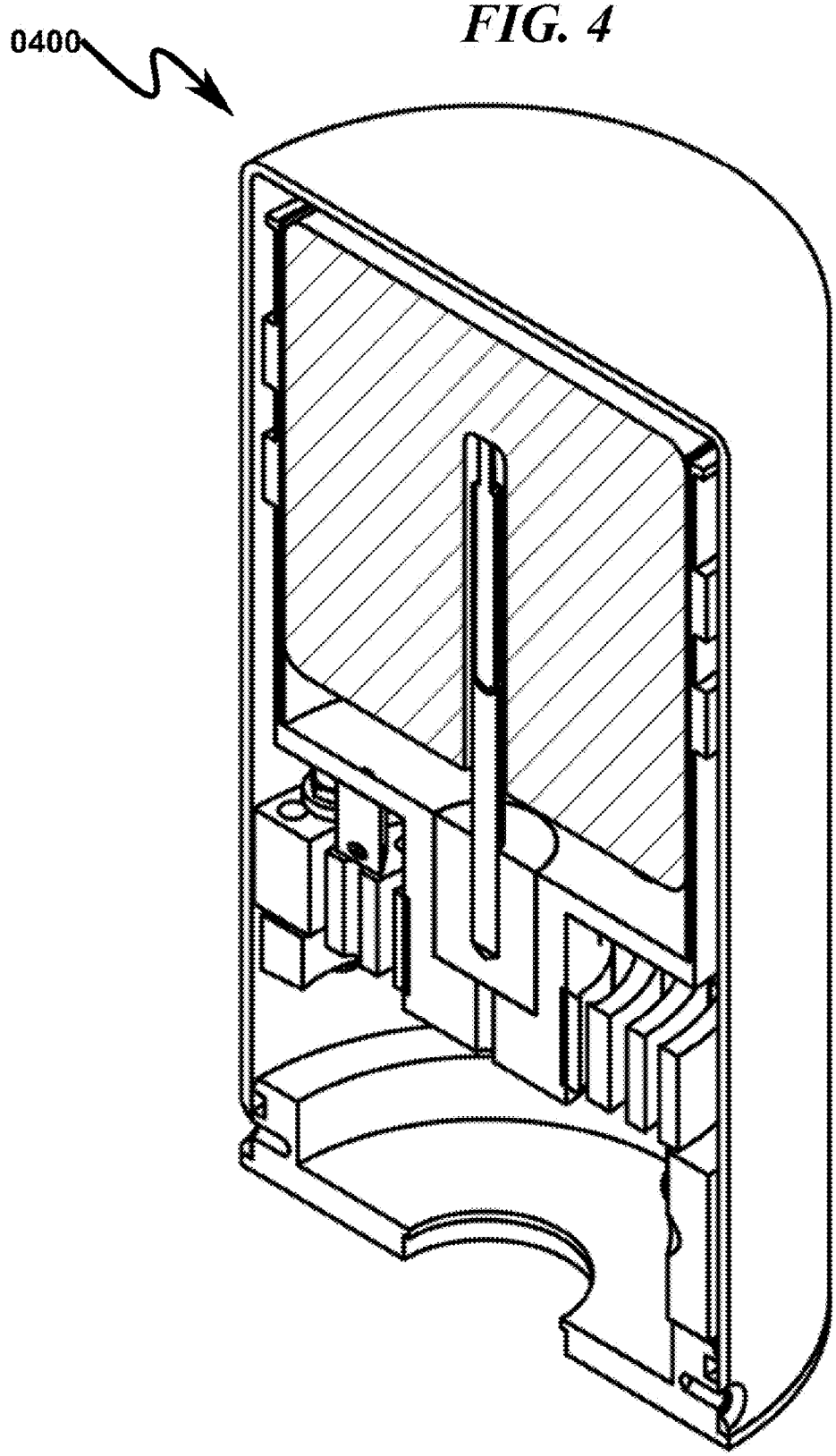
FIG. 4 illustrates a perspective view of a prior art coaxial radiation detector assembly.
Figure 5:
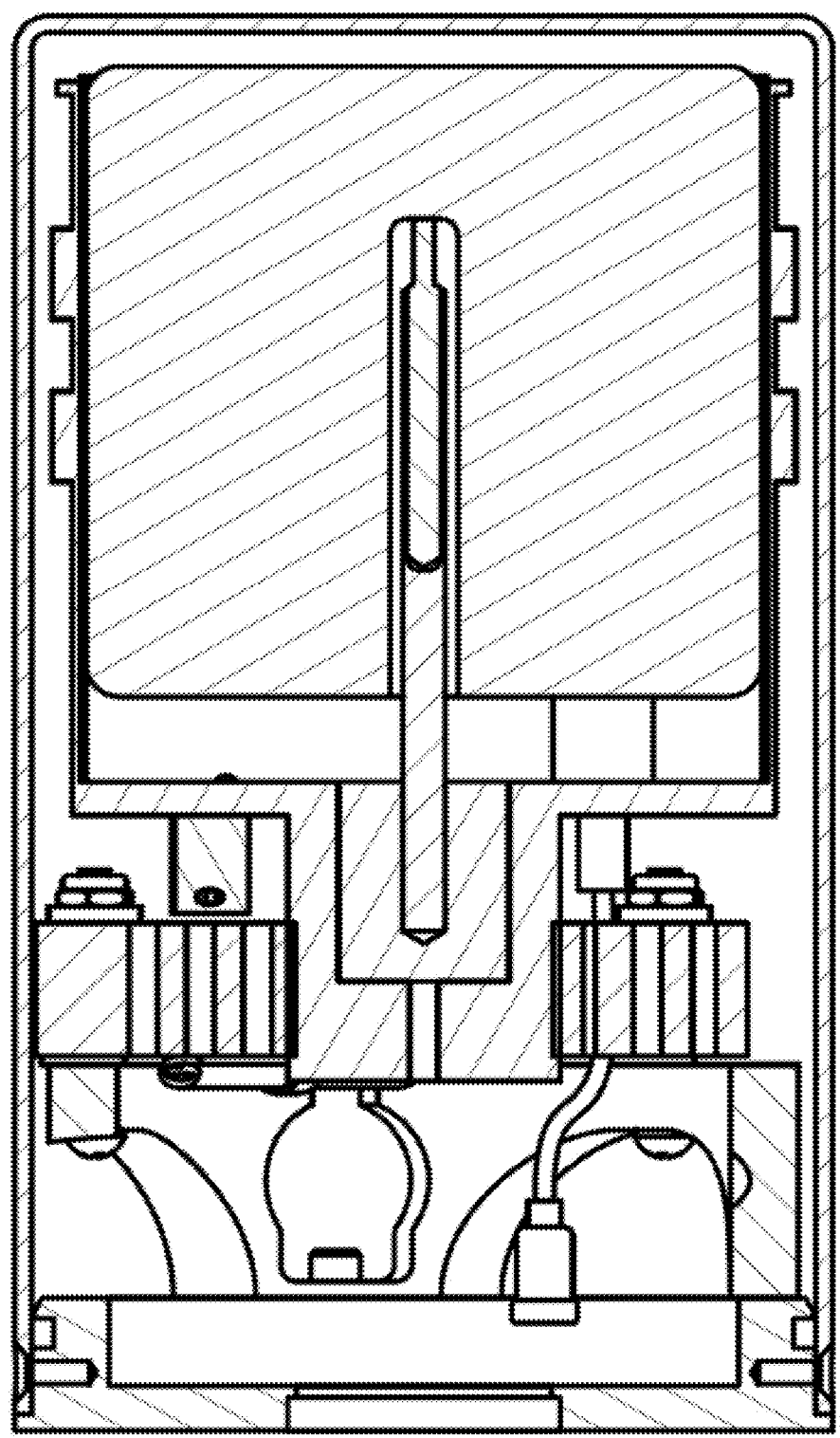
FIG. 5 illustrates a sectional view of a prior art coaxial radiation detector assembly.
Figure 7:
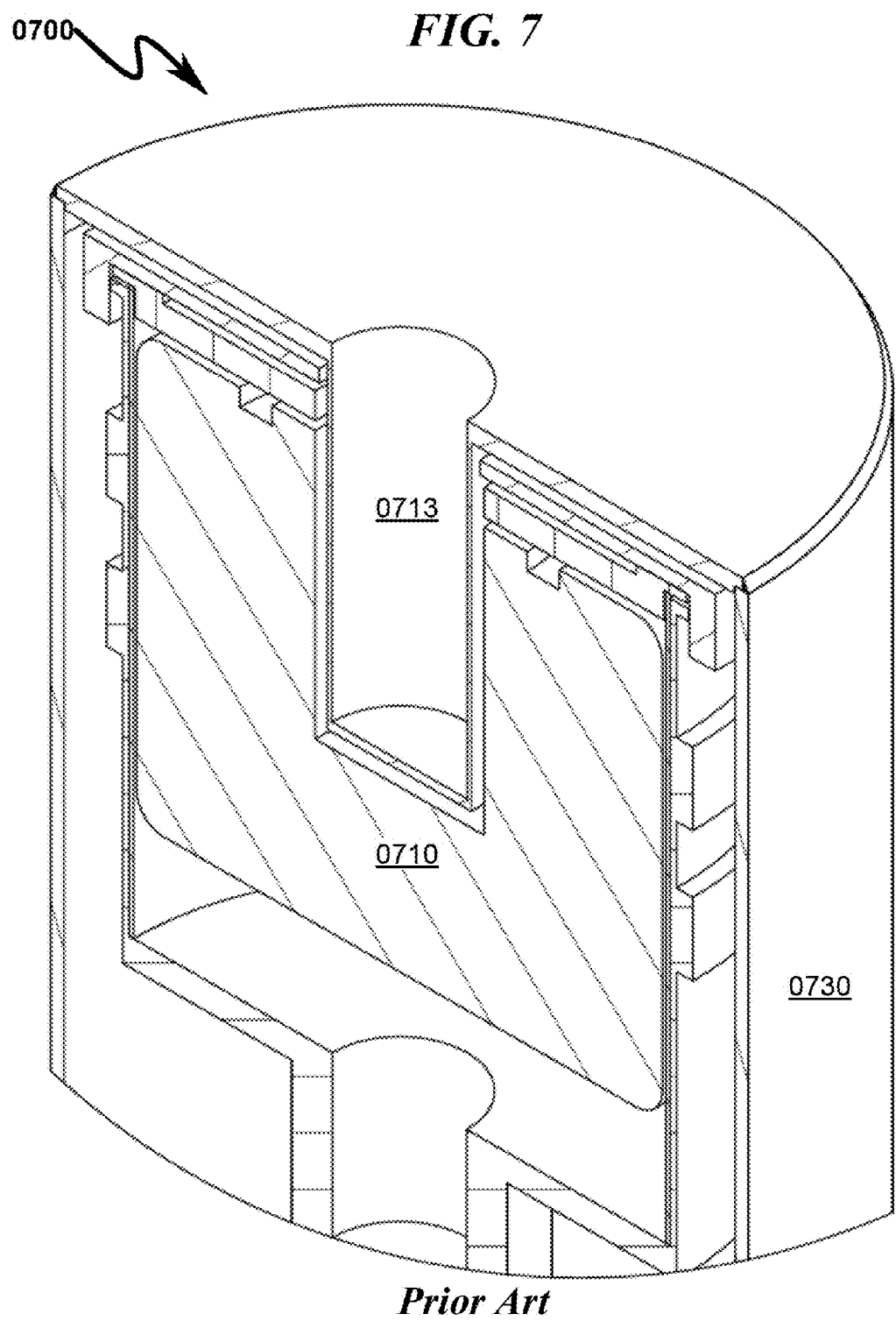
FIG. 7 illustrates a perspective sectional view of a prior art P-type coaxial well radiation detector enclosed in packaging structure as manufactured by CANBERRA®.
Figure 8:
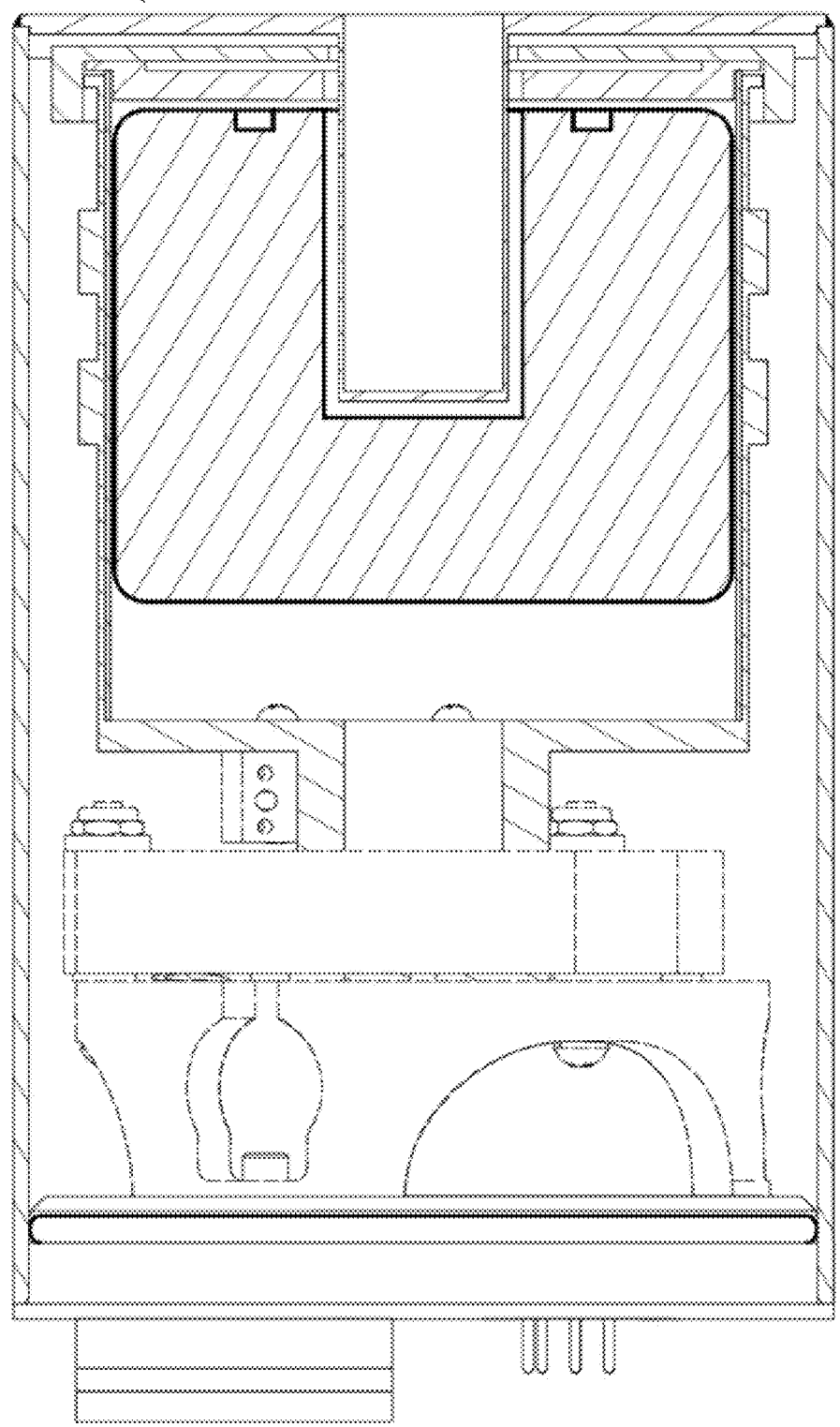
FIG. 8 illustrates a side sectional view of a prior art P-type coaxial well radiation detector enclosed in packaging structure as manufactured by CANBERRA®.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a SAGe WELL RADIATION DETECTOR SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Method Steps not Limitive

The general method steps described herein may be modified heavily depending on a number of factors, with rearrangement and/or addition/deletion of steps anticipated by the scope of the present invention. Integration of the described methods and other preferred exemplary embodiment methods in conjunction with a variety of preferred exemplary embodiment systems described herein is anticipated by the overall scope of the present invention.

Radiation Detector not Limitive

The present invention may be utilized as a SAGe well radiation detector in a wide variety of contexts which may include radiation monitoring and/or scanning applications. Thus, the term "detector" or "detection" should be given its broadest possible meaning to include, among other things, radiation monitoring and/or radiation scanning.

Outer Surface Configuration not Limitive

While the present invention may be constructed using a wide variety of outer surface profiles, many exemplary embodiments utilize a cylindrical or conic frustum outer surface profile to improve the detector efficiency in many preferred embodiments. It should be noted that the P-type bulk germanium volume (PGEV) may have a wide variety of volumetric configurations not necessarily limited to those having cylindrical, conic, or frustum-based profiles. For example, the present invention anticipates polyhedral outer surface profiles in some configurations. Additionally, a "portion" of the outer surface should be interpreted to include situations in which the "portion" is the entire outer surface of the PGEV. Therefore, the interpretation of the "outer surface" of the PGEV (or a "portion" thereof) should be given its broadest possible interpretation consistent with the operation of the radiation detection device as described herein.

Electrical Coupling not Limitive

The present invention may utilize the term "electrically coupled" or its equivalent in describing communication between a radiation detector (RD), detector electronics (DE), and a computing device (CD). This electrical coupling should be construed broadly to include both physical electrical coupling as well as communication via any form of wireless communication such as BLUETOOTH®, WiFi, or other wireless communication means.

N+ and P+ Contacts not Limitive

The present invention may utilize a wide variety of N+ contact types in the formation of the SAGe detector, including but not limited one or more contact types selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact. This selection may include any contact type used to create reverse biased diodes incorporating low leakage current characteristics. Within this context, the selection of N+ and/or P+ contacts implemented may incorporate any combination of N+ and/or P+ contacts exhibiting this behavior.

Computing Device not Limitive

The present invention may utilize the term "computer system", "computing device (CD)" or its equivalent in describing various control systems used within the present invention. These synonymous terms should be given their widest possible interpretation in this context, and are specifically anticipated to include mobile/portable computing devices such as handheld computers, tablet computers, smartphones, cell phones, laptop computer, and the like. Within the scope of the present invention, the radiation probe as described herein may be integrated with the computing device (CD) in a unitary enclosure in some preferred embodiments.

Internal Well Cavity not Limitive

Figure 16:
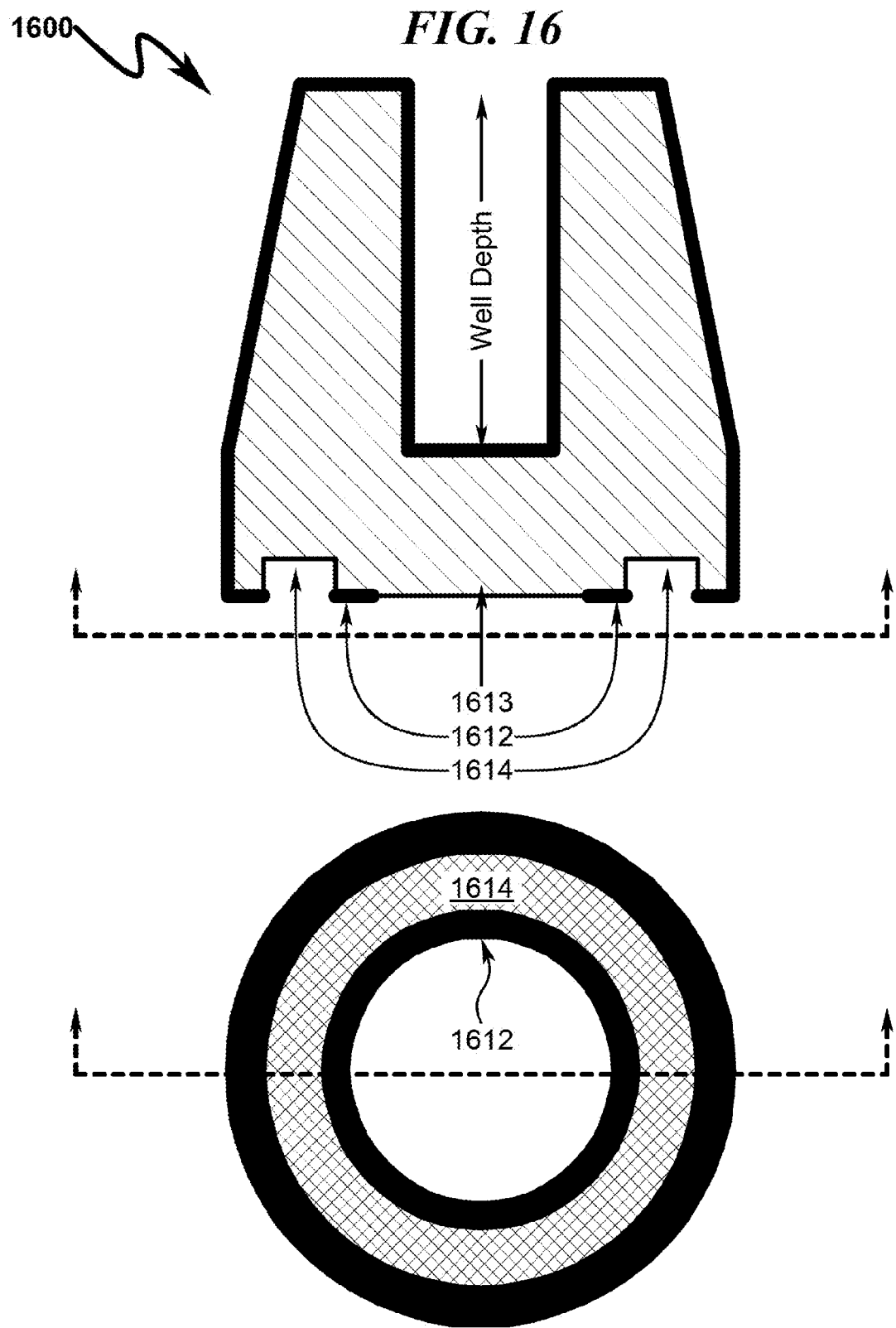
FIG. 16 illustrates an exemplary annular anode variation useful in many preferred invention embodiments.

The present invention anticipates that in certain applications an internal well cavity void (IWCV) located within the cavity entry region (CER) as described herein may not be required if the detector is to be used for purposes of locating an external radiation source. This invention embodiment essentially is the limiting case where the "well" depth and/or diameter approaches zero. In this case all other aspects and embodiments of the SAGe well detector described herein may be employed, most notably those related to a multiplicity of divided anodes with separate signal analysis chains. FIG. 16 (1600)-FIG. 28 (2800) generally illustrate the relationship between the well depth and diameter with respect to the IWCV and the plane of the CER. From this discussion it is clear that the present invention anticipates a well depth and/or diameter that may approach zero, and as such the term "IWCV" can include a well cavity of zero volume in which case the plane of the CER is uniform across the top face of the PGEV or in some cases formed using intrinsic material in place of the IWCV rather than an N+ electrode.

System Overview and Prior Art Contrast (1400)

Figure 14:
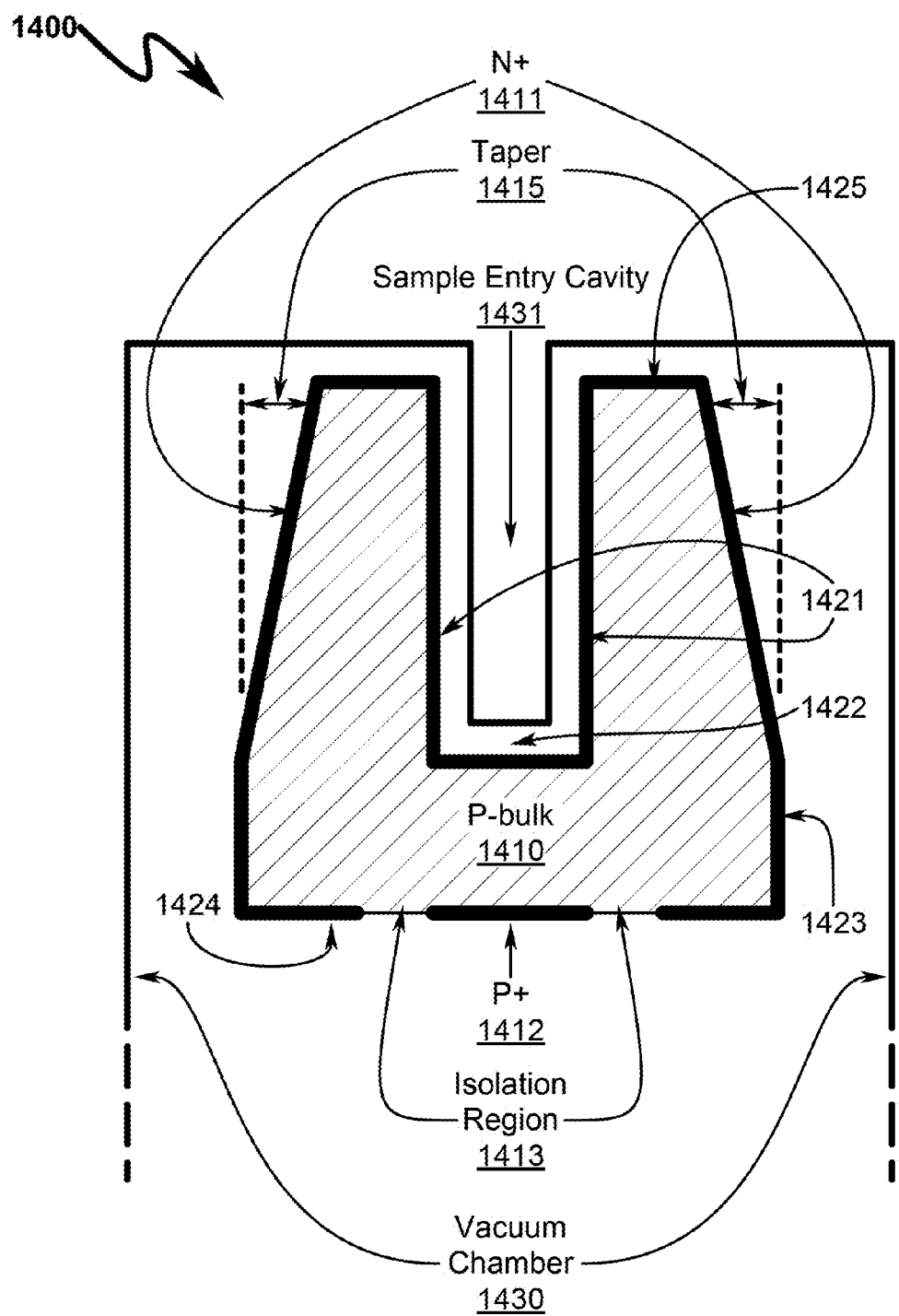
FIG. 14 illustrates side and top sectional views describing a presently preferred invention embodiment.

The present invention may best be contrasted with the prior art by comparing the prior art of FIG. 1 (0100) as exemplified by the closed-end coaxial detector (0120) with the preferred exemplary invention embodiment as generally depicted in FIG. 14 (1400). Here the contrast can be seen in comparing the prior art P+ cylindrical electrode area (0123) in FIG. 1 (0100) with that of the P+ planar electrode area (1412) as defined by the exemplary invention embodiment in FIG. 14 (1400). It is this differential in area that results in significantly lower capacitance for the detector depicted in FIG. 14 (1400) as compared to that of FIG. 1 (0100, 0120).

This illustrates that the capacitance of the conventional well detector and consequently the noise generated by the prior art well detectors is higher regardless of the well diameter of the two equivalently sized systems. Furthermore the capacitance of the conventional prior art well detector increases as the well diameter increases whereas the capacitance of the present invention SAGe well detector remains very low even if the diameter of the anode is increased somewhat in the case of larger diameter wells.

Figure 10:
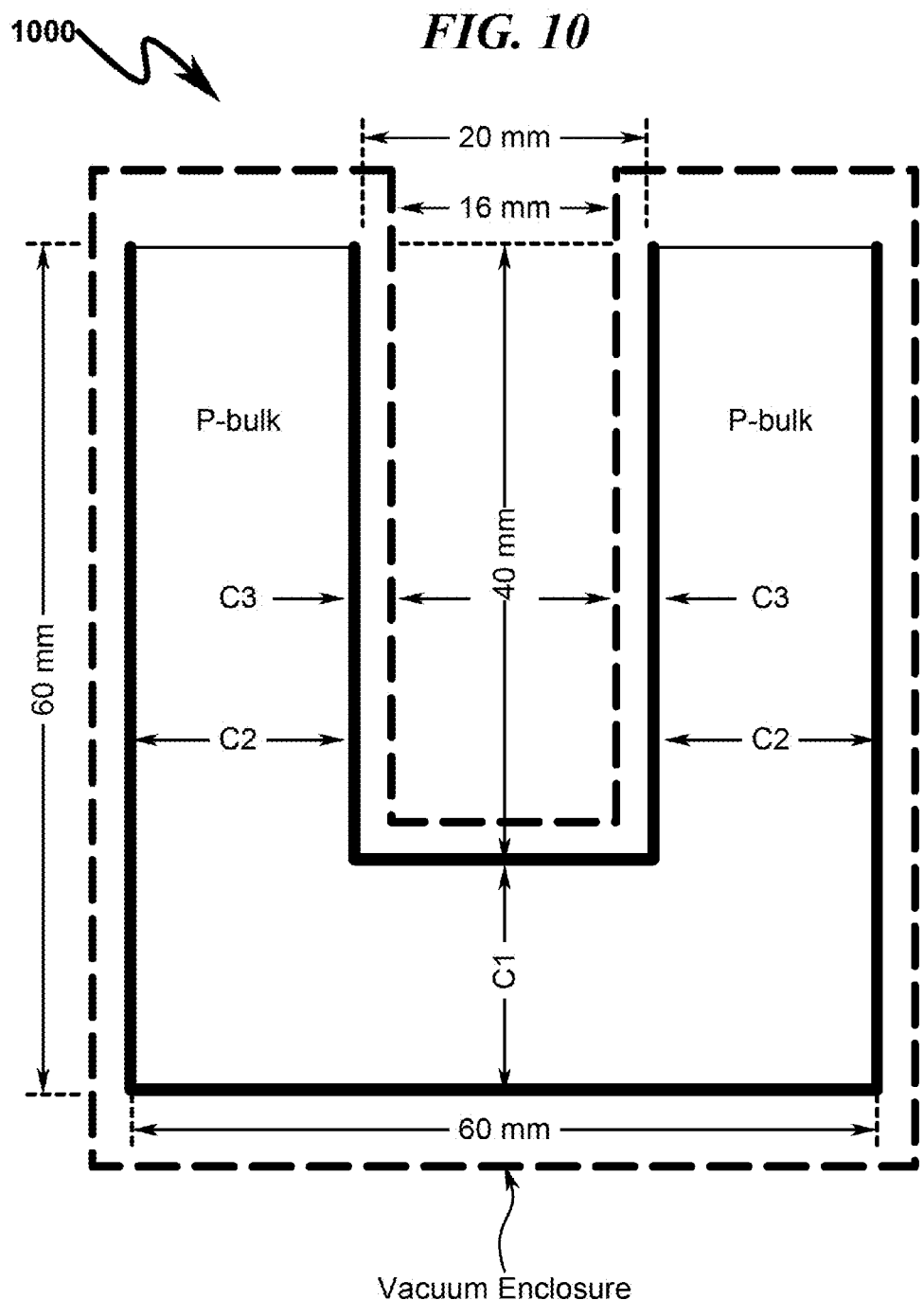
FIG. 10 illustrates prior art mechanical dimensions relating to capacitance calculations for prior art radiation detectors.
Figure 11:
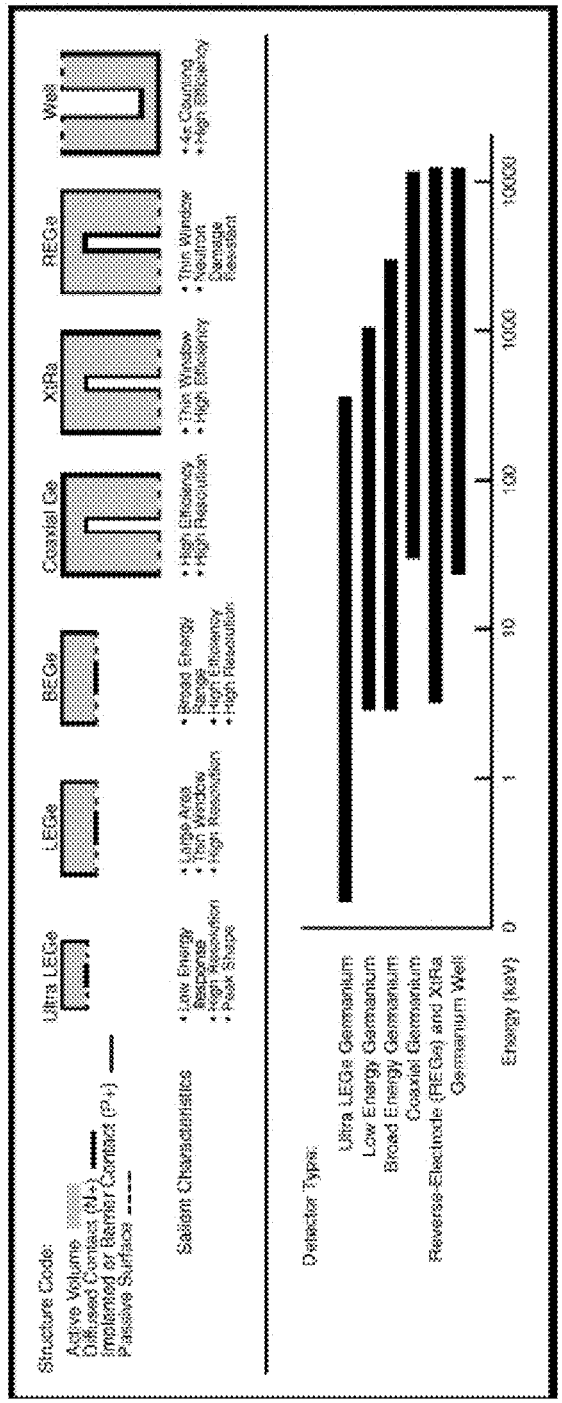
FIG. 11 illustrates a comparison of performance among various radiation detector types.
Figure 12:
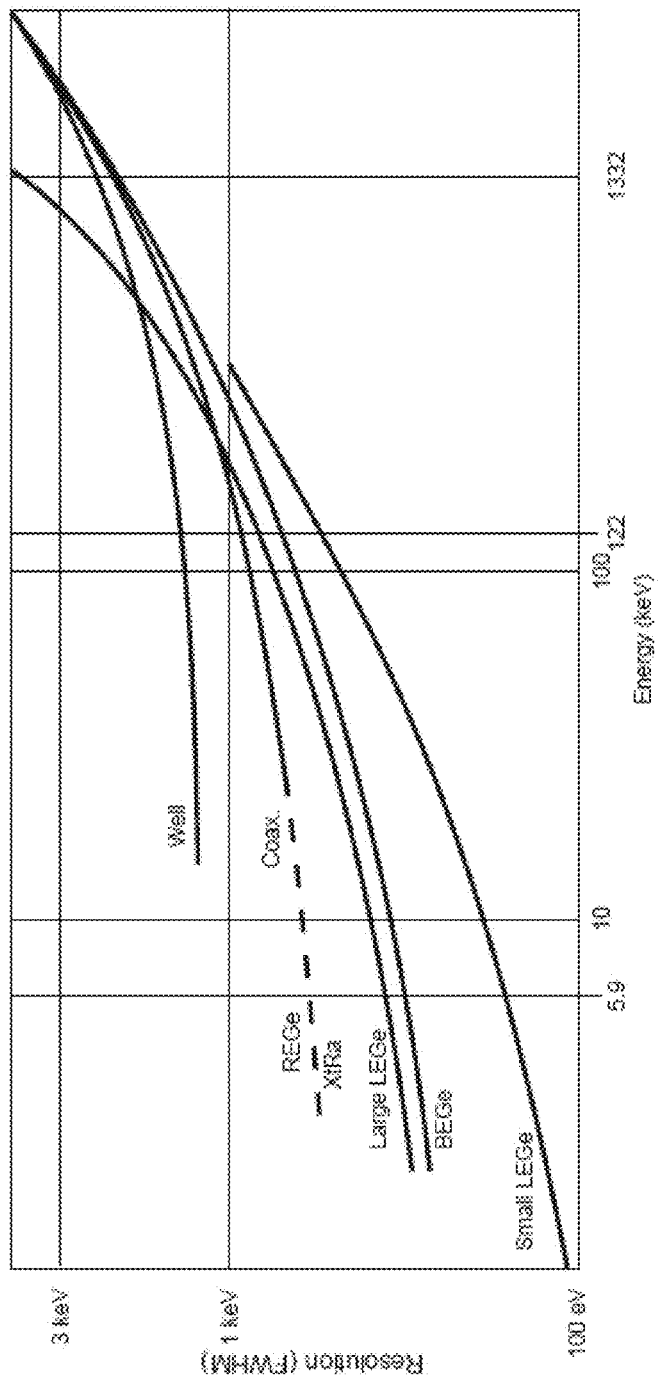
FIG. 12 illustrates a comparison of detection resolution performance among various radiation detector types.
Figure 13:
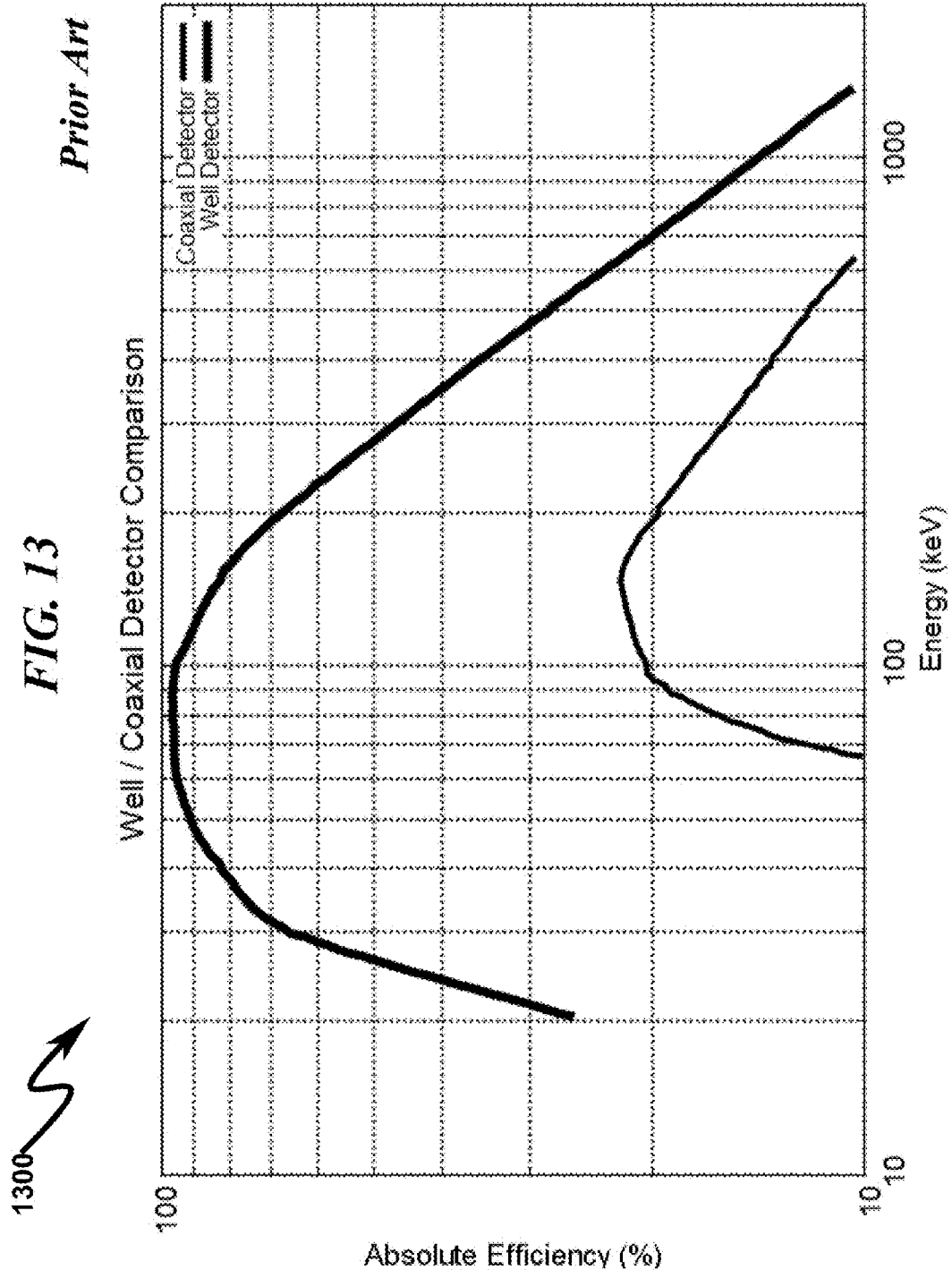
FIG. 13 illustrates a comparison of coaxial PPC detector efficiency vs. well detector efficiency.

For the present invention the cylindrical capacitances [C2] and [C3] as described above in the PRIOR ART section are not present within the present invention embodiment as illustrated in FIG. 14 (1400) so the total capacitance for many preferred invention embodiments is just that of the parallel plate capacitor (or approximately 2.2 pF using the geometric capacitance calculation example provided in FIG. 10 (1000)).

Electrical Connection Advantages

Figure 9:
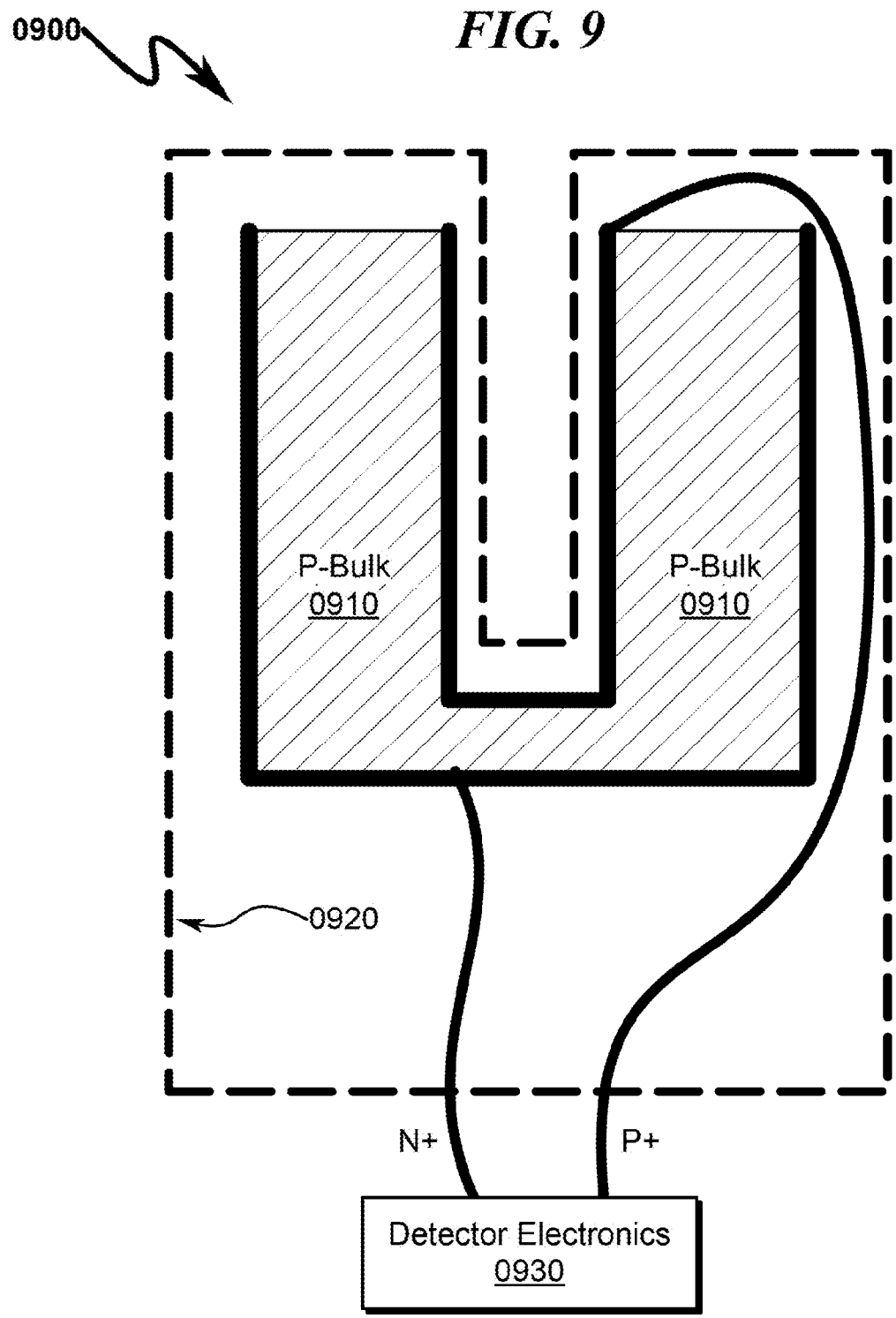
FIG. 9 illustrates wiring drawbacks associated with conventional prior art well detectors.

Another advantage of the present invention SAGe well detector as depicted in FIG. 14 (1400) is that the output signal is taken from the rear (bottom) (the external base region (EBR) of the P-type bulk germanium volume (PGEV)) instead of from the core (internal well cavity void (IWCV)). The electrical connection to the core contact (as generally illustrated in FIG. 9 (0900) with respect to the P+ wiring) takes up space which increases the distance from the detector element (0910) to the enclosure (0920) and the relatively long wire length of the signal wire adds capacitance and often leads to microphonic noise and degraded energy resolution.

Preferred System Embodiment (1400)

A preferred exemplary invention system embodiment is generally illustrated in the side sectional view of FIG. 14 (1400), wherein the system generally comprises the following elements:
(a) P-type bulk germanium volume (PGEV) (1410);
(b) N+ electrode (1411);
(c) P+ electrode (1412); and
(d) vacuum encapsulating chamber enclosure (VECE) (1430).

Within this context the radiation sample is placed within the conformal cavity (1431) formed by the VECE within the P-type bulk material (1410). Generally speaking, the VECE encapsulates the PGEV (1410) to provide for contamination protection as well as provide for cooling of the detector system.

The N+ electrode (1411) encapsulates the P-bulk (1410) on all surfaces (inner and outer) with the exception of the P+ electrode area (1412) and an isolation region (1413) that separates the N+ electrode (1411) and the P+ electrode (1412).

The various surfaces and voids of the PGEV (1410) may be described and identified as follows. The PGEV may be generally described as comprising an internal surface (1421) (conforming to the inner cavity (1422) and an external surface (1423, 1424, 1425) (conforming to the external surfaces not comprising the sample cavity). The external surface may be further described as comprising an outer surface (1423) (conforming to the substantially vertical sides of the PGEV (1410)), an external base region (EBR) (1424) (conforming to the plane on which the P+ electrode (1412) is deposited), and a cavity entry region (CER) (1425) (conforming to the top surface plane substantially perpendicular to the sample cavity (1421)). The PGEV (1410) further comprises an internal well cavity void (IWCV) (1422), the surface of said IWCV (1422) forming the internal surface (1421). The P+ electrode (1412) is formed on said EBR (1424) and surrounded by an isolation region (1413). The N+ electrode (1411) is formed on the internal surface (1421), outer surface (1423), the CER (1425), and on the EBR (1424) outside of said isolation region (1413). Various alternate embodiments of the present invention modify the relationship between the N+ (1411) and P+ (1412) electrodes on the EBR (1424) and are discussed in detail elsewhere in this document.

The VECE (1430) permits a radiation sample (not shown) to be placed within the IWCV sample cavity (1431) so that radiation emitted by the sample may be detected by the P-type bulk material (1410) and the associated N+ electrode (1411)/P+ electrode (1412) structures. Isolation of the sample environment and the PGEV (1410) permits the PGEV (1410) structure to be cryogenically cooled while the sample environment (1431) is drawn down to a vacuum. The structure as shown permits the diameter of the IWCV to be increased without degrading the performance of the overall radiation detector as detailed elsewhere in this disclosure.

Alternative Embodiment

Isolation Groove (1500)

The present invention may also be constructed as generally illustrated in the side sectional view of FIG. (1500), wherein the isolation region comprises an annular groove (1514) that physically isolates the N+ electrode region (1511) from the P+ electrode region (1512). This annular groove may in some cases comprise intrinsic bulk material used to provide isolation between the N+ and P+ regions on the EBR.

Annular P+ Anode Variations (1600)-(1700)

In the case of the present invention SAGe well detector with an extremely large well, the present invention anticipates as generally depicted in FIG. 16 (1600) an annular shaped anode (1612) to better span the active rear surface of the detector for better charge collection. In this configuration the width of the annular ring can be quite small and thus the effect on capacitance minimal.

This configuration may in some configurations incorporate an isolation groove (1614) as discussed previously to isolate the N+ and P+ regions on the EBR of the device. The region inside the annular P+ electrode ring (1612) may comprise either an intrinsic region (1613) as depicted in FIG. 16 (1600) or it may comprise an isolated N+ electrode (1713) as depicted in FIG. 17 (1700). The annular anode ring placement is not limited to the plane of the EBR, and may be layered on top of or below the EBR surface plane. The anode ring may also be placed on the bottom or inside wall (or walls) and/or bottom of the isolation groove (1614, 1714). The center of the EBR inside the annular ring in all cases may either remain an intrinsic surface (1613), or it can be made into an N+ electrode (1713) (cathode) as depicted in FIG. 17 (1700) and connected in parallel with the large outer N+ electrode (1716) to further enhance the charge collecting electric fields within the detector.

Segmented P+ Anode Variations (1800)-(2000)

The present invention anticipates that any embodiment of the P+ electrode may be subject to being subdivided into a multiplicity of separate electrodes. Exemplary variations of this theme are depicted in FIG. 18 (1800)-FIG. 20 (2000). Exemplary segmented anode embodiments are illustrated in FIG. 18 (1800) wherein a single planar P+ electrode is divided into four segments (1812, 1822, 1832, 1842) in FIG. 19 (1900) where a continuous annular P+ electrode in the plane of the EBR is divided into four segments and in FIG. 20 (2000) wherein the FIG. 19 (1900) embodiment is augmented with a EBR N+ center (cathode) contact. In all cases the segments may be connected individually to separate preamplifiers and signal analysis chains to provide additional information concerning the location of the radiation source relative to the detector. The number of segments may be increased or decreased depending on the spatial precision required. In the case of the subdivided annular P+ electrode the electrode is not confined to the plane of the EBR, but may reside on the inside wall (or walls) and/or bottom of the isolation groove. As in the case of the continuous annular P+ electrode, the region inside the annulus may remain intrinsic or may comprise an N+ electrode connected in parallel to the outer N+ electrode.

Exemplary SAGe Well Detector Assemblies (2100)-(2400)

Figure 21:
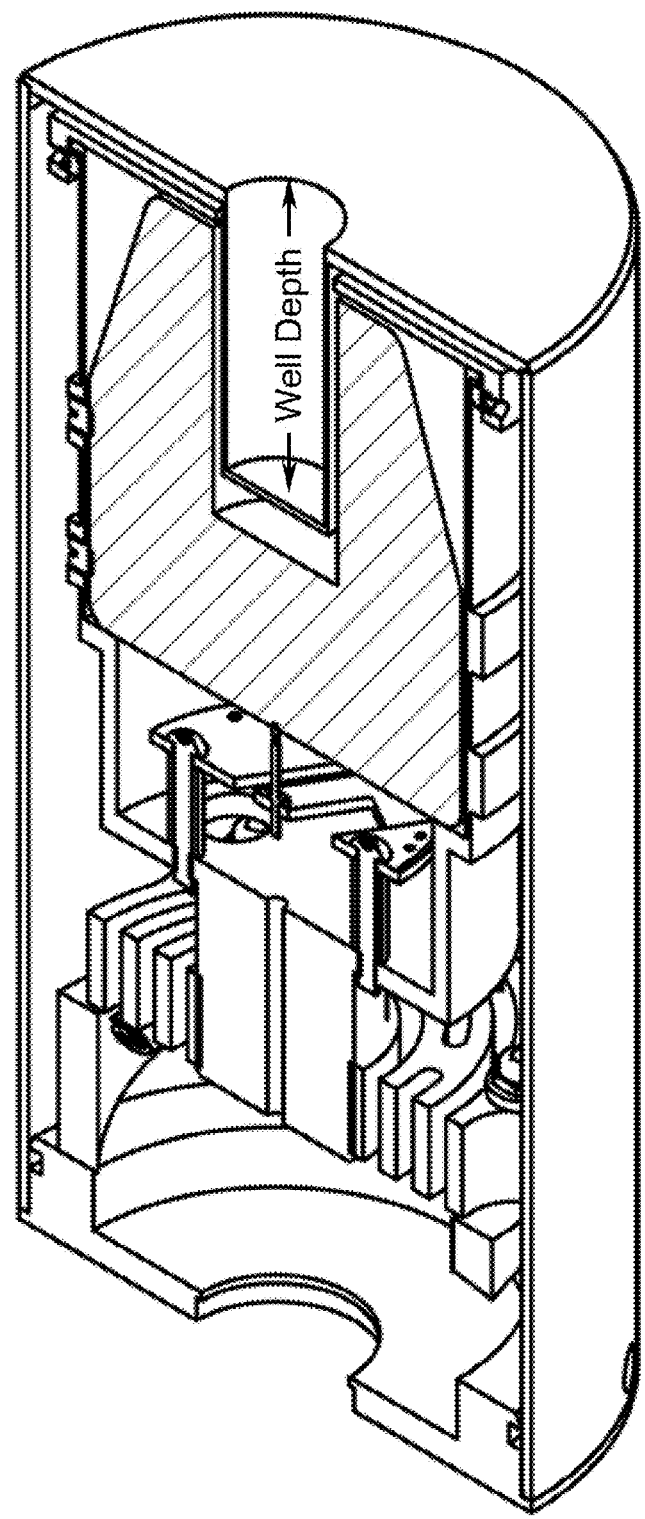
FIG. 21 illustrates a perspective sectional view of an exemplary SAGe well assembly incorporating a tapered PGEV.
Figure 22:
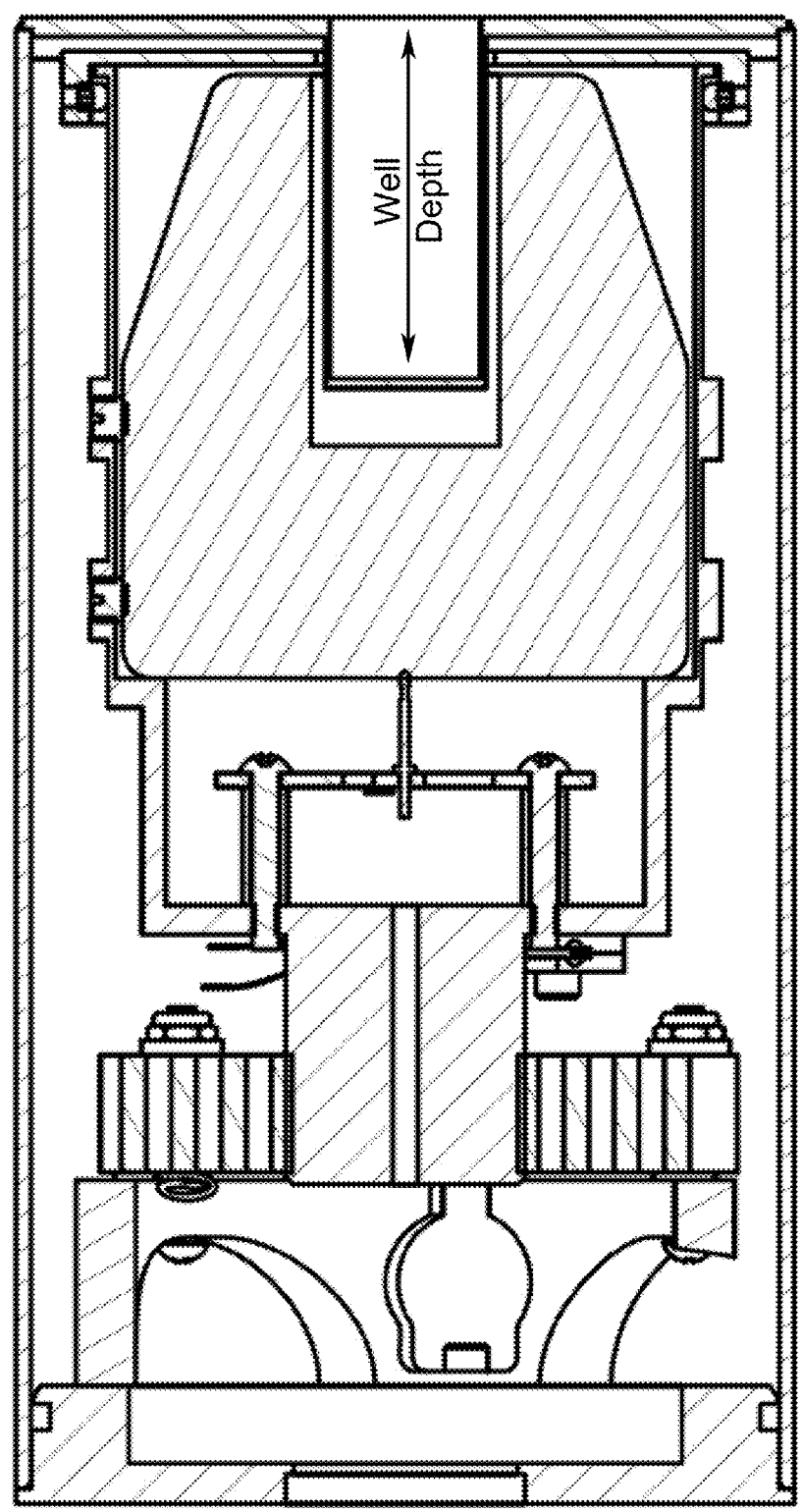
FIG. 22 illustrates a side sectional view of an exemplary SAGe well assembly incorporating a tapered PGEV.
Figure 23:
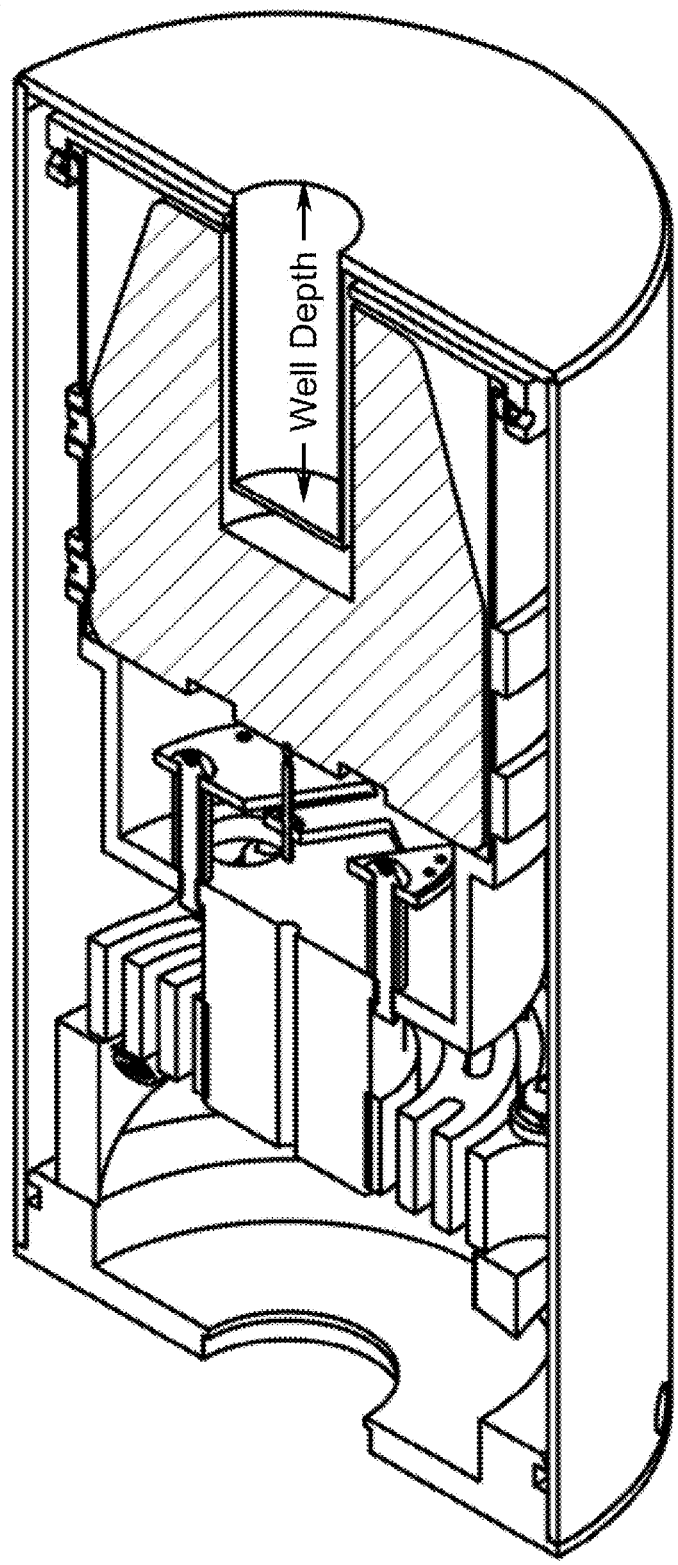
FIG. 23 illustrates a perspective sectional view of an exemplary SAGe well assembly incorporating an isolation groove between the P+ and N+ contact regions.
Figure 24:
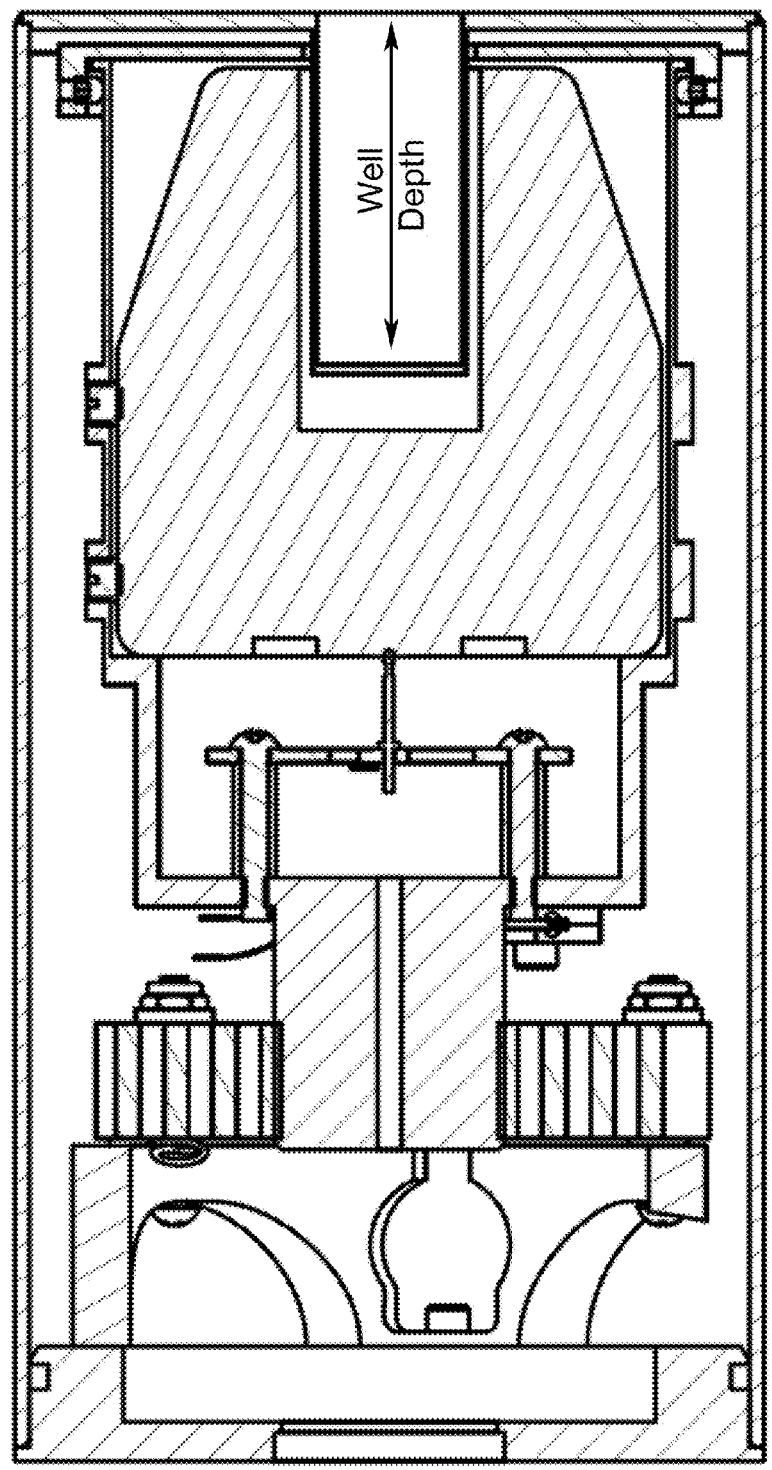
FIG. 24 illustrates a side sectional view of an exemplary SAGe well assembly incorporating an isolation groove between the P+ and N+ contact regions.

The present invention teachings detailed herein regarding SAGe well detectors may be advantageously applied to a wide variety of SAGe well detector assembly applications as generally illustrated by the tapered PGEV embodiments detailed in FIG. 21 (2100)-FIG. 22 (2200) featuring a planar P+/N+ isolation region and FIG. 23 (2300)-FIG. 24 (2400) featuring a P+/N+ isolation groove. While these assemblies are believed to be optimal, one skilled in the art will recognize that these assemblies are only exemplary of a wide variety of possible themes given the contact placement and outer surface variations taught herein.

Outer Surface Profile Variations (2500)-(2800)

Theory of Operation

The present invention SAGe well detector operates on the principle of separating and collecting the charge liberated in the depletion region of a fully depleted reverse biased germanium detector. Electrons are collected to the N+ cathode, or cathodes, and holes are collected to the small area anode or anodes.

Outer Surface Profile Variations

Figure 25:
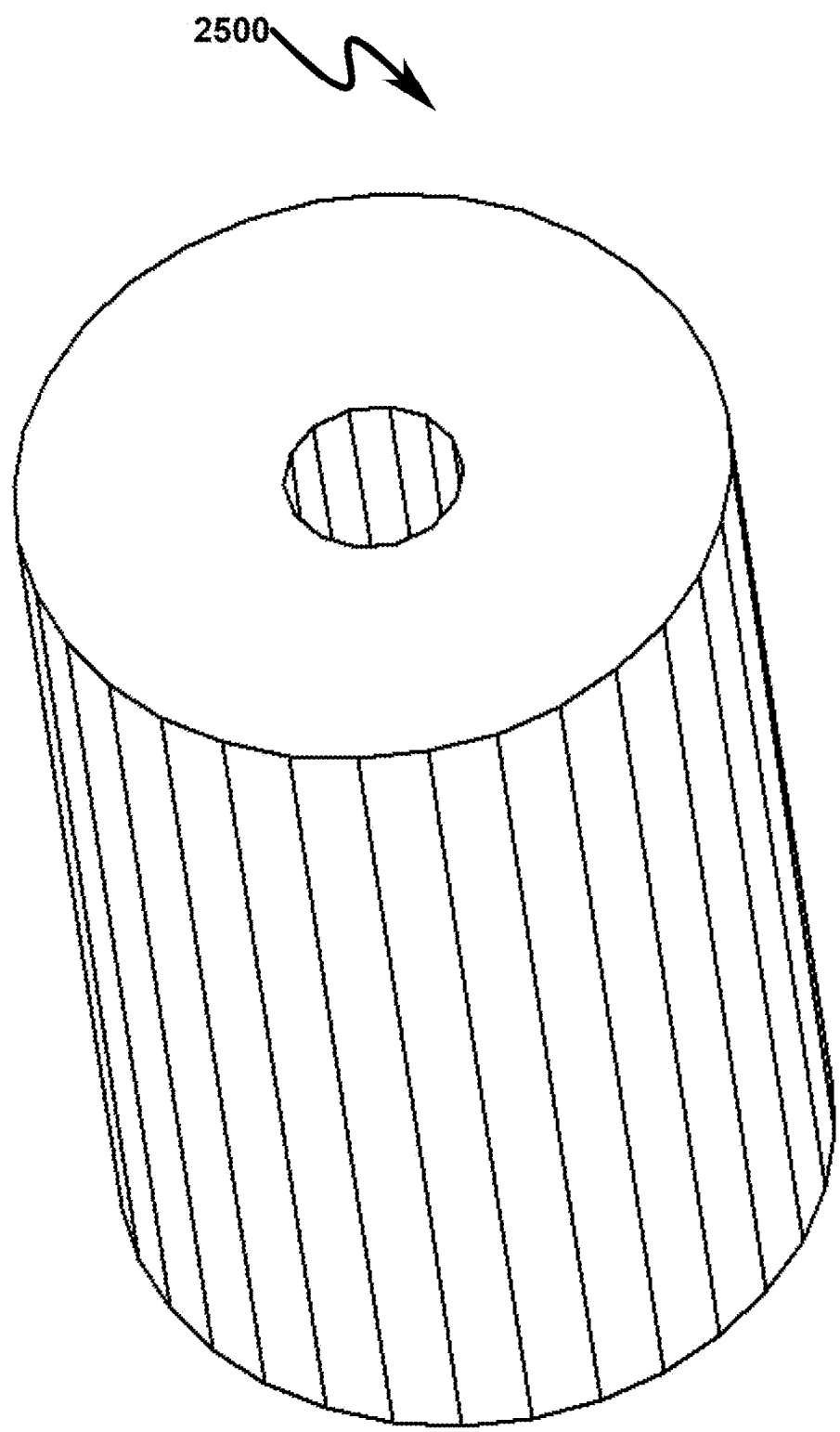
FIG. 25 illustrates a preferred exemplary embodiment incorporating a cylindrical outer surface.

As mentioned previously, the outer surface profile of the PGEV may have a variety of configurations depending on application. As generally illustrated in the cylindrical embodiment perspective view of FIG. 25 (2500), the corresponding equipotential graph of FIG. 26 (2600), the partial conical frusta (tapered) embodiment view of FIG. 27 (2700), and the corresponding equipotential graph of FIG. 28 (2800), these variations may include cylinders, partial (or full) frusta, conic frusta, and polyhedral frusta. While many preferred embodiments incorporate partial frusta on the outer surface profile to a depth roughly equivalent to the depth of the sample cavity, the present invention is not limited to this preferred outer surface profile.

Exemplary Performance

Figure 26:
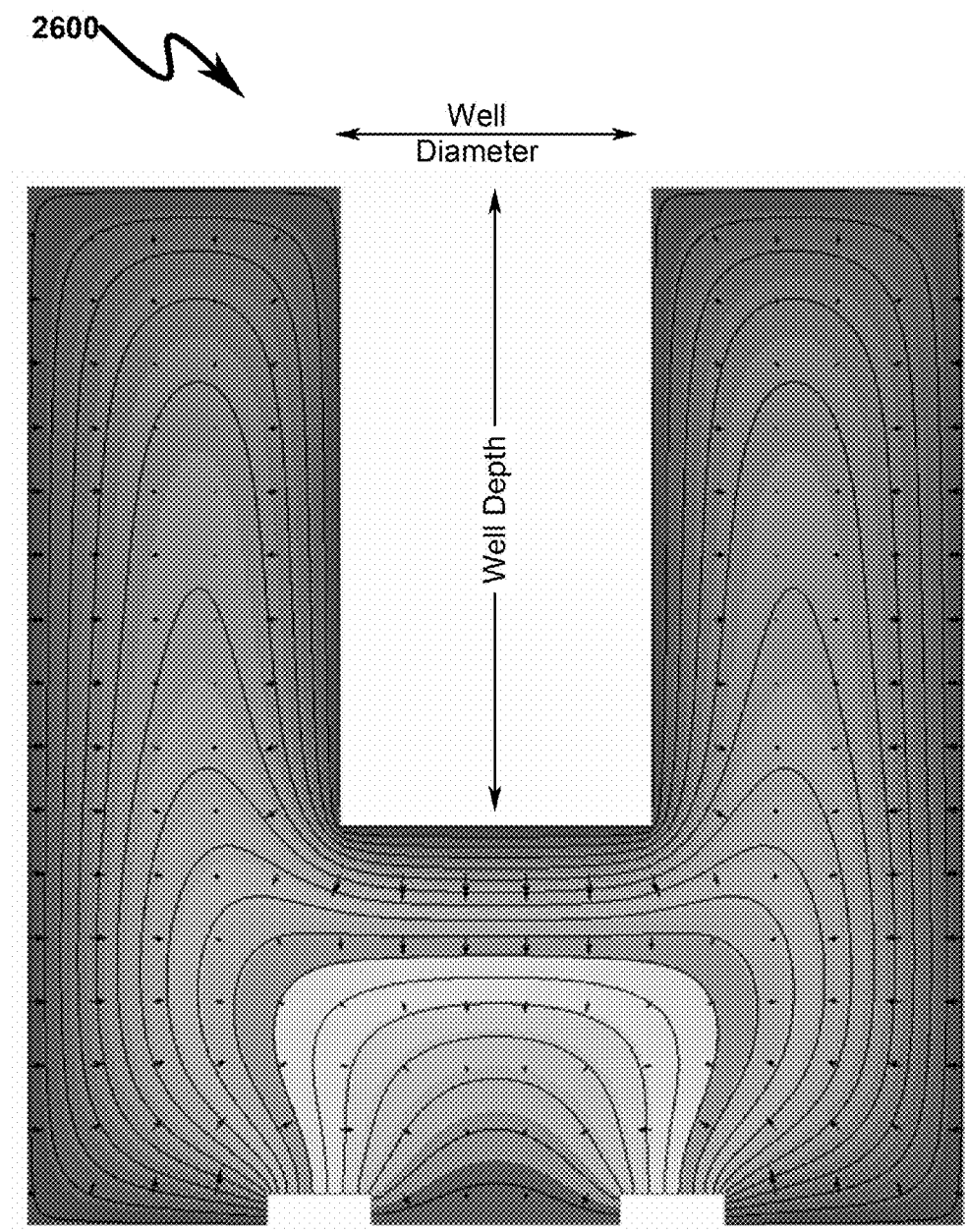
FIG. 26 illustrates a graph of equipotential lines associated with a preferred exemplary embodiment incorporating a cylindrical outer surface.
Figure 27:
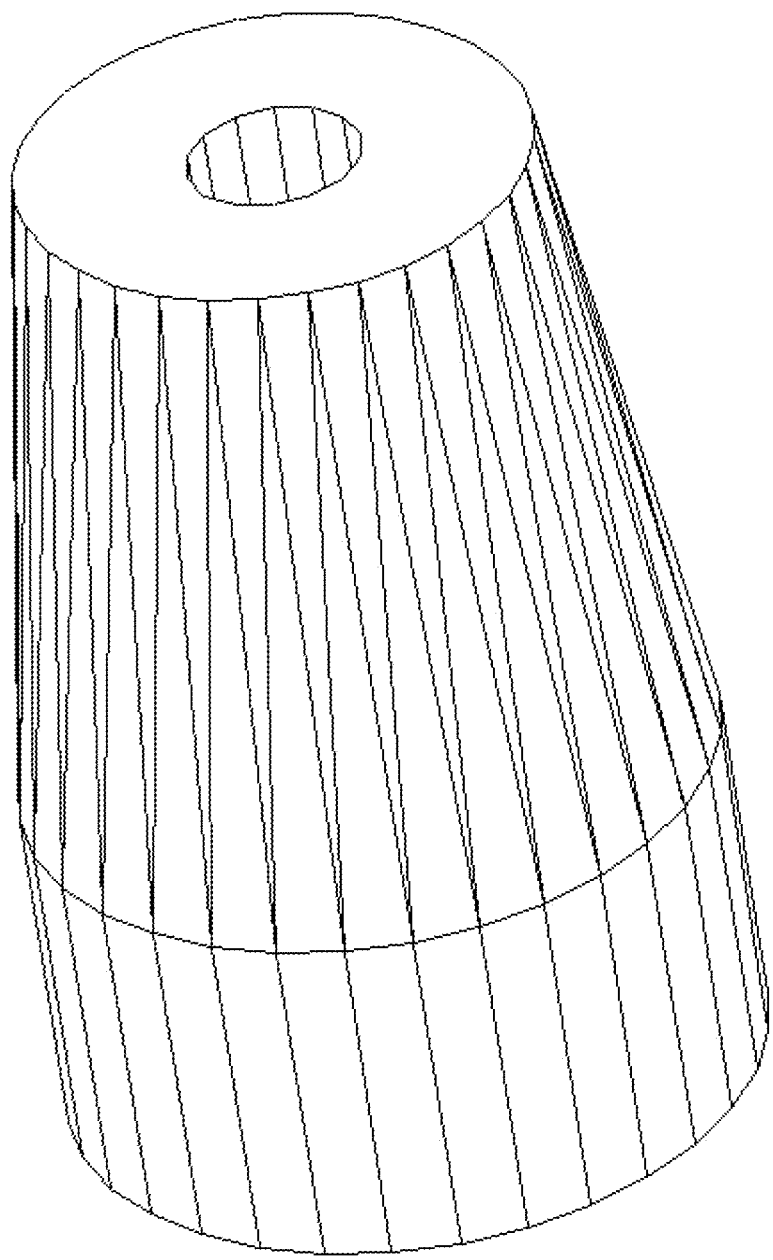
FIG. 27 illustrates a preferred exemplary embodiment incorporating a conical partial frusta (tapered) outer surface.
Figure 28:
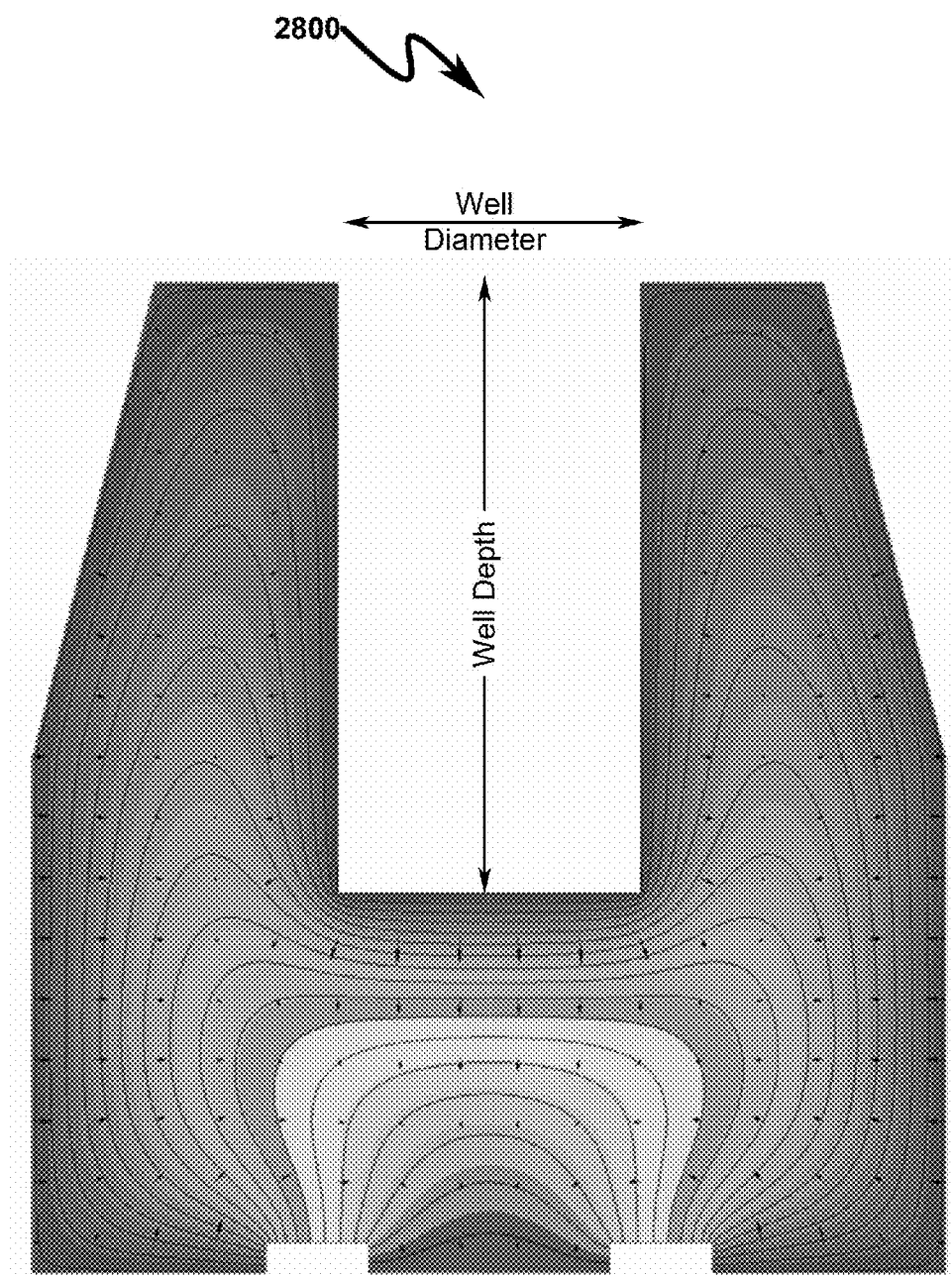
FIG. 28 illustrates a graph of equipotential lines associated with a preferred exemplary embodiment incorporating a conical partial frusta (tapered) outer surface.

The corresponding equipotential graphs of FIG. 26 (2600) and FIG. 28 (2800) provide additional detail on these SAGe well detector embodiments under typical operating bias conditions. The tapered configuration of FIG. 27 (2700) and FIG. 28 (2800) are believed to be optimal embodiments, but the present invention is not necessarily limited to this particular outer surface profile.

FIG. 26 (2600) and FIG. 28 (2800) show the equipotential lines in such a typical device under full depletion. The electric field, while small, is sufficiently strong to ensure that the electron and hole charge carrier reach their respective electrodes without being trapped in the bulk. The charge travel time is large in comparison to conventional detectors, but this is not generally a problem since well detectors are used almost exclusively for weak samples where low count rates are the norm.

The exemplary PGEV structure of FIG. 27 (2700) and its associated equipotential plot of FIG. 28 (2800) generally correspond to the SAGe assembly cross sectional views of FIG. 23 (2300) and FIG. 24 (2400) (incorporating isolation grooves), but one skilled in the art will recognize that corresponding performance can be obtained from the various other PGEV outer surface configurations detailed herein and anticipated within the invention scope. As stated previously, while the tapered or truncated conical shape may be employed to improve the electric field strength between electrodes in some embodiments and thus improve the resultant spectral peak shape and energy resolution, this invention scope is not limited to this particular exemplary embodiment. Additionally, while FIG. 23 (2300)-FIG. 24 (2400) and FIG. 28 (2800) incorporate isolation grooves separating the N+ and P+ contacts that can help reduce leakage current and surface breakdown, the invention scope is not limited to this exemplary embodiment.

Exemplary System Application Context (2900)

Figure 29:
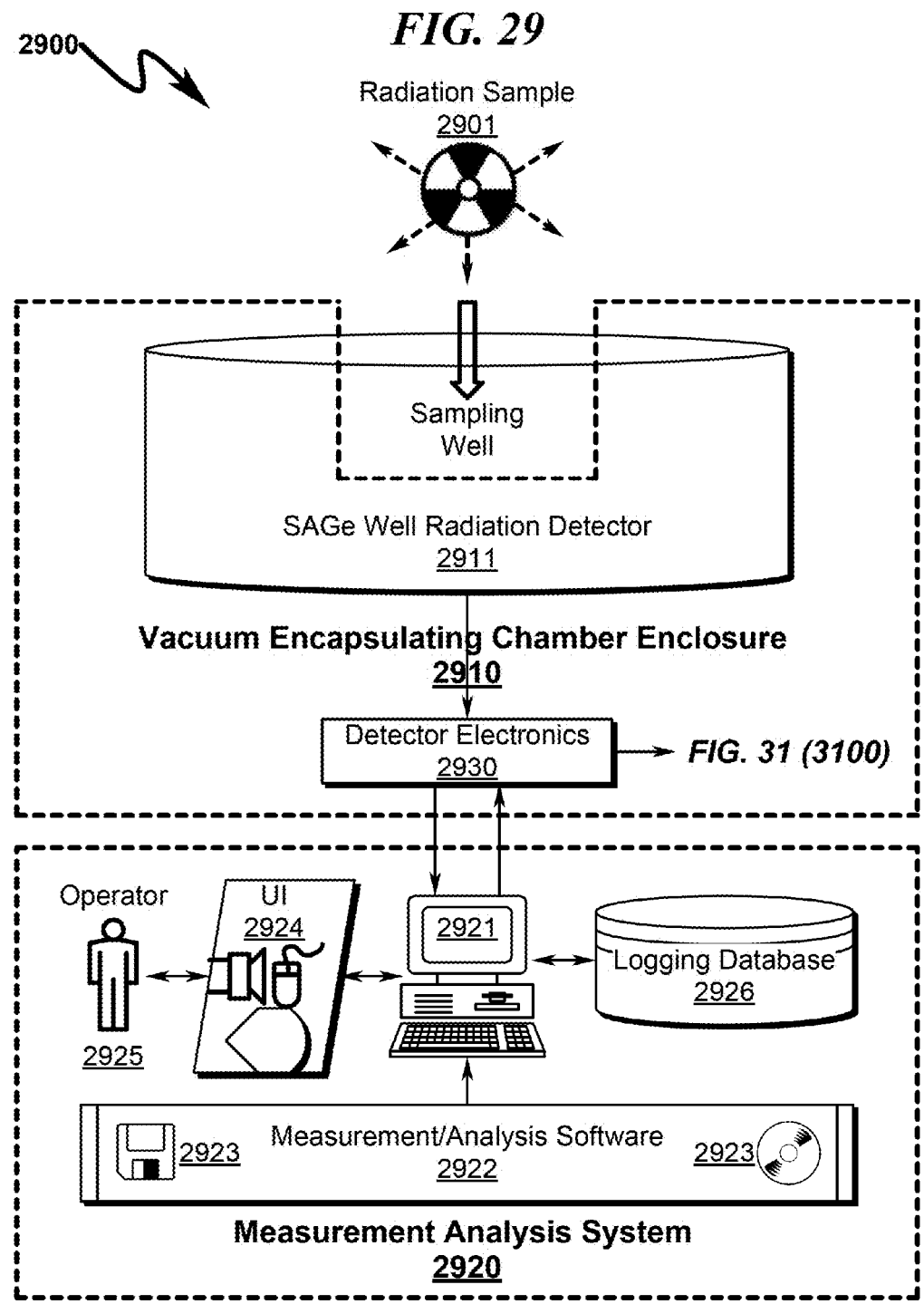
FIG. 29 illustrates an exemplary system application embodiment of the present invention as applied to a radiation analysis system.

The present invention SAGe radiation detector may be seen in an overview system application context as generally illustrated in FIG. 29 (2900), wherein the SAGe well radiation detector (2911) may operate in conjunction with a computer system (2921) running under control of software (2922) read from a computer readable medium (2923) that generates a user interface (UI) (2924). This computer system (2921) may interact with an operator (2925) who typically interfaces with the computer system (2921) and/or software application/operating system (2922) using a user interface (2924) that may include a graphical user interface and/or an audible (speech-driven) user interface.

Figure 15:
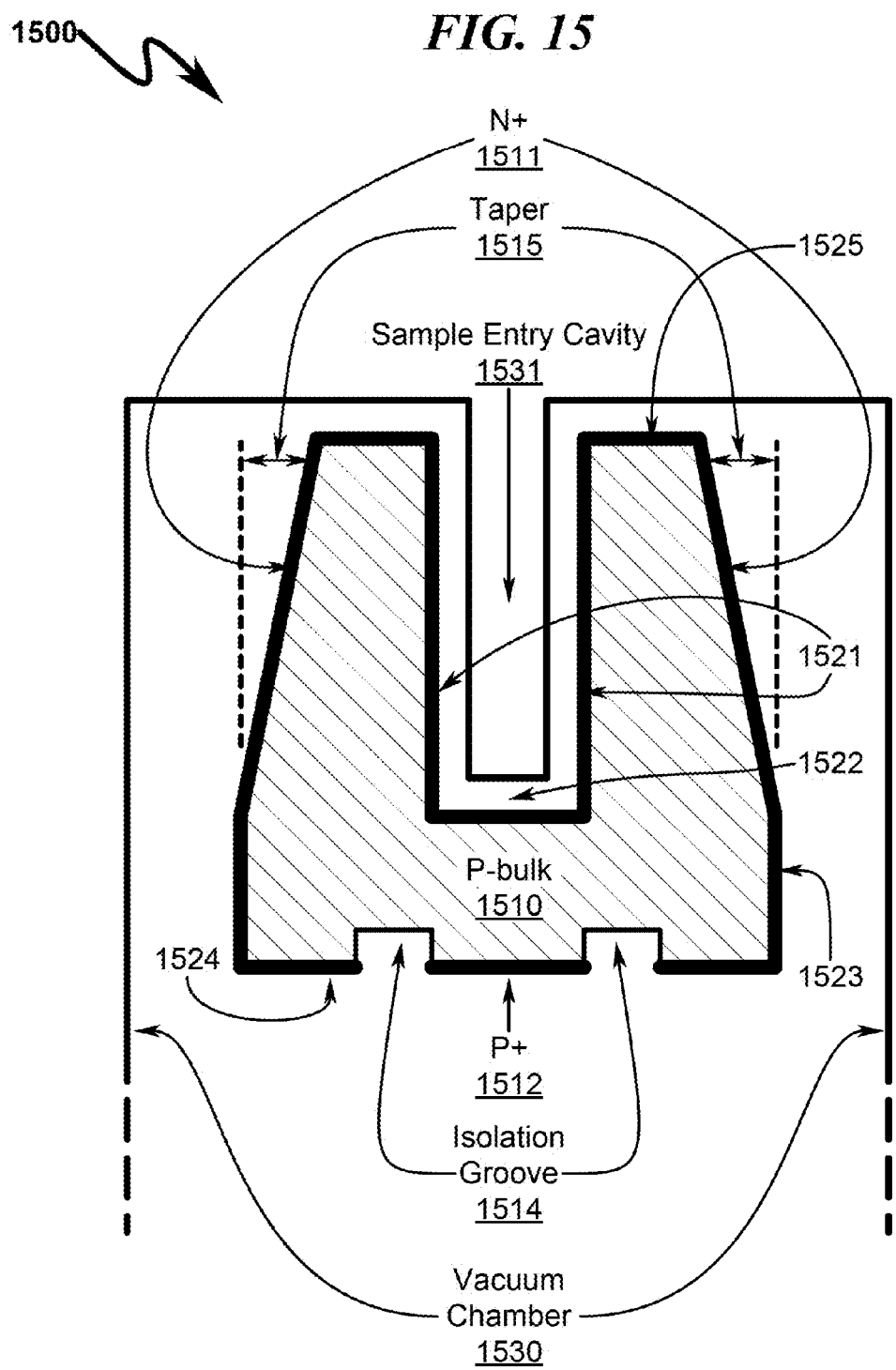
FIG. 15 illustrates a detailed system diagram describing a presently preferred system context for the present invention.

The present invention radiation detector may be utilized within a system application context as generally illustrated in FIG. 29 (2900) and FIG. 15 (1500). Within this radiation detector system application context, the vacuum encapsulating chamber enclosure (VECE) (2910) enclosing the SAGe well radiation detector (2911) is configured to electrically connect the N+ and P+ electrodes of the SAGe well (2911) to detector electronics (2930) that interface to a measurement analysis system (MAS) (2920). The MAS (2920) incorporates a computing device (2921) to collect the radiation count information from the detector electronics (2930) and process this using measurement/analysis software (2922) read from a computer readable medium (2923). This software provides for a user interface (2924) enabling an operator (2925) to direct operation of the computing device (2921) and thus supervision of the detector electronics (2930) operation. Data collected by the measurement analysis software (2922) may be logged to a database (2926) for archiving and further analysis purposes.

Exemplary Analog/Digital Signal Processing Chain (3000)

Figure 30:
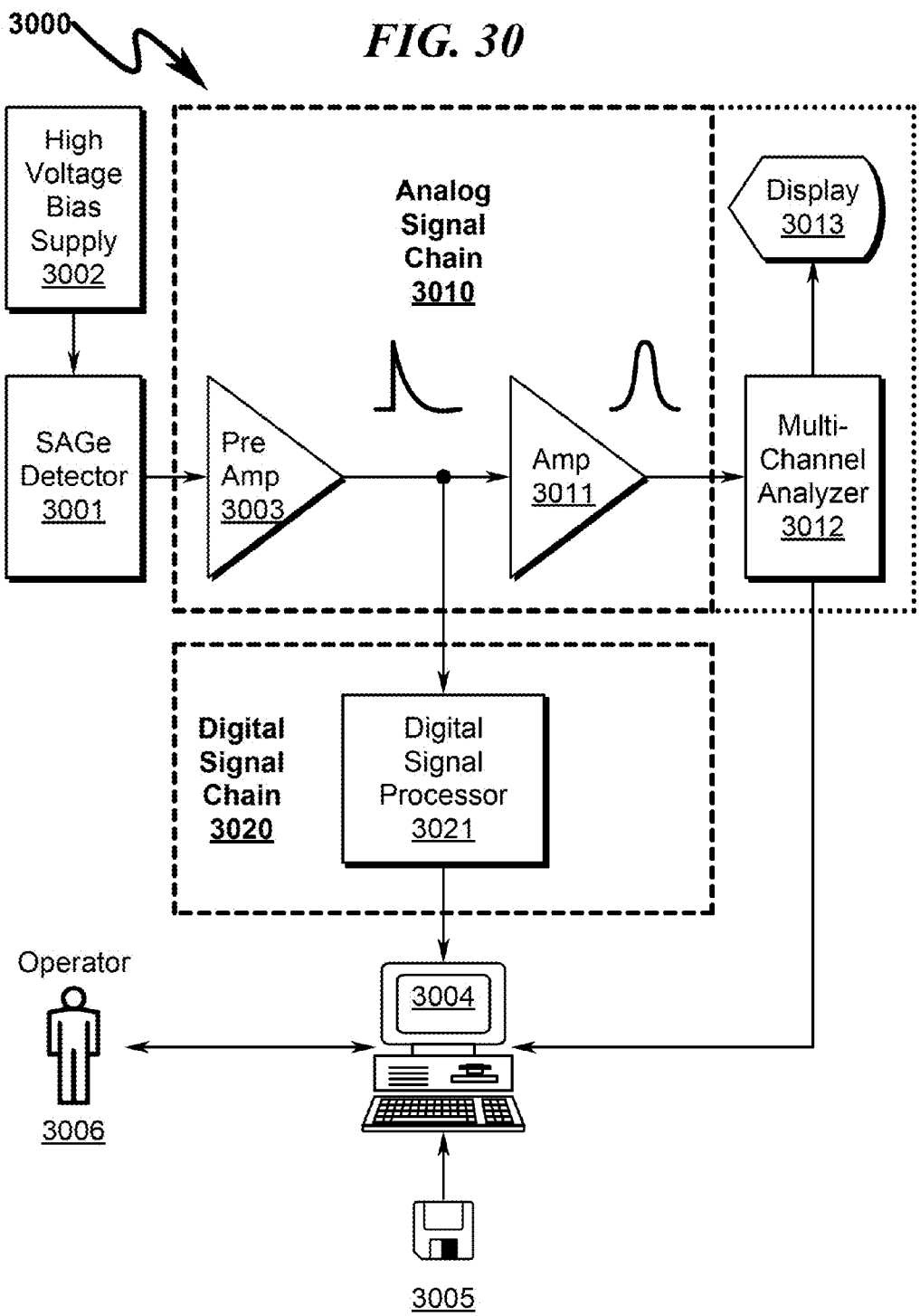
FIG. 30 illustrates exemplary schematics of radiation detector analog/digital processing chains useful in implementing a number of preferred invention embodiments.
Figure 34:
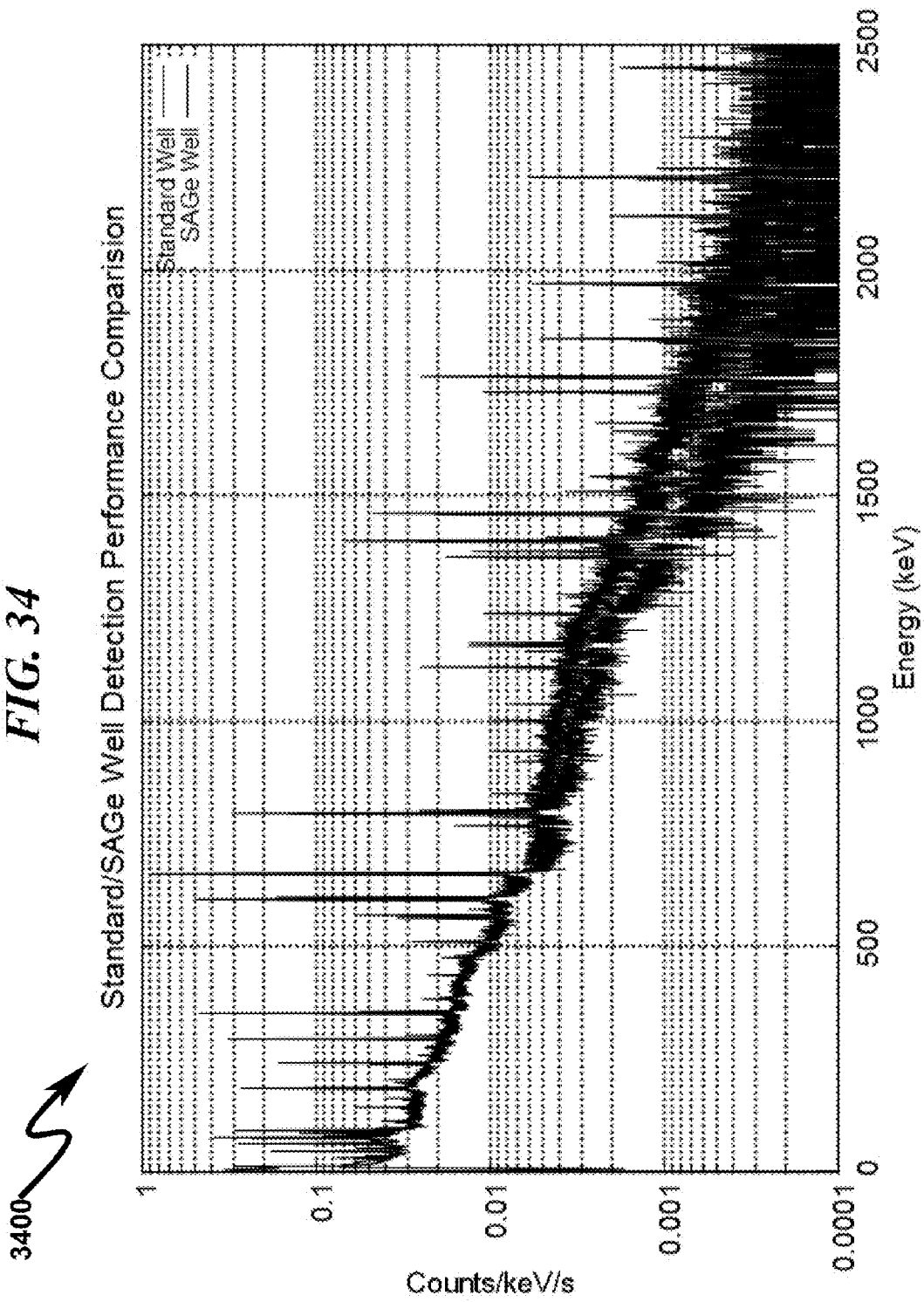
FIG. 34-48 illustrates measured experimental detection performance data comparing standard well measurement characteristics with that of an exemplary SAGe well embodiment of the present invention, both with 28 mm diameter end cap wells.
Figure 48:
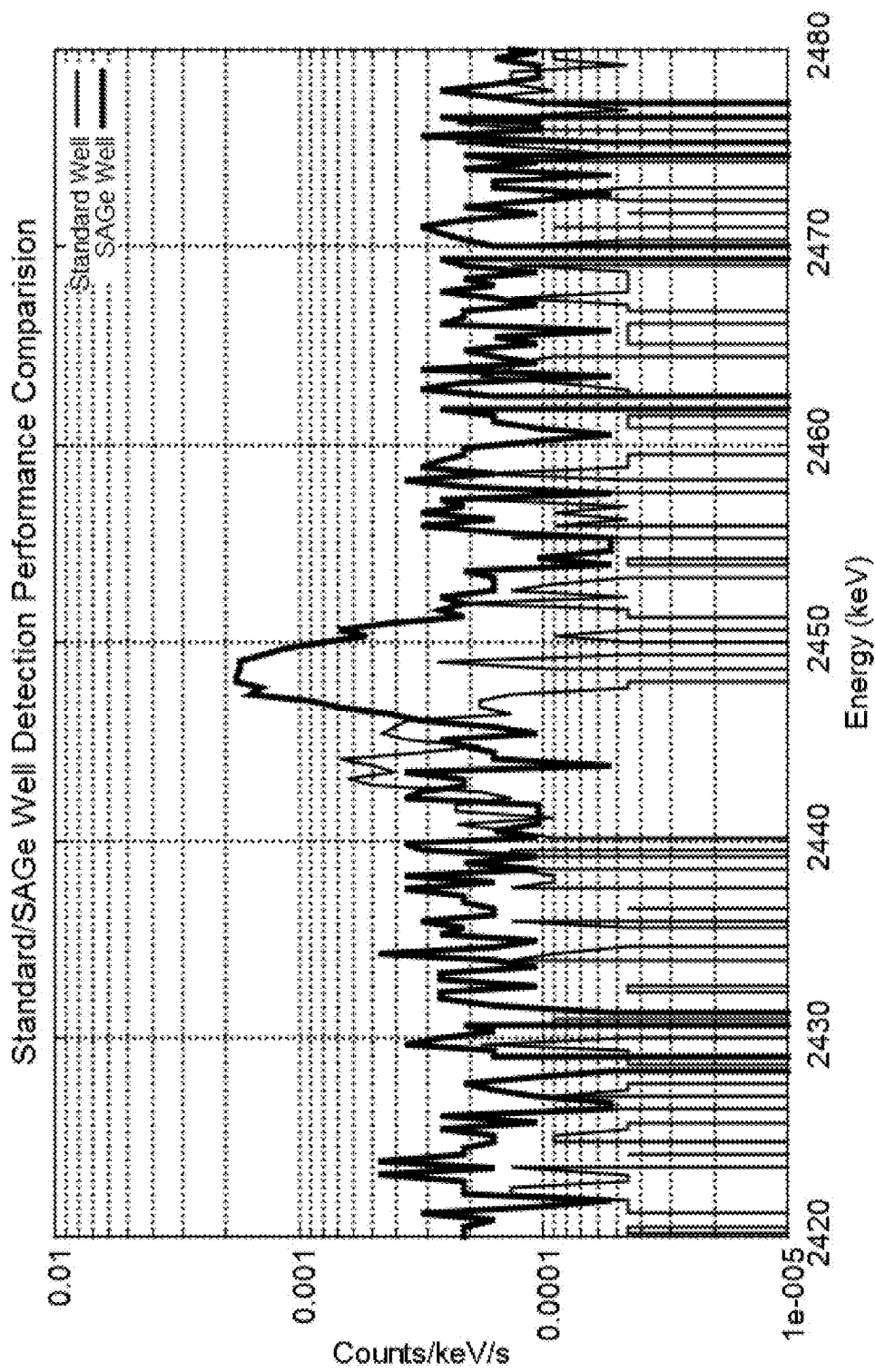

While many forms of signal processing chains are anticipated to be useful within the present invention application context, exemplary signal processing schematics incorporating analog (3010) and digital (3020) processing variations are provided in FIG. 30 (3000) as illustrative examples of typical signal processing chains that may be used with the SAGe well radiation detector described herein. Within this context the following statements are generally applicable:

- The preamplifier (3003) is generally attached to or built into the detector assembly (3001) as generally illustrated in FIG. 29 (2900).
- The amplifier (3011) provides signal gain and shaping to improve the signal-to-noise ratio.
- For analog signal chain configurations (3010), the MCA (multi-channel analyzer) (3012) comprises an ADC (analog-to-digital converter) and histogramming memory and a display (3013) that shows the acquired spectrum counts (see exemplary graphs detailed in FIG. 34 (3400)-FIG. 48 (4800).
- For digital signal chain configurations (3020), the DSP (digital signal processor) (3021) comprises a fast ADC which digitizes the analog input signal and uses digital filtering algorithms to optimize the signal-to-noise ratio. The resultant data is stored and accessed by a computer (3004) (running under control of software read from a computer readable medium (3005)) which displays spectra and processed the data for qualitative and quantitative analysis.
- For radioisotope identification and quantitative analysis a computer system (3004) is usually included that incorporates gamma analysis software read from a computer readable medium (3005), and provides for an operator (3006) control interface.

One skilled in the art will recognize that mixed analog/digital signal processing chains are also possible and that the depicted signal chains may be augmented within a wide range without departing from the spirit of the invention.

Exemplary Detector Circuitry (3100)

While many forms of detector circuitry are anticipated to be useful within the present invention application context, exemplary detector schematics incorporating AC-coupled (3110) and DC-coupled (3120) variations are provided in FIG. 31 (3100) as illustrative examples of typical detector circuits that may be used with the SAGe well radiation detector described herein. One skilled in the art will recognize that many other types of detector circuits are possible and that these circuits may be augmented in a wide variety of applications. The present invention anticipates that these detector circuits may be implemented as standalone component assemblies within the vacuum chamber as generally depicted in FIG. 29 (2900), or in some embodiments integrated within one or more layers of the EBR on the backside of the PGEV body.

Preferred Exemplary Method Embodiment (3200)

Figure 32:
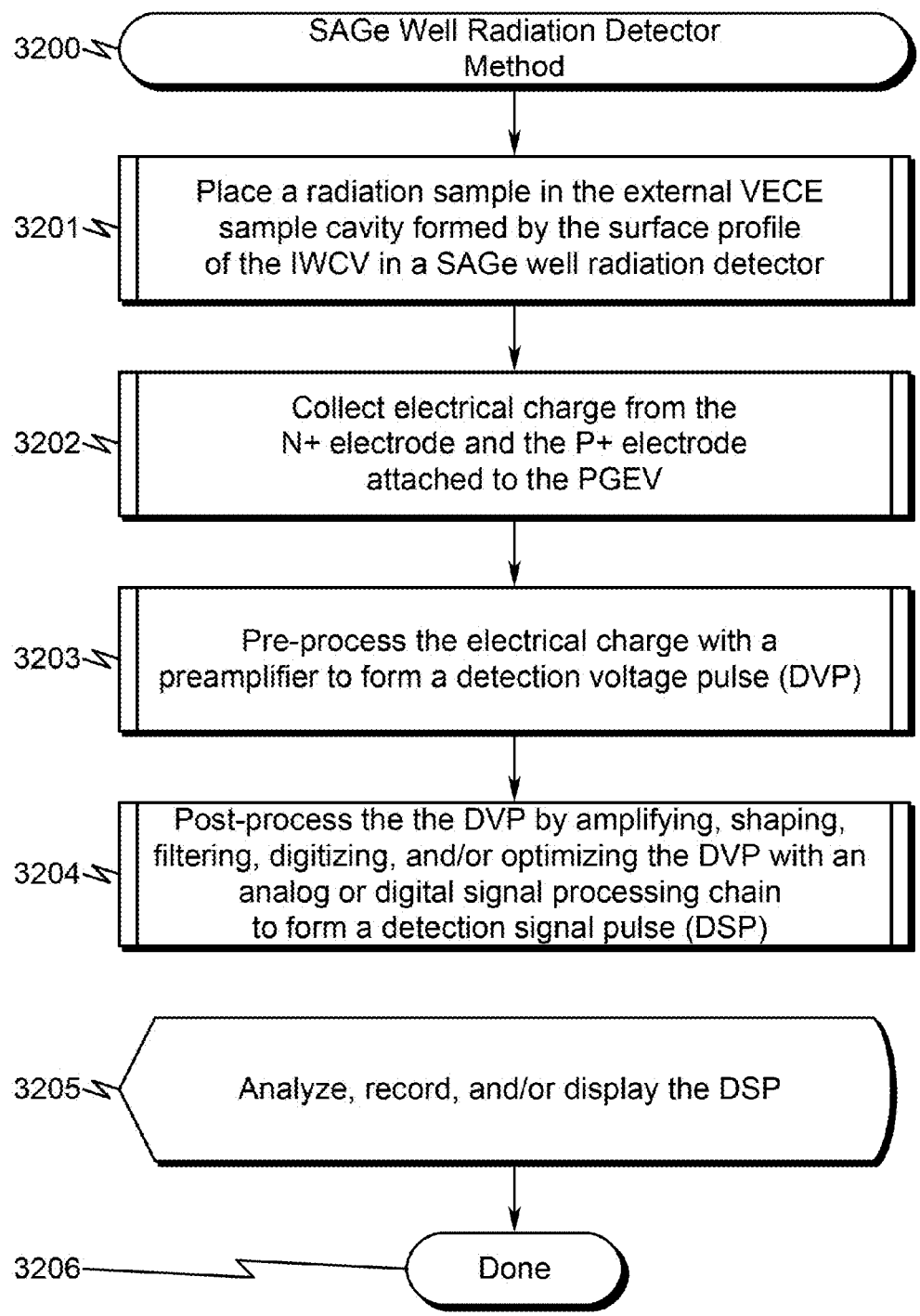
FIG. 32 illustrates a generalized flowchart depicting steps associated with a preferred exemplary invention method.

As generally seen in the flowchart of FIG. 32 (3200), the Present invention SAGe well radiation detector method used in conjunction with the system embodiments described herein may be generally described in terms of the following steps:

(1) placing a radiation sample in the external VECE sample cavity formed by the surface profile of the IWCV in a SAGe well radiation detector (3201);
(2) collecting electrical charge from the N+ electrode and the P+ electrode attached to the PGEV (3202);
(3) pre-processing the electrical charge with a preamplifier to form a detection voltage pulse (DVP) (3203);
(4) post-processing the DVP by amplifying, shaping, filtering, digitizing, and/or optimizing the DVP with an analog and/or digital signal processing chain to form a detection signal pulse (DSP) (3204); and
(5) analyzing, recording, and/or displaying the DSP (3205).

Note that this method may incorporate displays, audible alarms, or other type of human and/or computer interfaces in conjunction with data logging and/or mathematical analysis of the collected radiation detector information. This general method summary may be augmented by the various elements described herein to produce a wide variety of invention embodiments consistent with this overall design description.

Exemplary Performance Comparison (3300)-(4800)

Figure 33:
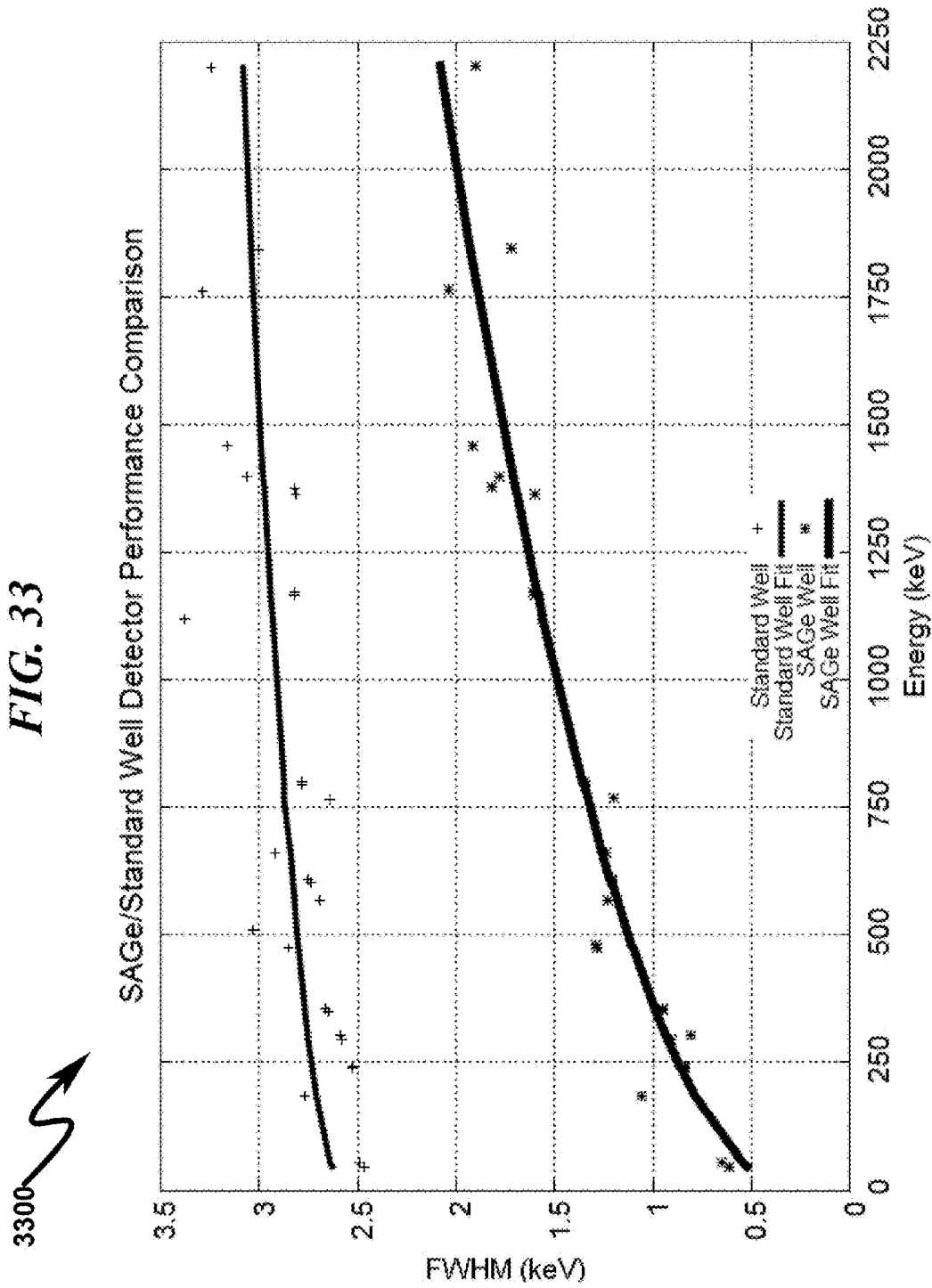
FIG. 33 illustrates exemplary SAGe well performance data compared to conventional well detectors.
Figure 35:
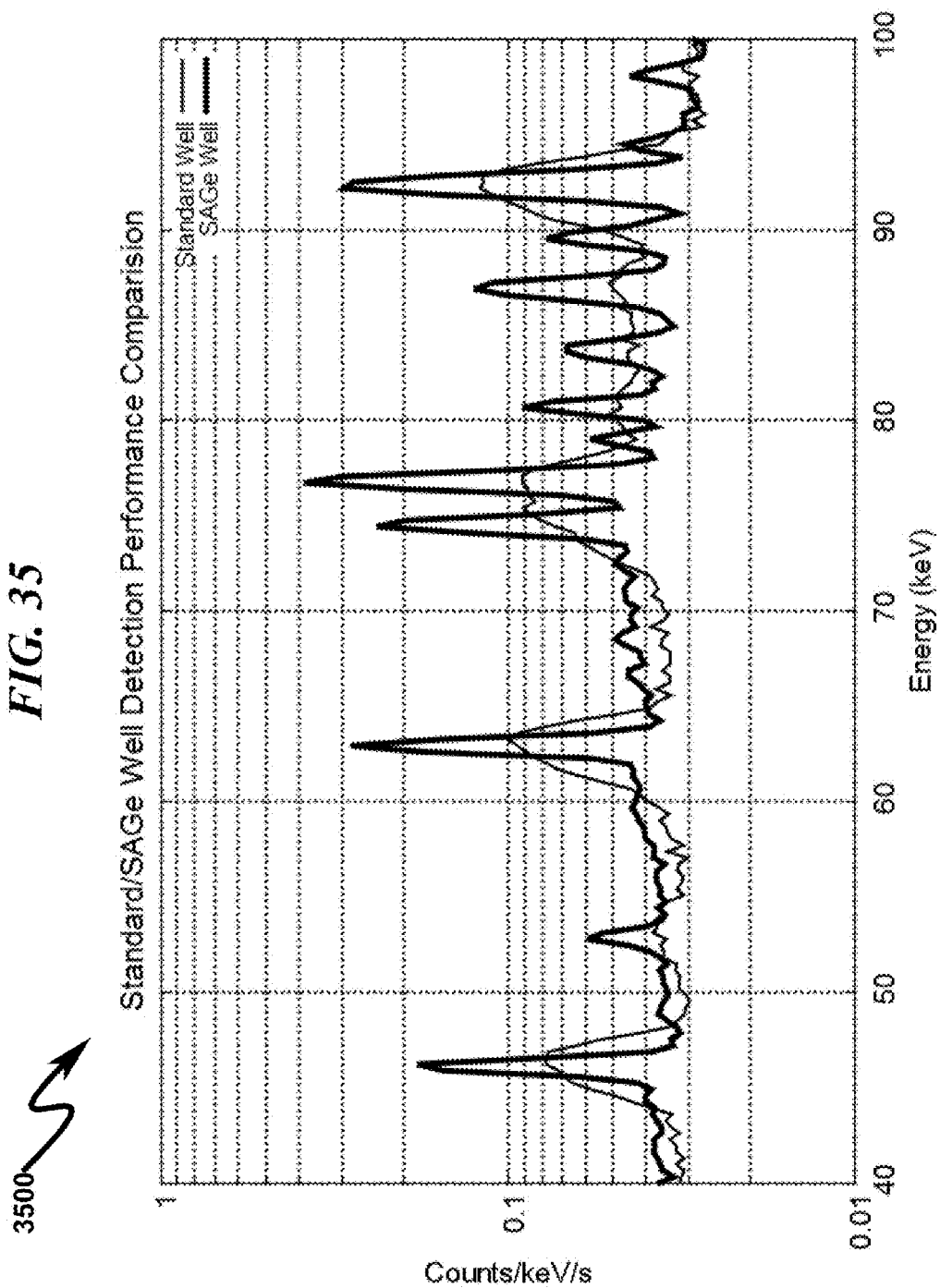
Figure 36:
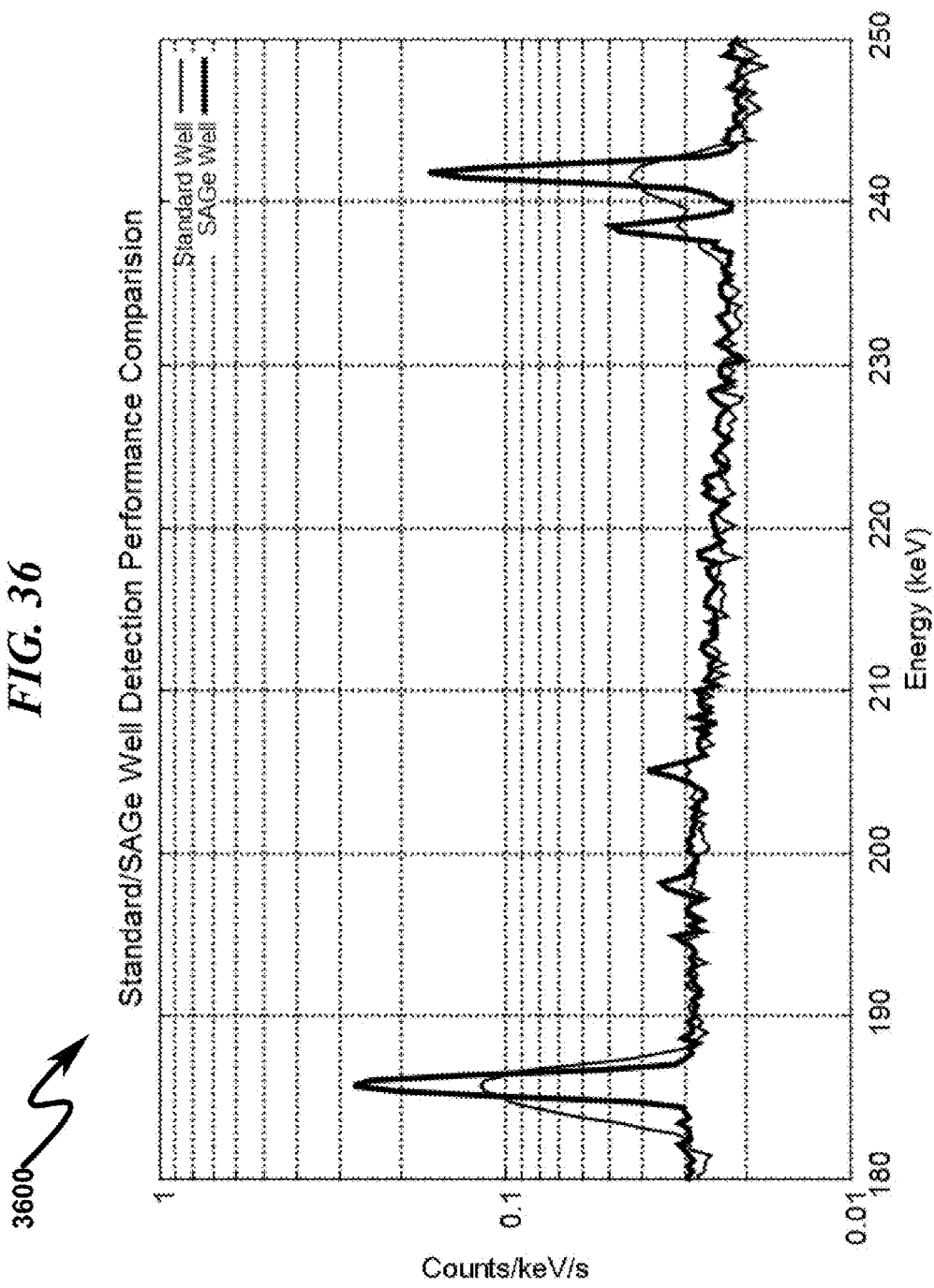
Figure 37:
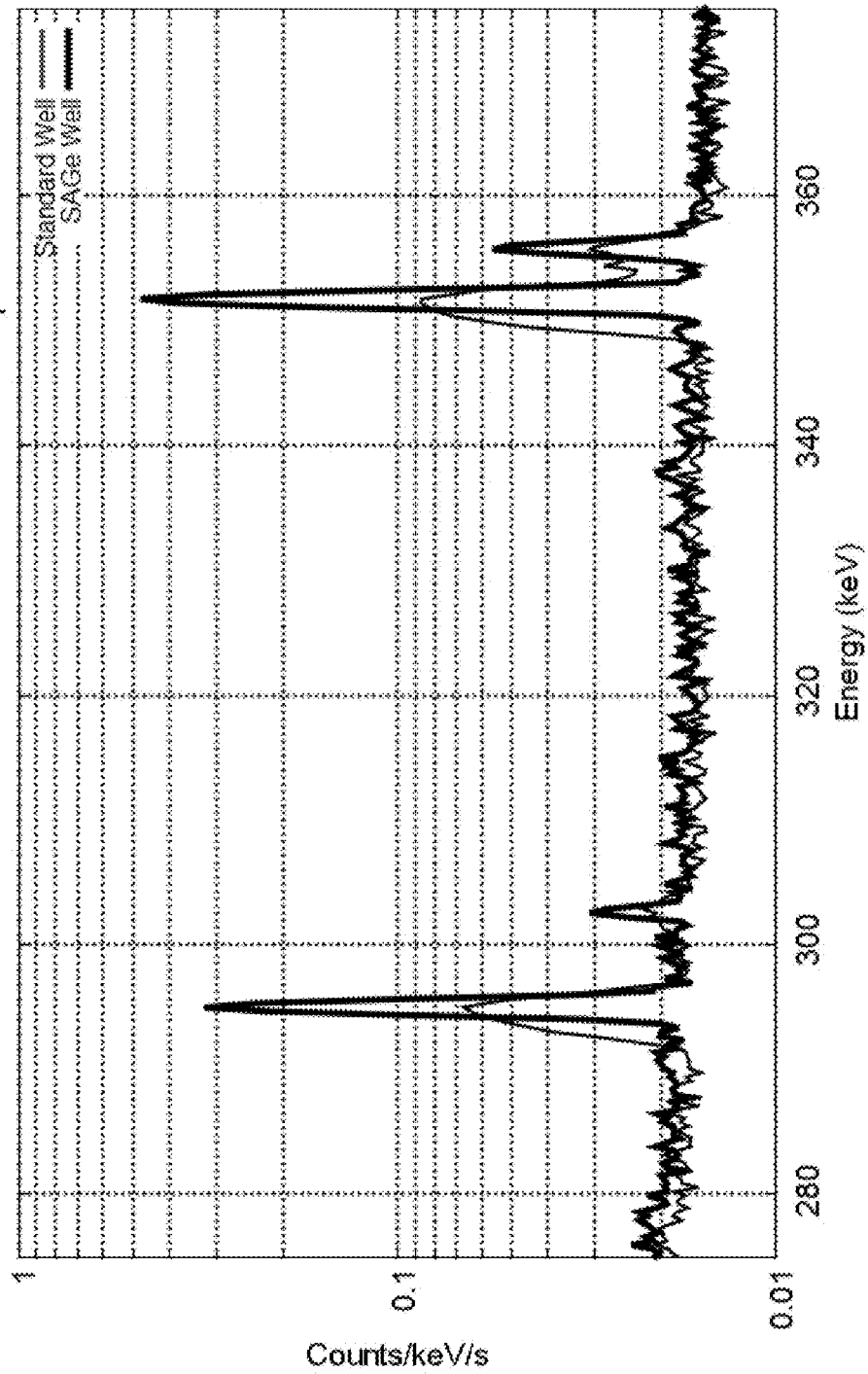
Figure 38:
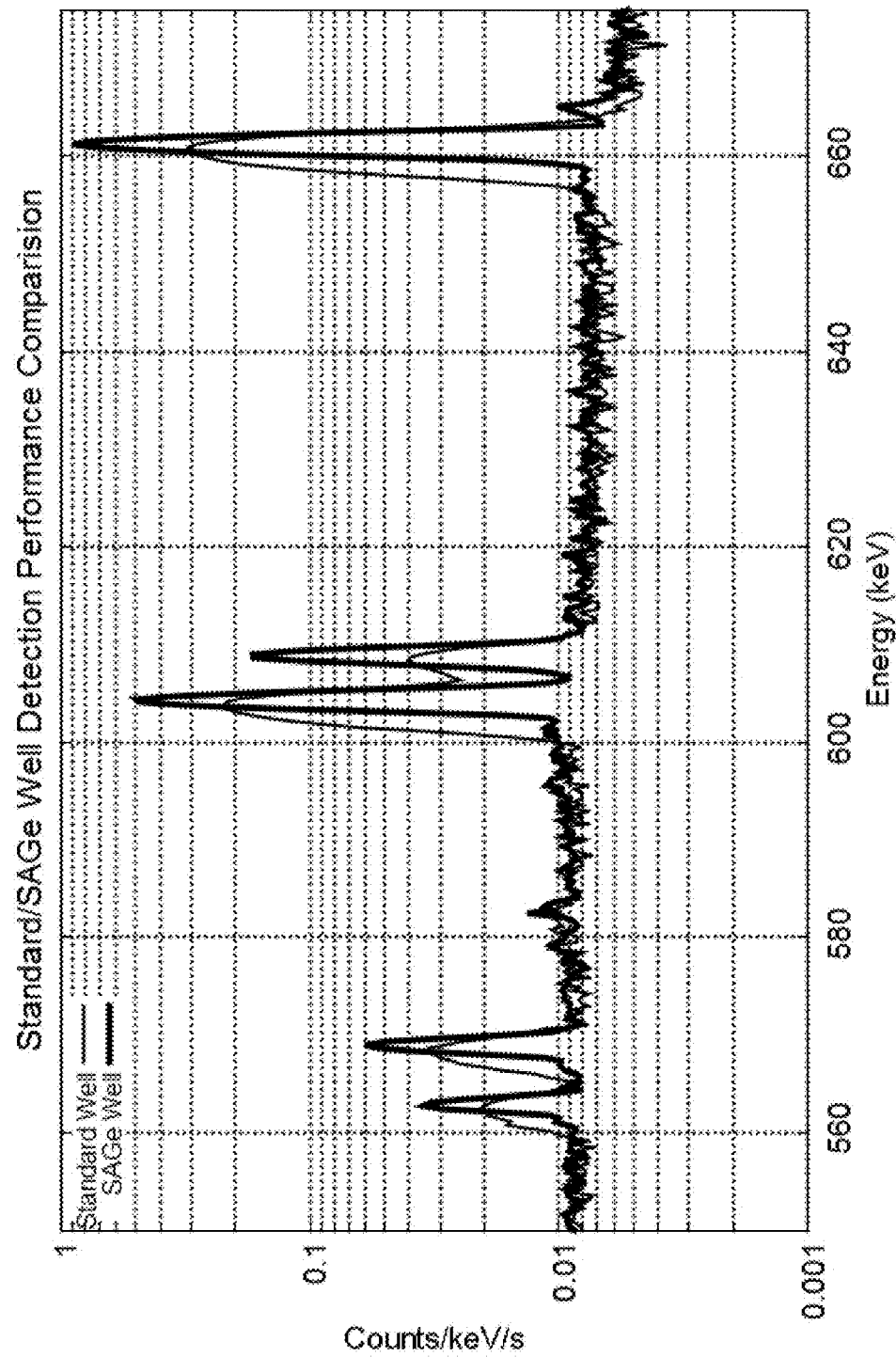
Figure 39:
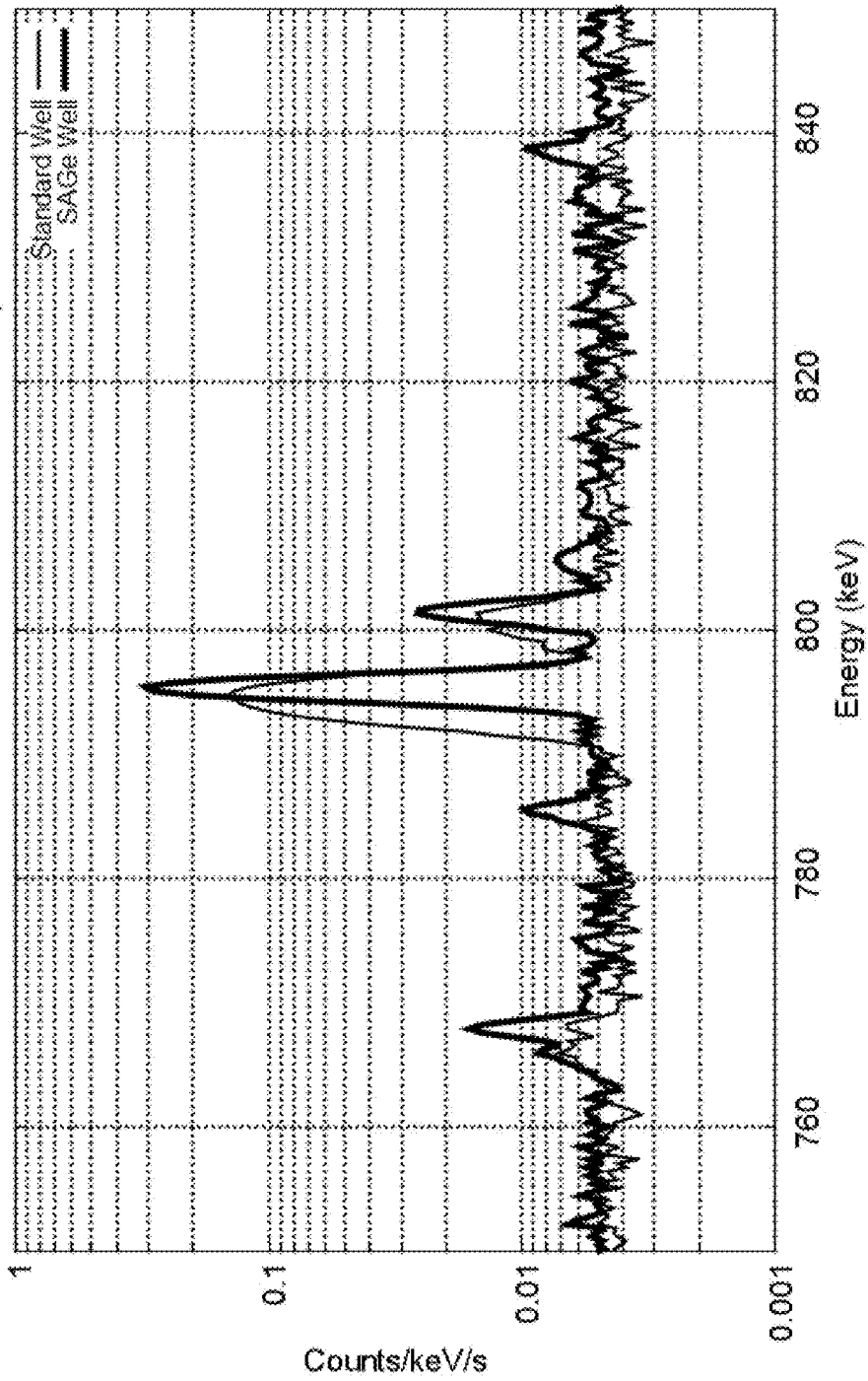
Figure 40:
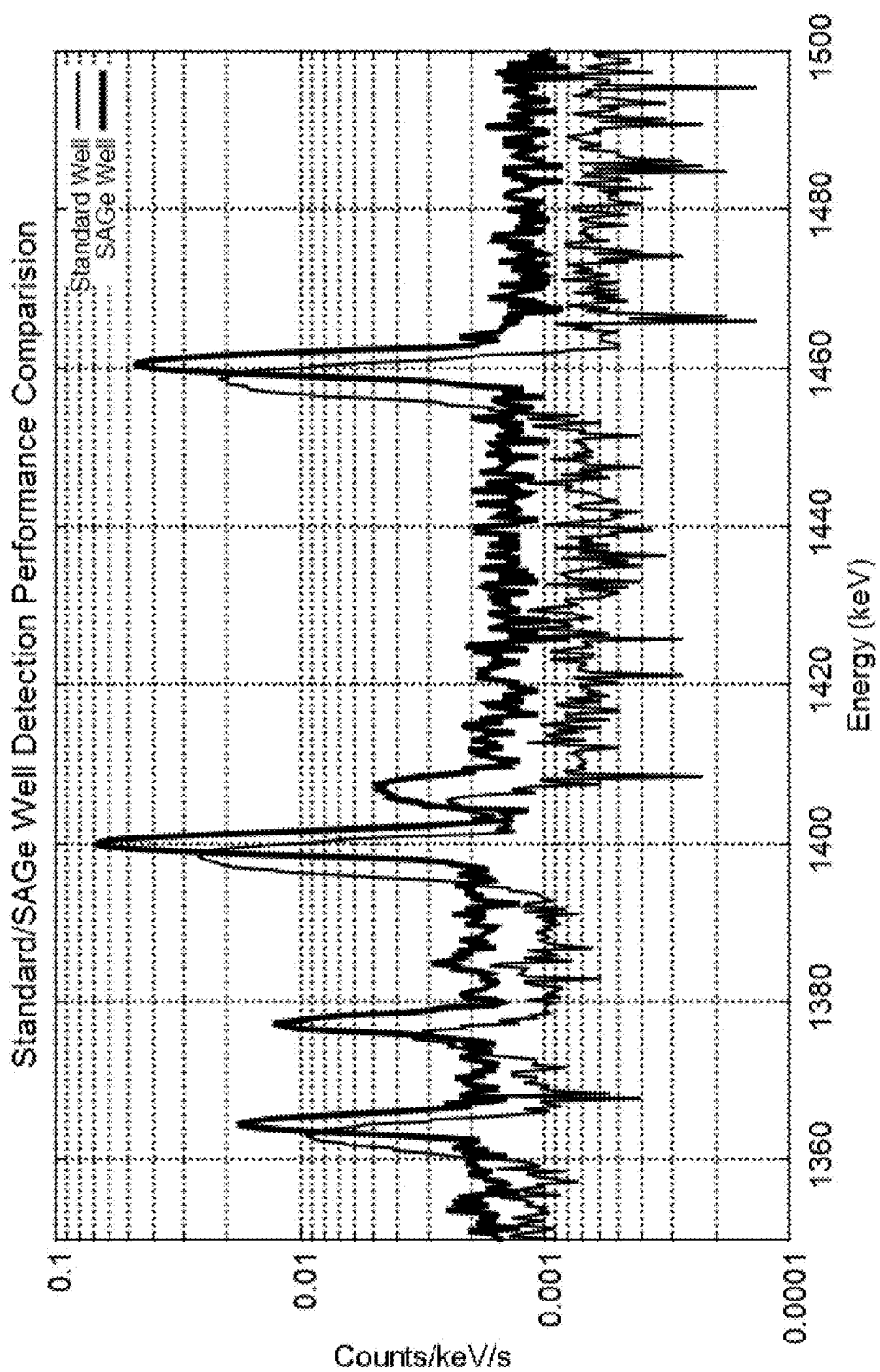
Figure 41:
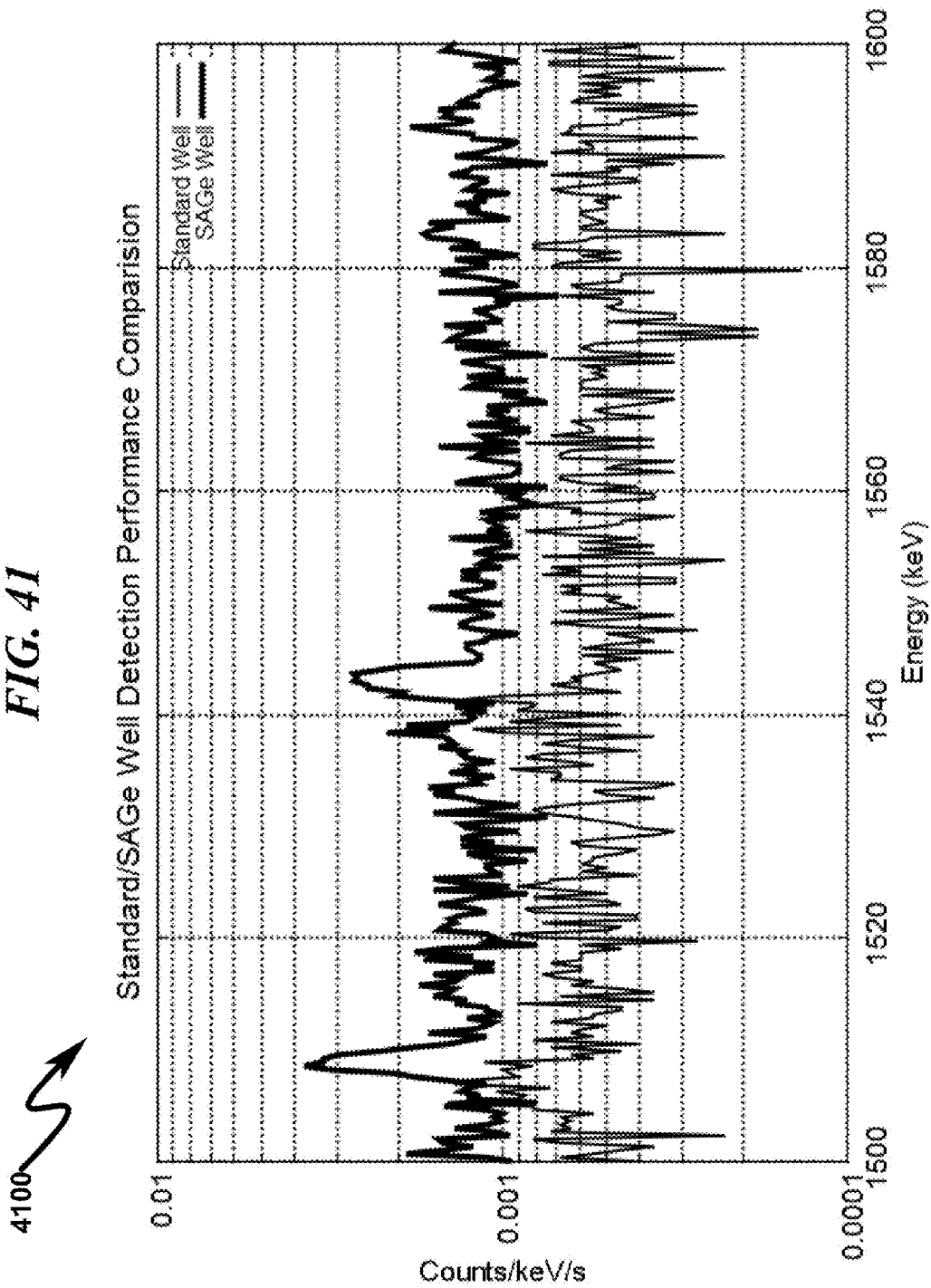
Figure 42:
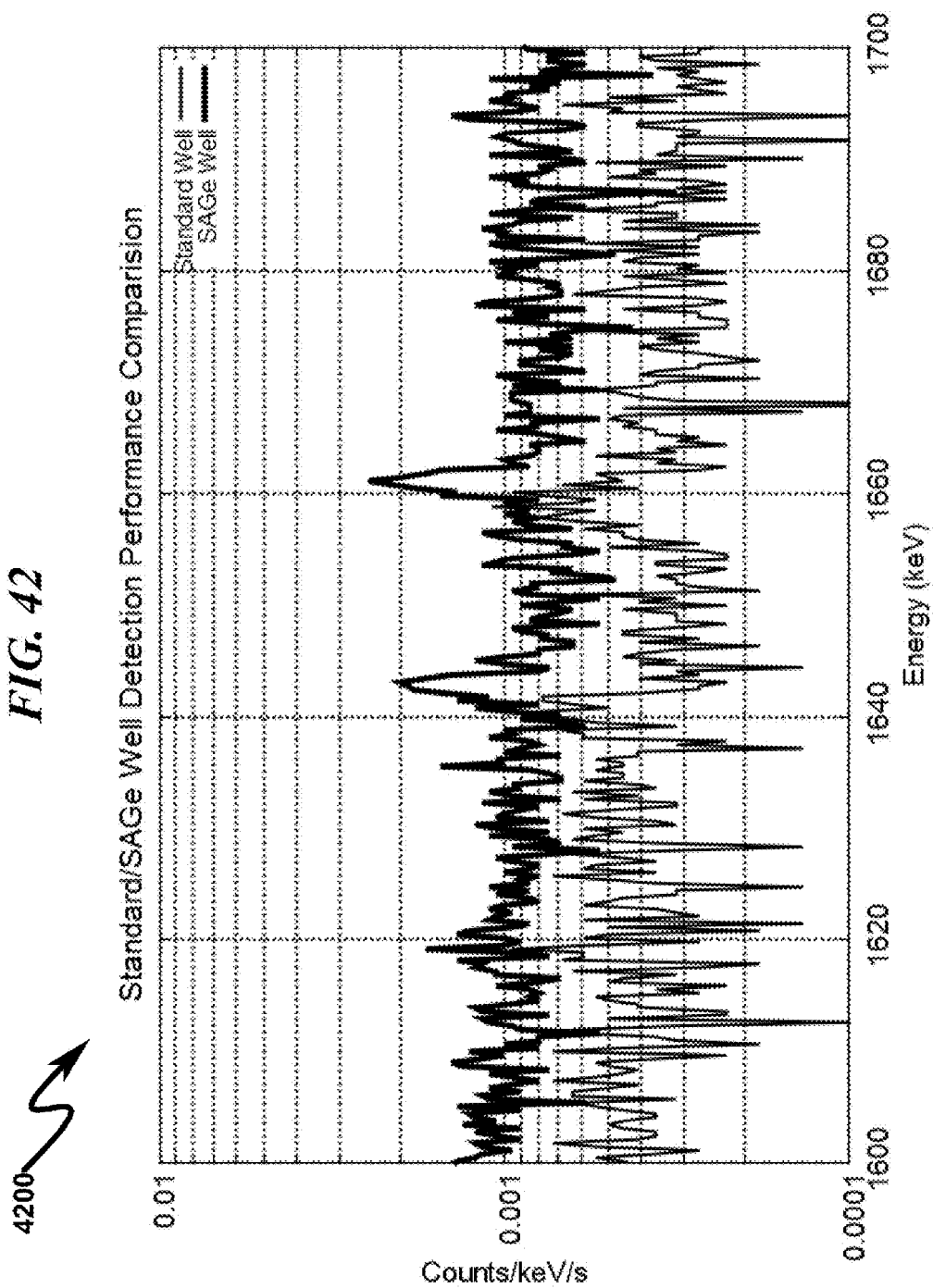
Figure 43:
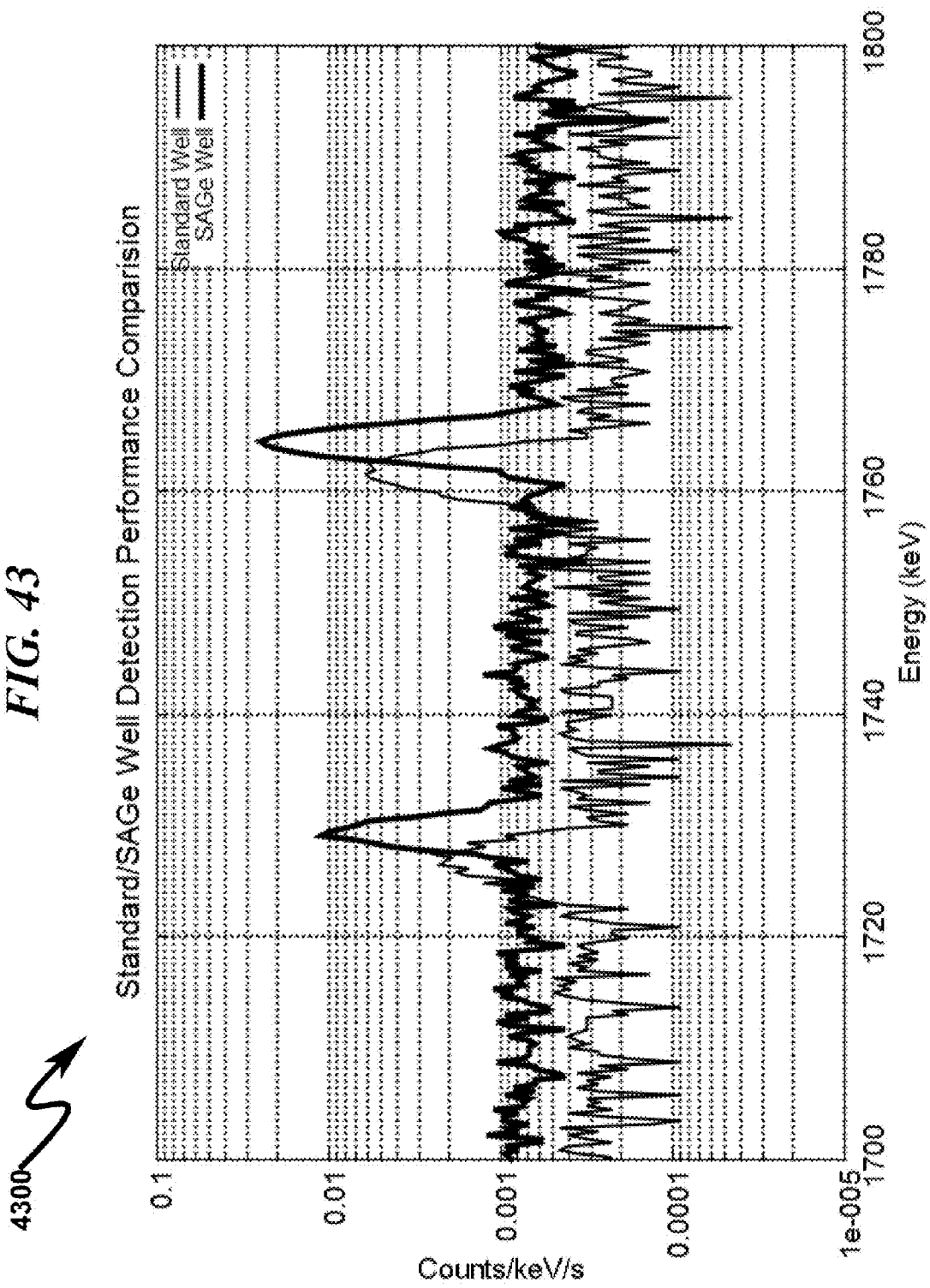
Figure 44:
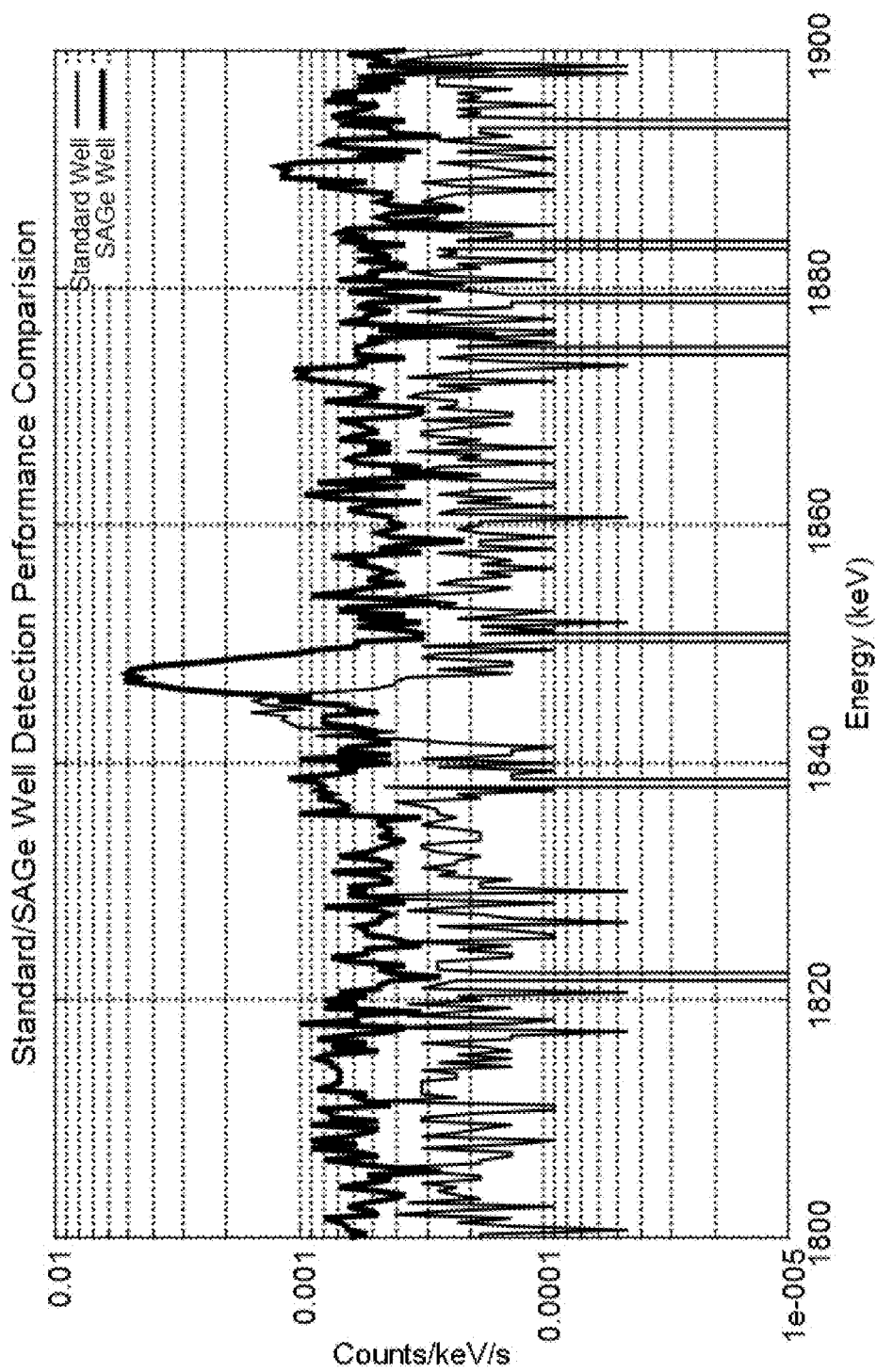
Figure 45:
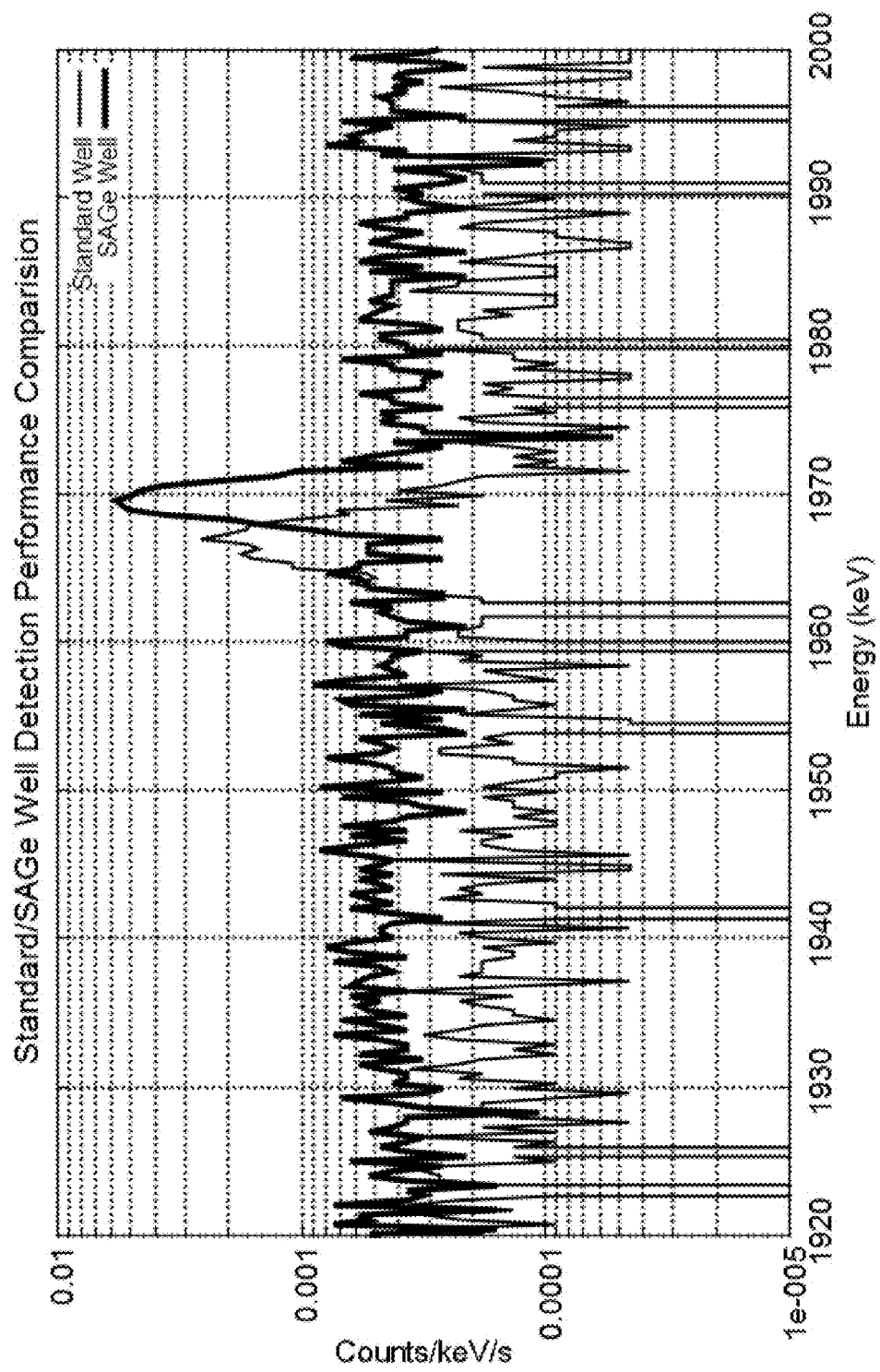
Figure 46:
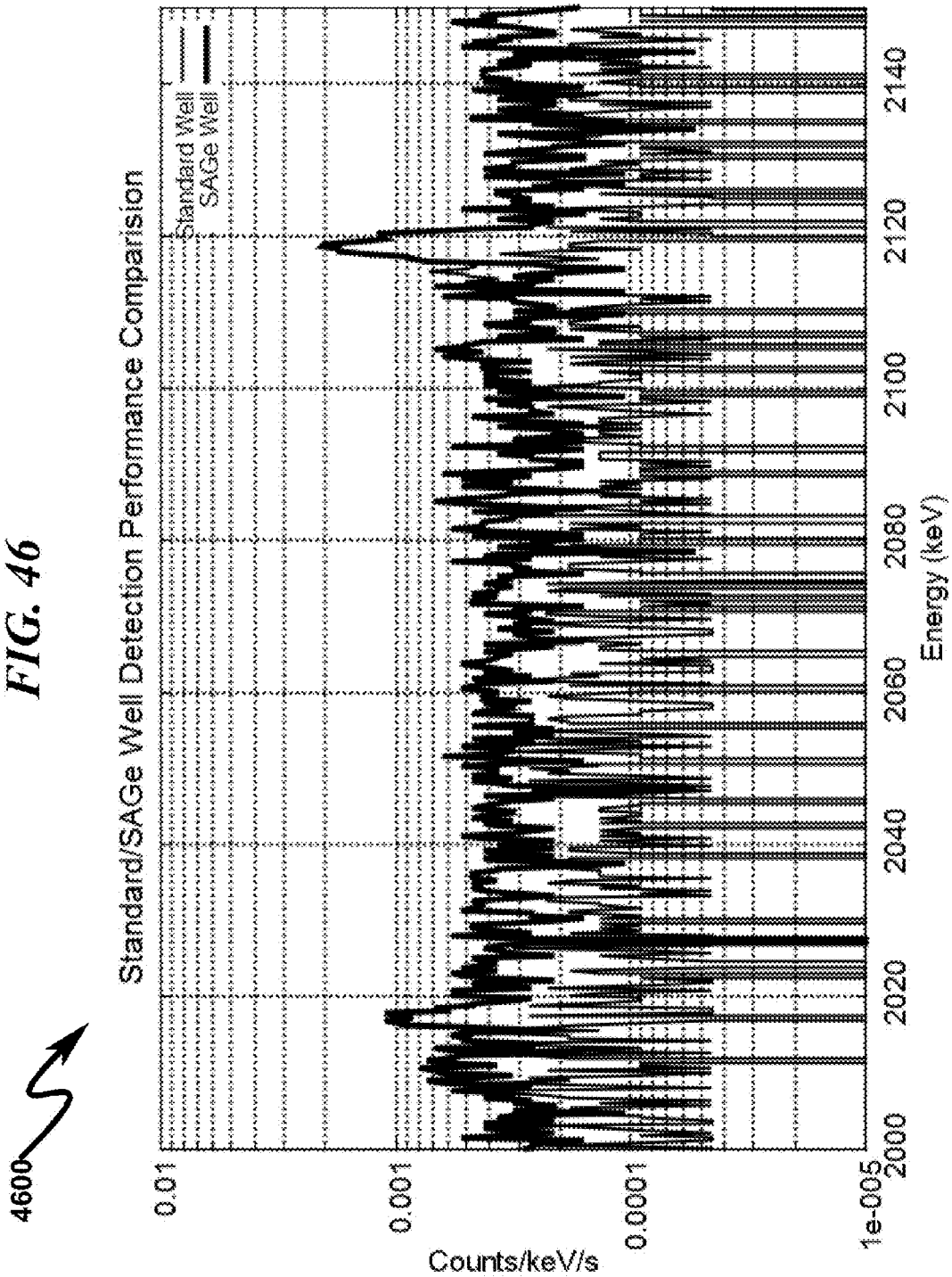
Figure 47:
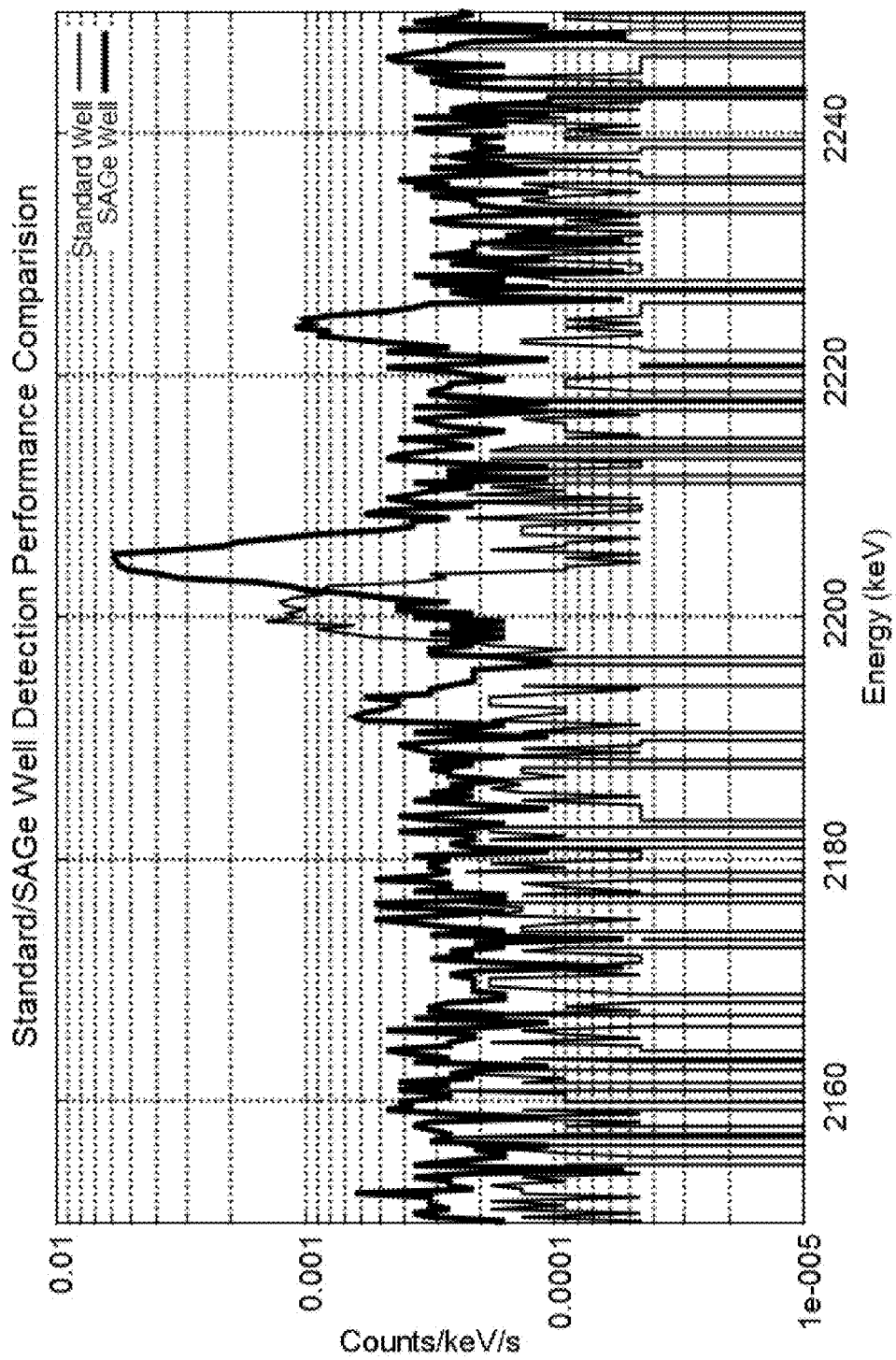

Performance comparisons between a standard well detector and the SAGe embodiment of the present invention are generally illustrated in the FWHM energy comparison graph of FIG. 33 (3300) and the spectral detection graphs of FIG. 34 (3400)-FIG. 48 (4800). Note that FIG. 34 (3400) is a general overlay graph comparing the conventional well with the SAGe well using an expanded X-axis. In this scaling it is not possible to discern differences between the two well types as the data is too dense and overlaps. However, the detail graphs of FIG. 35 (3500)-FIG. 48 (4800) are plotted with narrower X-axis ranges which clearly show the improved detection performance of the SAGe well detector as compared to the prior art standard well. Because both detectors have unusually large end cap well diameters of 28 mm, the performance benefits of the SAGe well detector can be clearly observed even at energies as high as several MeV. In these circumstances the SAGe configuration is especially well performing in comparison to the standard well configuration.

Preferred Embodiment System Summary

The present invention preferred exemplary system embodiment anticipates a wide variety of variations in the basic theme of construction, but can be generalized as a SAGe well radiation detector (SAGe well) system comprising:
(a) P-type bulk germanium volume (PGEV);
(b) N+ electrode;
(c) P+ electrode; and
(d) vacuum encapsulating chamber enclosure (VECE);
wherein
the PGEV further comprises an internal surface and an external surface;
the external surface comprises an outer surface, an external base region (EBR), and a cavity entry region (CER);
the PGEV further comprises an internal well cavity void (IWCV), the surface of the IWCV forming the internal surface;
the P+ electrode is formed on the EBR and surrounded by an isolation region;
the N+ electrode is formed on the internal surface, the outer surface, the CER, and the EBR outside of the isolation region; and
the VECE encloses the PGEV and conforms to the surface profile of the IWCV.

This general system summary may be augmented by the various elements described herein to produce a wide variety of invention embodiments consistent with this overall design description.

Preferred Embodiment Method Summary

The present invention preferred exemplary method embodiment anticipates a wide variety of variations in the basic theme of implementation, but can be generalized as a SAGe well radiation detector method, the method operating in conjunction with a SAGe well radiation detector system, the system comprising:
(a) P-type bulk germanium volume (PGEV);
(b) N+ electrode;
(c) P+ electrode; and
(d) vacuum encapsulating chamber enclosure (VECE);
wherein
the PGEV further comprises an internal surface and an external surface;
the external surface comprises an outer surface, an external base region (EBR), and a cavity entry region (CER);
the PGEV further comprises an internal well cavity void (IWCV), the surface of the IWCV forming the internal surface;
the P+ electrode is formed on the EBR and surrounded by an isolation region;
the N+ electrode is formed on the internal surface, the outer surface, the CER, and the EBR outside of the isolation region; and
the VECE encloses the PGEV and conforms to the surface profile of the IWCV;
wherein the method comprises the steps of:
(1) placing a radiation sample in the external VECE sample cavity formed by the surface profile of the IWCV;
(2) collecting electrical charge from the N+ electrode and the P+ electrode attached to the PGEV;
(3) pre-processing the electrical charge with a preamplifier to form a detection voltage pulse (DVP);
(4) post-processing the DVP by amplifying, shaping, filtering, digitizing, and optimizing the DVP with an analog and/or digital signal processing chain to form a detection signal pulse (DSP); and
(5) analyzing, recording, and/or displaying the DSP.

Note that this method may incorporate displays, audible alarms, or other type of human and/or computer interfaces in conjunction with data logging and/or mathematical analysis of the collected radiation detection information. This general method summary may be augmented by the various elements described herein to produce a wide variety of invention embodiments consistent with this overall design description.

System/Method Variations

The present invention anticipates a wide variety of variations in the basic theme of construction. The examples presented previously do not represent the entire scope of possible usages. They are meant to cite a few of the almost limitless possibilities.

This basic system and method may be augmented with a variety of ancillary embodiments, including but not limited to:

An embodiment wherein the outer surface of the PGEV forms a cylinder.
An embodiment wherein a portion of the outer surface of the PGEV forms a frustum.

An embodiment wherein a portion of the outer surface of the PGEV forms a conic frustum.

An embodiment wherein the IWCV forms a cylindrical void within the CER of the PGEV.

An embodiment wherein the IWCV forms a frustum void within the CER of the PGEV.

An embodiment wherein the IWCV forms a conic frustum void within the CER of the PGEV.

An embodiment wherein the EBR further comprises a preamplifier having inputs electrically coupled to the P+ electrode and the N+ electrode.

An embodiment wherein the isolation region comprises an isolation groove physically separating the N+ electrode and the P+ electrode on the EBR wherein the isolation groove comprises a physical void in the PGEV.

An embodiment wherein the isolation region comprises an intrinsic region physically separating the N+ electrode and the P+ electrode on the EBR.

An embodiment wherein the N+ electrode and the P+ electrode comprise electrical contacts selected from a group consisting of: implanted donor species; implanted acceptor species; diffused donor species; diffused acceptor species; surface barrier contact; amorphous semiconductor contact; metal oxide semiconductor (MOS) contact; metal insulator semiconductor (MIS) contact; Schottky barrier contacts; rectifying semiconductor contact; blocking semiconductor contact; and ohmic semiconductor contact.

An embodiment wherein the P+ electrode comprises an annular ring centered on the EBR.

An embodiment wherein the P+ electrode comprises an annular ring centered on the EBR and surrounding an isolated cathode contact in the center of the EBR.

An embodiment wherein the P+ electrode comprises a subdivided disc centered on the EBR forming a plurality of anodes with each anode of the plurality electrically coupled to a separate preamplifier.

An embodiment wherein the P+ electrode comprises a annular ring centered on the EBR forming a plurality of anodes with each anode of the plurality electrically coupled to a separate preamplifier.

An embodiment wherein the P+ electrode comprises a subdivided disc centered on the EBR and surrounding an isolated cathode contact in the center of the EBR forming a plurality of anodes with each anode of the plurality electrically coupled to a separate preamplifier.

An embodiment wherein the P+ electrode comprises a annular ring centered on the EBR and surrounding an isolated cathode contact in the center of the EBR forming a plurality of anodes with each anode of the plurality electrically coupled to a separate preamplifier.

An embodiment wherein the P+ electrode comprises an annular ring on the EBR, the annular ring surrounding an N+ cathode region in the center of the EBR.

An embodiment wherein the P+ electrode comprises an annular ring on the EBR, the annular ring surrounding a void on the surface of the EBR, the void surrounding an N+ cathode region in the center of the EBR.

An embodiment wherein the P+ electrode comprises a plurality of P+ electrodes on the EBR electrically coupled to separate preamplifiers configured to analyze electrical charge collected from the P+ electrode plurality and provide information concerning the location of a radiation source irradiation the SAGe well.

One skilled in the art will recognize that other embodiments are possible based on combinations of elements taught within the above invention description.

Generalized Computer Usable Medium

In various alternate embodiments, the present invention may be implemented as a computer program product for use with a computerized computing system. Those skilled in the art will readily appreciate that programs defining the functions defined by the present invention can be written in any appropriate programming language and delivered to a computer in many forms, including but not limited to: (a) information permanently stored on non-writeable storage media (e.g., read-only memory devices such as ROMs or CD-ROM disks); (b) information alterably stored on writeable storage media (e.g., floppy disks and hard drives); and/or (c) information conveyed to a computer through communication media, such as a local area network, a telephone network, or a public network such as the Internet. When carrying computer readable instructions that implement the present invention methods, such computer readable media represent alternate embodiments of the present invention.

As generally illustrated herein, the present invention system embodiments can incorporate a variety of computer readable media that comprise computer usable medium having computer readable code means embodied therein. One skilled in the art will recognize that the software associated with the various processes described herein can be embodied in a wide variety of computer accessible media from which the software is loaded and activated. Pursuant to In re Beauregard, 35 USPQ2d 1383 (U.S. Pat. No. 5,710,578), the present invention anticipates and includes this type of computer readable media within the scope of the invention. Pursuant to In re Nuijten, 500 F.3d 1346 (Fed. Cir. 2007) (U.S. patent application Ser. No. 09/211,928), the present invention scope is limited to computer readable media wherein the media is both tangible and non-transitory.

CONCLUSION

A small anode germanium well (SAGe well) radiation detector system/method providing for low capacitance, short signal leads, small area bottom-oriented signal contacts, enhanced performance independent of well diameter, and ability to determine radiation directionality has been disclosed. The system incorporates a P-type bulk germanium volume (PGEV) having an internal well cavity void (IWCV). The external PGEV and IWCV surfaces incorporate an N+ electrode except for the PGEV external base region (EBR) in which a P+ contact electrode is fabricated within an isolation region. The PGEV structure is further encapsulated to permit operation at cryogenic temperatures. Electrical connection to the SAGe well is accomplished by bonding or mechanical contacting to the P+ contact electrode and the N+ electrode. The EBR of the PGEV may incorporate an integrated preamplifier inside the vacuum housing to minimize the noise and gain change due to ambient temperature variation.

What is claimed is:

1. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);

said PGEV further comprises an internal well cavity void (IWCV), the surface of said IWCV forming said internal surface;

said P+ electrode is formed on said EBR and surrounded by an isolation region;

said P+ electrode forms a small anode connection to said PGEV, said small anode connection having a surface area less than a surface area of said internal surface;

said N+ electrode is formed on said internal surface, said outer surface, said CER, and said EBR outside of said isolation region;

said VECE encloses said PGEV and conforms to the surface profile of said IWCV; and said P+ electrode comprises an annular ring centered on said EBR and surrounding an isolated cathode contact in the center of said EBR.

2. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises a subdivided disc centered on said EBR and surrounding an isolated cathode contact in the center of said EBR forming a plurality of anodes with each anode of said plurality electrically coupled to a separate preamplifier.

3. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises an annular ring centered on said EBR and surrounding an isolated cathode contact in the center of said EBR forming a plurality of anodes with each anode of said plurality electrically coupled to a separate preamplifier.

4. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises an annular ring on said EBR, said annular ring surrounding an N+ cathode region in the center of said EBR.

5. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises an annular ring on said EBR, said annular ring surrounding an isolation groove on the surface of said EBR, said isolation groove surrounding an N+ cathode region in the center of said EBR.

6. A small anode germanium (SAGe well) radiation detector method, said method operating in conjunction with a SAGe well radiation detector system, said system comprising:
(a) P-type bulk germanium volume (PGEV);
(b) N+ electrode;
(c) P+ electrode; and
(d) vacuum encapsulating chamber enclosure (VECE);

wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises an annular ring centered on said EBR and surrounding an isolated cathode contact in the center of said EBR;
wherein said method comprises the steps of:
(1) placing a radiation sample in the external VECE sample cavity formed by the surface profile of the IWCV in said SAGe well radiation detector;
(2) collecting electrical charge from the N+ electrode and the P+ electrode attached to the PGEV;
(3) pre-processing the electrical charge with a preamplifier to form a detection voltage pulse (DVP);
(4) post-processing the said DVP by amplifying, shaping, filtering, digitizing, and optimizing said DVP with a signal processing chain to form a detection signal pulse (DSP); and
(5) analyzing, recording, and displaying said DSP.

7. A small anode germanium (SAGe well) radiation detector method, said method operating in conjunction with a SAGe well radiation detector system, said system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises a subdivided disc centered on said EBR and surrounding an isolated cathode contact in the center of said EBR forming a plurality of anodes with each anode of said plurality electrically coupled to a separate preamplifier;
wherein said method comprises the steps of:
(1) placing a radiation sample in the external VECE sample cavity formed by the surface profile of the IWCV in said SAGe well radiation detector;
(2) collecting electrical charge from the N+ electrode and the P+ electrode attached to the PGEV;
(3) pre-processing the electrical charge with a preamplifier to form a detection voltage pulse (DVP);
(4) post-processing the said DVP by amplifying, shaping, filtering, digitizing, and optimizing said DVP with a signal processing chain to form a detection signal pulse (DSP); and
(5) analyzing, recording, and displaying said DSP.

8. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);
said PGEV further comprises an internal well cavity void (IWCV), the surface of said IWCV forming said internal surface;
said P+ electrode is formed on said EBR and surrounded by an isolation region;
said P+ electrode forms a small anode connection to said PGEV, said small anode connection having a surface area less than a surface area of said internal surface;
said N+ electrode is formed on said internal surface, said outer surface, said CER, and said EBR outside of said isolation region;
said VECE encloses said PGEV and conforms to the surface profile of said IWCV; and
said P+ electrode comprises an annular ring centered on said EBR and surrounding an isolated cathode contact in the center of said EBR forming a plurality of anodes with each anode of said plurality electrically coupled to a separate preamplifier;
wherein said method comprises the steps of:
(1) placing a radiation sample in the external VECE sample cavity formed by the surface profile of the IWCV in said SAGe well radiation detector;
(2) collecting electrical charge from the N+ electrode and the P+ electrode attached to the PGEV;
(3) pre-processing the electrical charge with a preamplifier to form a detection voltage pulse (DVP);
(4) post-processing the said DVP by amplifying, shaping, filtering, digitizing, and optimizing said DVP with a signal processing chain to form a detection signal pulse (DSP); and
(5) analyzing, recording, and displaying said DSP.

9. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);
wherein:
said PGEV further comprises an internal surface and an external surface;
said external surface comprises an outer surface, an external base region (EBR), and a cavity entry region (CER);

said PGEV further comprises an internal well cavity void (IWCV), the surface of said IWCV forming said internal surface;

said P+ electrode is formed on said EBR and surrounded by an isolation region;

said P+ electrode forms a small anode connection to said PGEV, said small anode connection having a surface area less than a surface area of said internal surface;

said N+ electrode is formed on said internal surface, said outer surface, said CER, and said EBR outside of said isolation region;

said VECE encloses said PGEV and conforms to the surface profile of said IWCV; and said P+ electrode comprises an annular ring on said EBR, said annular ring surrounding an N+ cathode region in the center of said EBR;

wherein said method comprises the steps of:
(1) placing a radiation sample in the external VECE sample cavity formed by the surface profile of the IWCV in said SAGe well radiation detector;
(2) collecting electrical charge from the N+ electrode and the P+ electrode attached to the PGEV;
(3) pre-processing the electrical charge with a preamplifier to form a detection voltage pulse (DVP);
(4) post-processing the said DVP by amplifying, shaping, filtering, digitizing, and optimizing said DVP with a signal processing chain to form a detection signal pulse (DSP); and
(5) analyzing, recording, and displaying said DSP.

10. A small anode germanium (SAGe well) radiation detector system comprising:
(a) P-type bulk germanium volume (PGEV);
(b) N+ electrode;
(c) P+ electrode; and
(d) vacuum encapsulating chamber enclosure (VECE);

wherein:
said PGEV further comprises an internal surface and an external surface;

said external surface comprises an outer surface, an external base region (EBR), and a cavity entry region (CER);

said PGEV further comprises an internal well cavity void (IWCV), the surface of said IWCV forming said internal surface;

said P+ electrode is formed on said EBR and surrounded by an isolation region;

said P+ electrode forms a small anode connection to said PGEV, said small anode connection having a surface area less than a surface area of said internal surface;

said N+ electrode is formed on said internal surface, said outer surface, said CER, and said EBR outside of said isolation region;

said VECE encloses said PGEV and conforms to the surface profile of said IWCV; and said P+ electrode comprises an annular ring on said EBR, said annular ring surrounding an isolation groove on the surface of said EBR, said isolation groove surrounding an N+ cathode region in the center of said EBR;

wherein said method comprises the steps of:
(1) placing a radiation sample in the external VECE sample cavity formed by the surface profile of the IWCV in said SAGe well radiation detector;
(2) collecting electrical charge from the N+ electrode and the P+ electrode attached to the PGEV;
(3) pre-processing the electrical charge with a preamplifier to form a detection voltage pulse (DVP);
(4) post-processing the said DVP by amplifying, shaping, filtering, digitizing, and optimizing said DVP with a signal processing chain to form a detection signal pulse (DSP); and
(5) analyzing, recording, and displaying said DSP.

* * * * *